United States Patent
Huang et al.

(10) Patent No.: US 11,450,664 B2
(45) Date of Patent: Sep. 20, 2022

(54) SEMICONDUCTOR DEVICE HAVING NANOSHEET TRANSISTOR AND METHODS OF FABRICATION THEREOF

(71) Applicant: TAIWAN SEMICONDUCTOR MANUFACTURING COMPANY, LTD., Hsinchu (TW)

(72) Inventors: Mao-Lin Huang, Hsinchu (TW); Lung-Kun Chu, New Taipei (TW); Chung-Wei Hsu, Hsinchu (TW); Jia-Ni Yu, New Taipei (TW); Kuo-Cheng Chiang, Hsinchu (TW); Kuan-Lun Cheng, Hsinchu (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 72 days.

(21) Appl. No.: 17/105,108

(22) Filed: Nov. 25, 2020

(65) Prior Publication Data

US 2022/0165731 A1    May 26, 2022

(51) Int. Cl.
*H01L 27/092* (2006.01)
*H01L 29/06* (2006.01)
(Continued)

(52) U.S. Cl.
CPC .... *H01L 27/0922* (2013.01); *H01L 21/02603* (2013.01); *H01L 21/823807* (2013.01); *H01L 21/823814* (2013.01); *H01L 21/823857* (2013.01); *H01L 29/0673* (2013.01); *H01L 29/42392* (2013.01); *H01L 29/6684* (2013.01);
(Continued)

(58) Field of Classification Search
CPC ........... H01L 27/0922; H01L 21/02603; H01L 21/823807; H01L 21/823814; H01L 21/823857; H01L 29/0673; H01L 29/42392; H01L 29/66545;
(Continued)

(56) References Cited

U.S. PATENT DOCUMENTS 9,209,247 B2   12/2015   Colinge et al.
9,236,267 B2   1/2016   De et al.
(Continued)

*Primary Examiner* — Tong-Ho Kim
(74) *Attorney, Agent, or Firm* — NZ Carr Law Office PLLC

(57) ABSTRACT

A semiconductor device structure is provided. The device includes first semiconductor layers and second semiconductor layers disposed below and aligned with the first semiconductor layers. Each first semiconductor layer is surrounded by a first and fourth intermixed layers. The first intermixed layer is disposed between the first semiconductor layer and the fourth intermixed layer and includes a first and second materials. The fourth intermixed layer includes a third and fourth materials. Each second semiconductor layer is surrounded by a second and third intermixed layers. The second intermixed layer is disposed between the second semiconductor layer and the third intermixed layer and includes the first and a fifth material. The third intermixed layer includes the third and a sixth material. The second and fourth material are a dipole material having a first polarity, and the fifth and sixth material are a dipole material having a second polarity opposite the first polarity.

20 Claims, 38 Drawing Sheets

(51) Int. Cl.
*H01L 29/423* (2006.01)
*H01L 29/78* (2006.01)
*H01L 29/786* (2006.01)
*H01L 21/02* (2006.01)
*H01L 21/8238* (2006.01)
*H01L 29/66* (2006.01)

(52) U.S. Cl.
CPC .. *H01L 29/66545* (2013.01); *H01L 29/66742* (2013.01); *H01L 29/78391* (2014.09); *H01L 29/78618* (2013.01); *H01L 29/78696* (2013.01)

(58) Field of Classification Search
CPC ........... H01L 29/66742; H01L 29/6684; H01L 29/78391; H01L 29/78618; H01L 29/78696
USPC ........................................................ 257/295
See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2020/0066600 A1* | 2/2020 | Ok .................... H01L 21/76829 |
| 2021/0265345 A1* | 8/2021 | Xie .................... H01L 21/3065 |

* cited by examiner

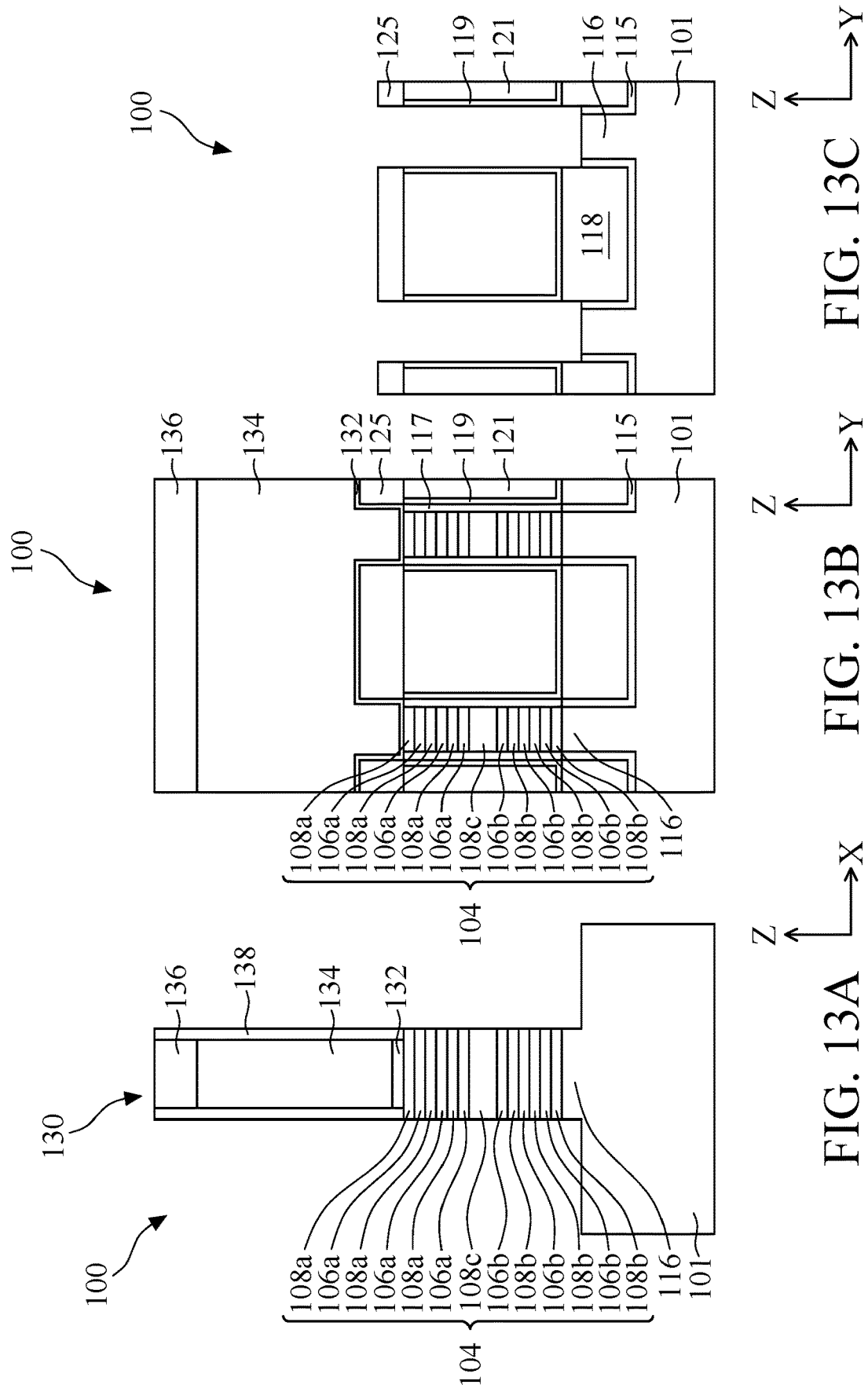

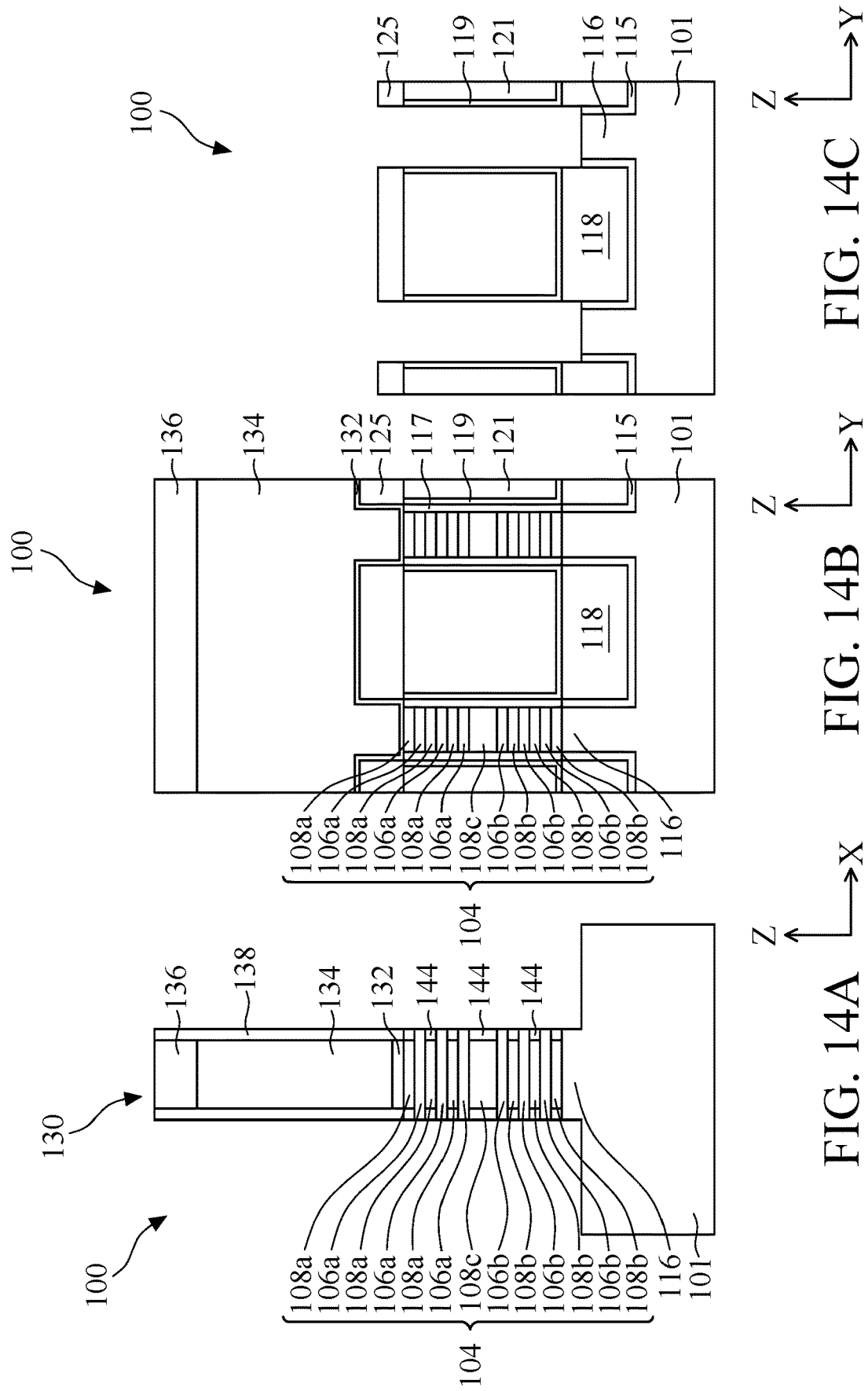

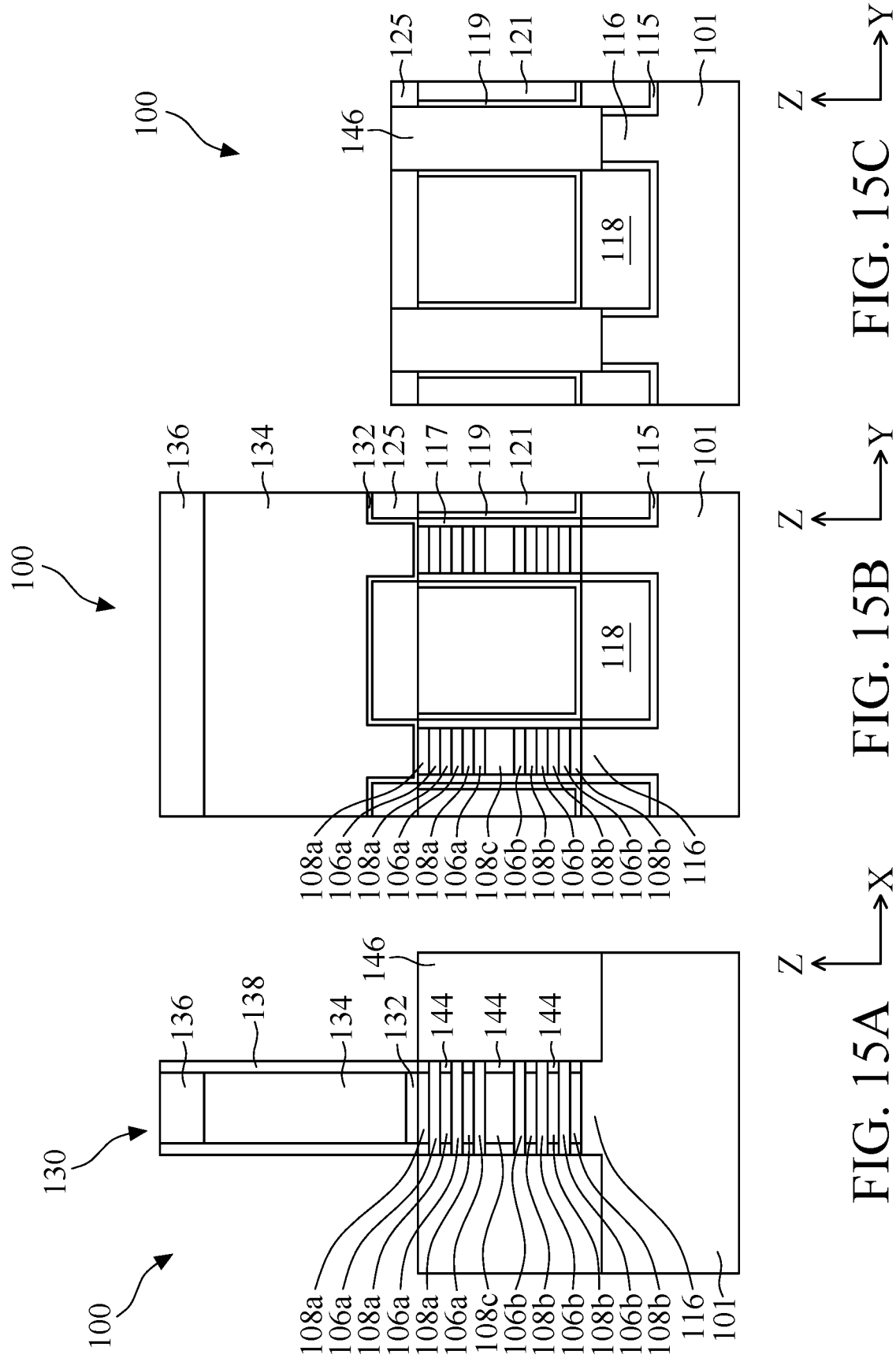

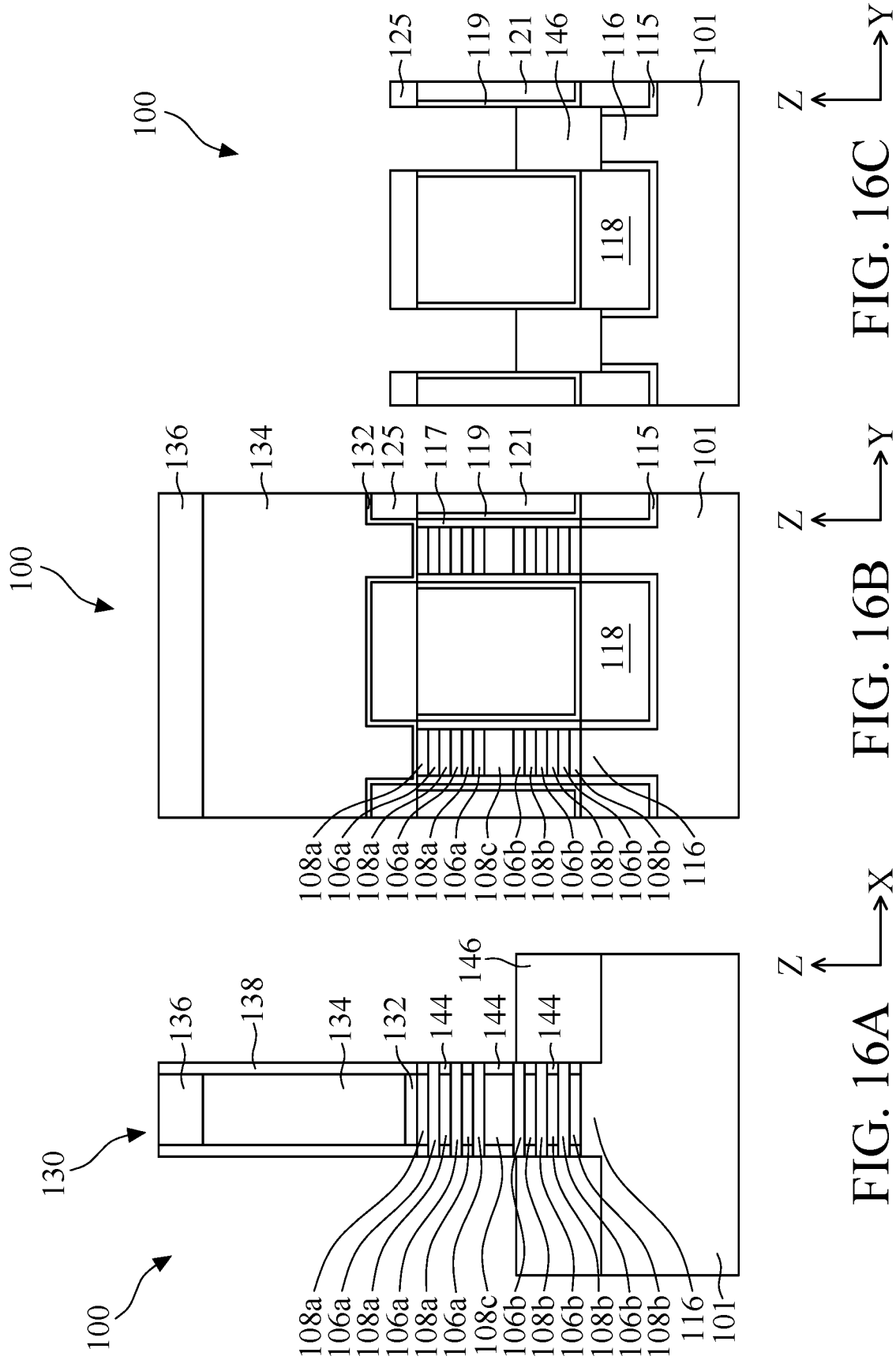

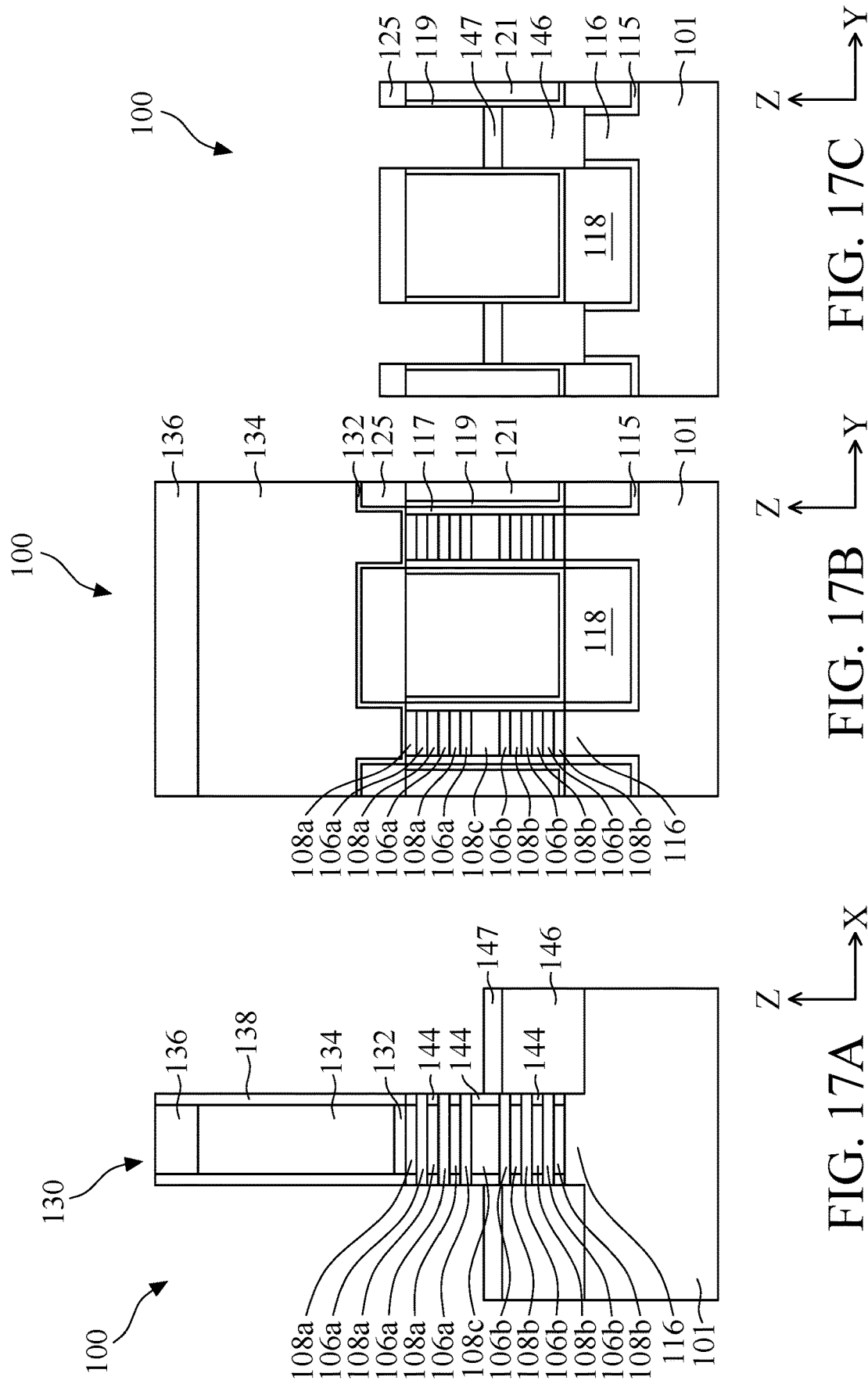

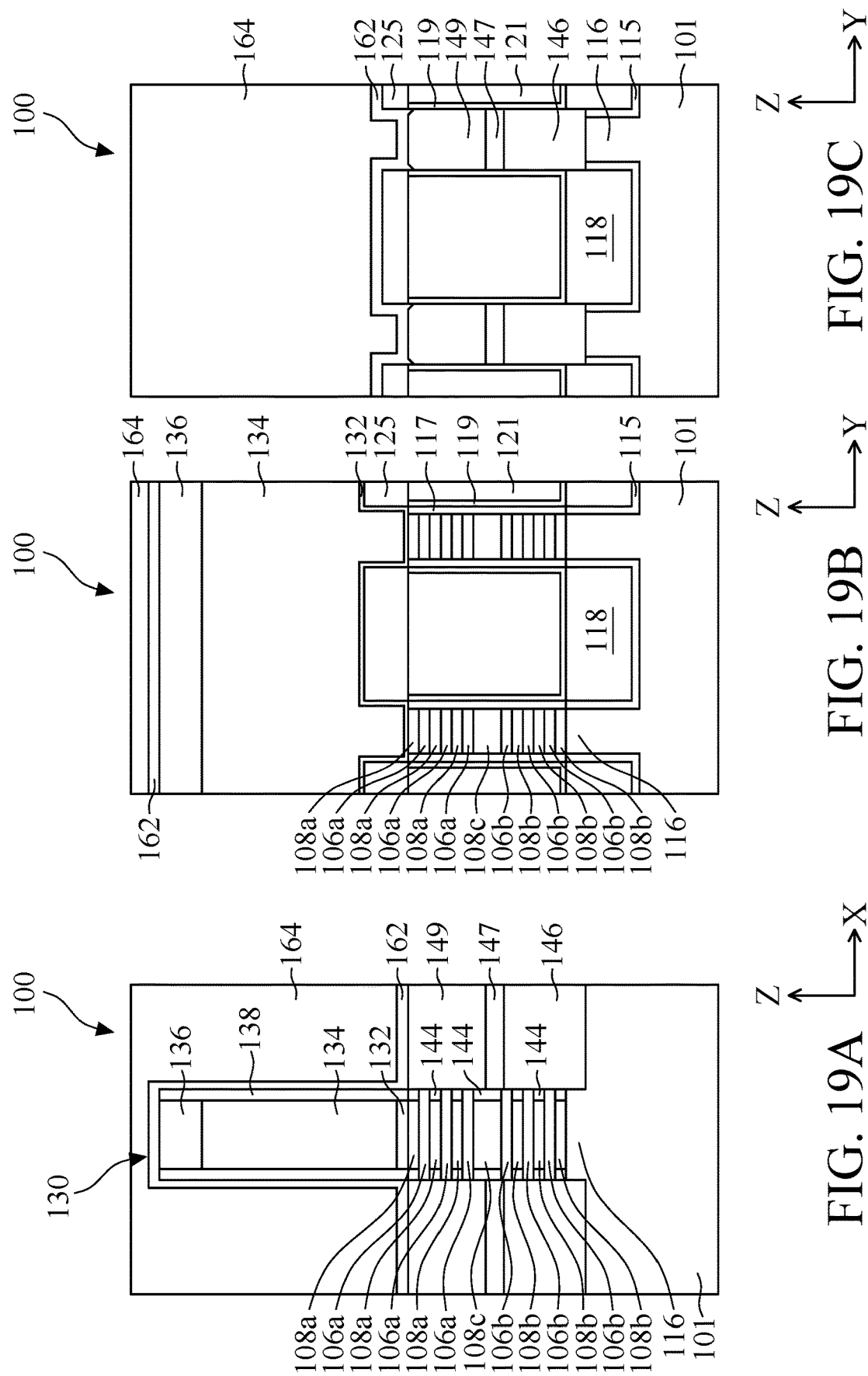

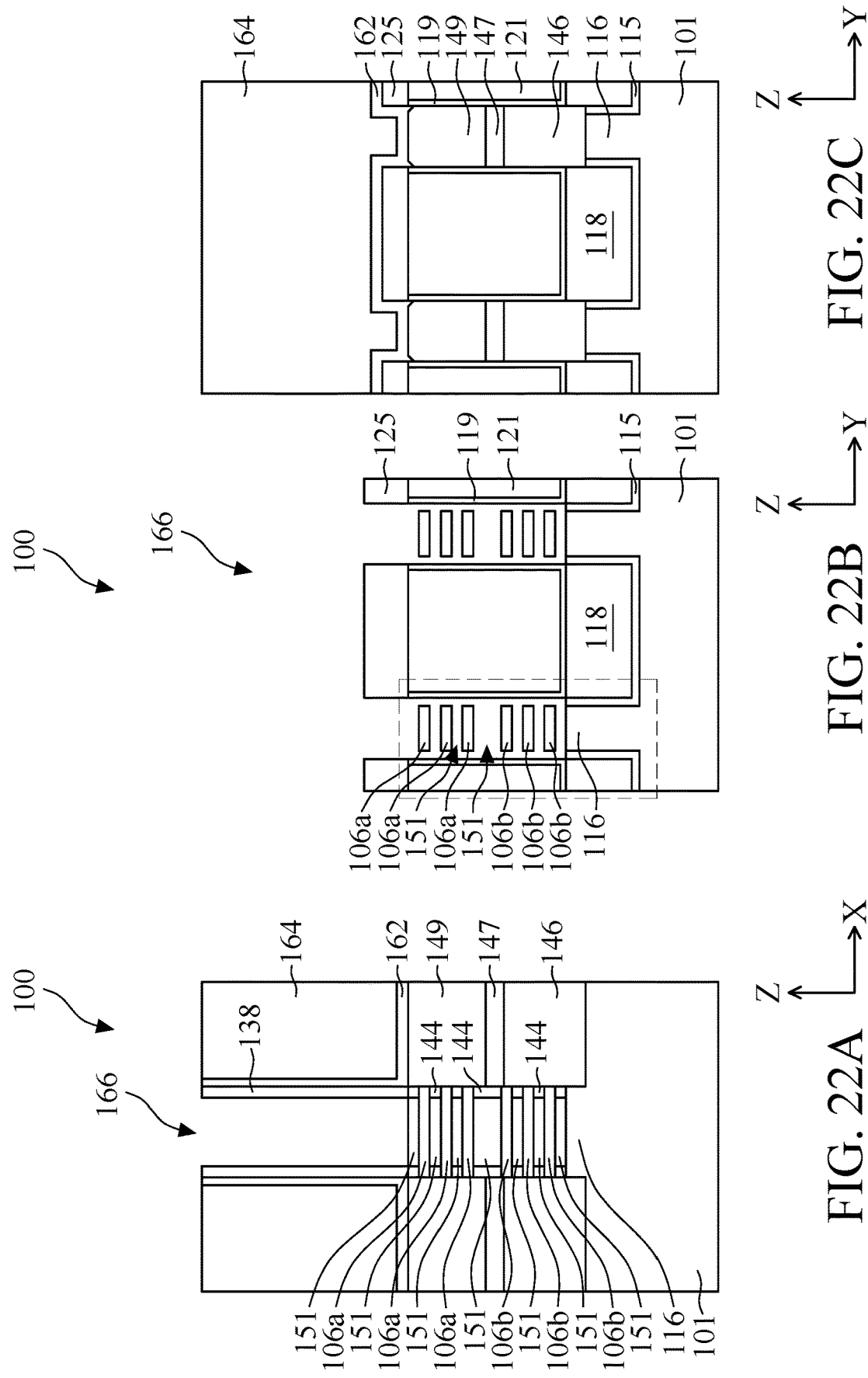

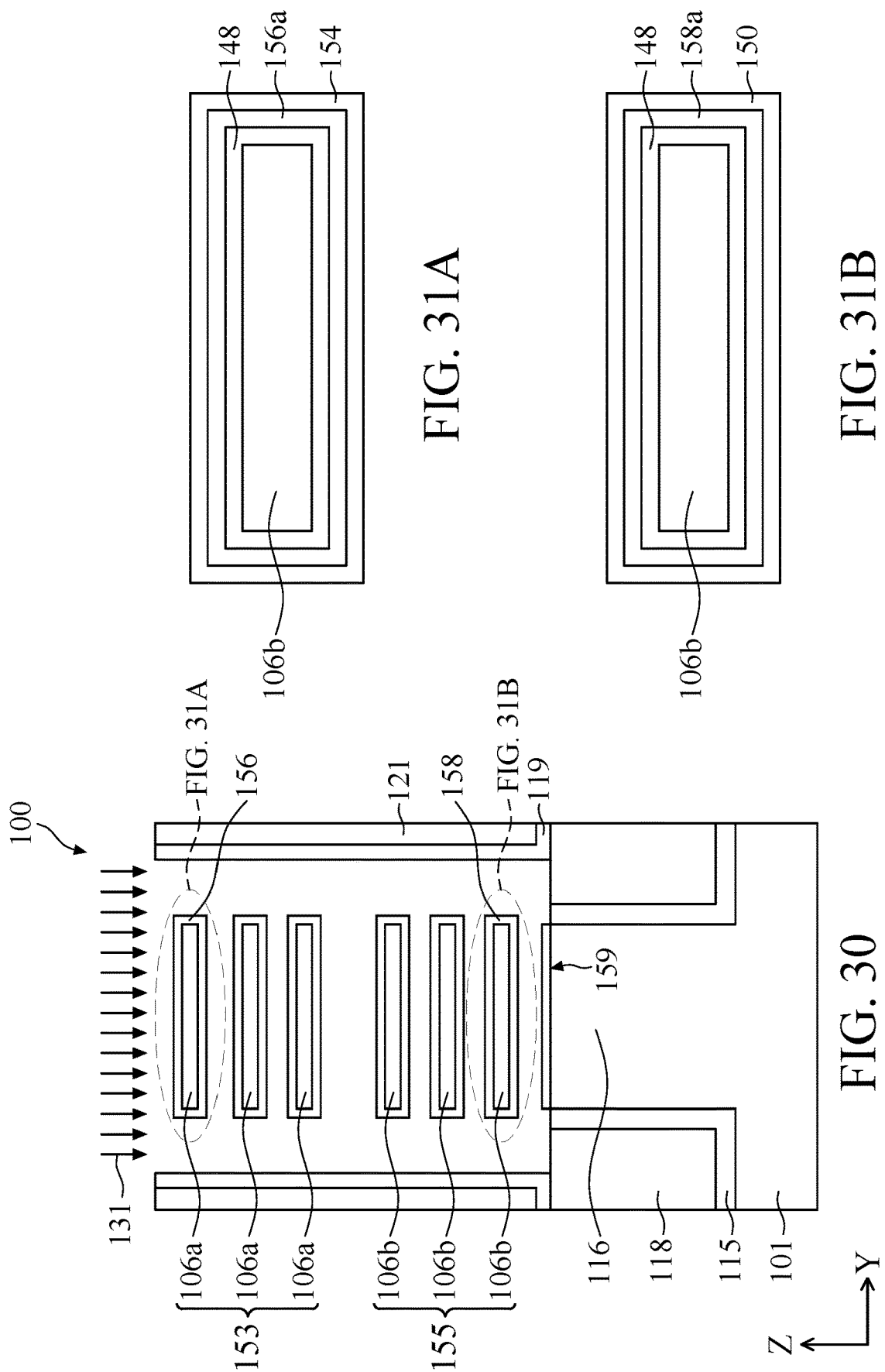

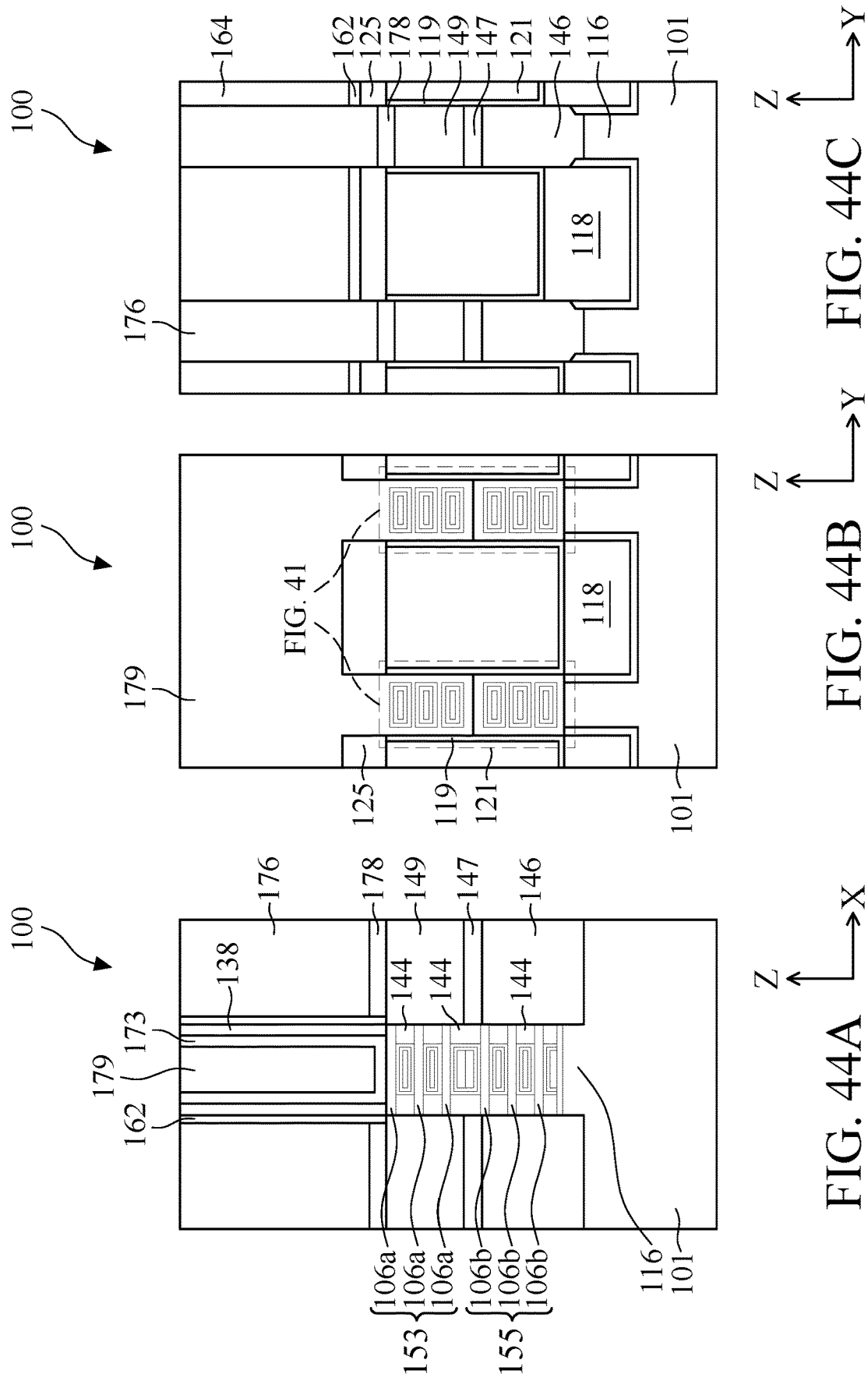

SEMICONDUCTOR DEVICE HAVING NANOSHEET TRANSISTOR AND METHODS OF FABRICATION THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down presents new challenge.

In pursuit of higher device density, higher performance, and lower costs, challenges from both fabrication and design issues have resulted in the development of three-dimensional designs, such as a multi-gate field effect transistor (FET), including a nanosheet FET. In a nanosheet FET, all side surfaces of the channel are surrounded by the gate electrode, which allows for fuller depletion in the channel and results in less short-channel effects and better gate control. As transistor dimensions are continually scaled down, further improvements of the nanosheet FET are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 13A, 13B, 13C to 22A, 22B, 22C are cross-sectional side views of various stages of manufacturing the semiconductor device structure taken along line A-A, line B-B, and line C-C of FIG. 12, respectively, in accordance with some embodiments.

FIGS. 23-30 are enlarged views of a region of FIG. 22B showing various stages of manufacturing the semiconductor device structure in accordance with some embodiments.

FIGS. 31A-31B illustrate a portion of the first semiconductor layers of FIG. 30 in accordance with alternative embodiments.

FIGS. 44A, 44B, 44C are cross-sectional side views of one of various stages of manufacturing the semiconductor device structure taken along line A-A, line B-B, and line C-C of FIG. 12, respectively, in accordance with some embodiments.

DETAILED DESCRIPTION

Figure 1:
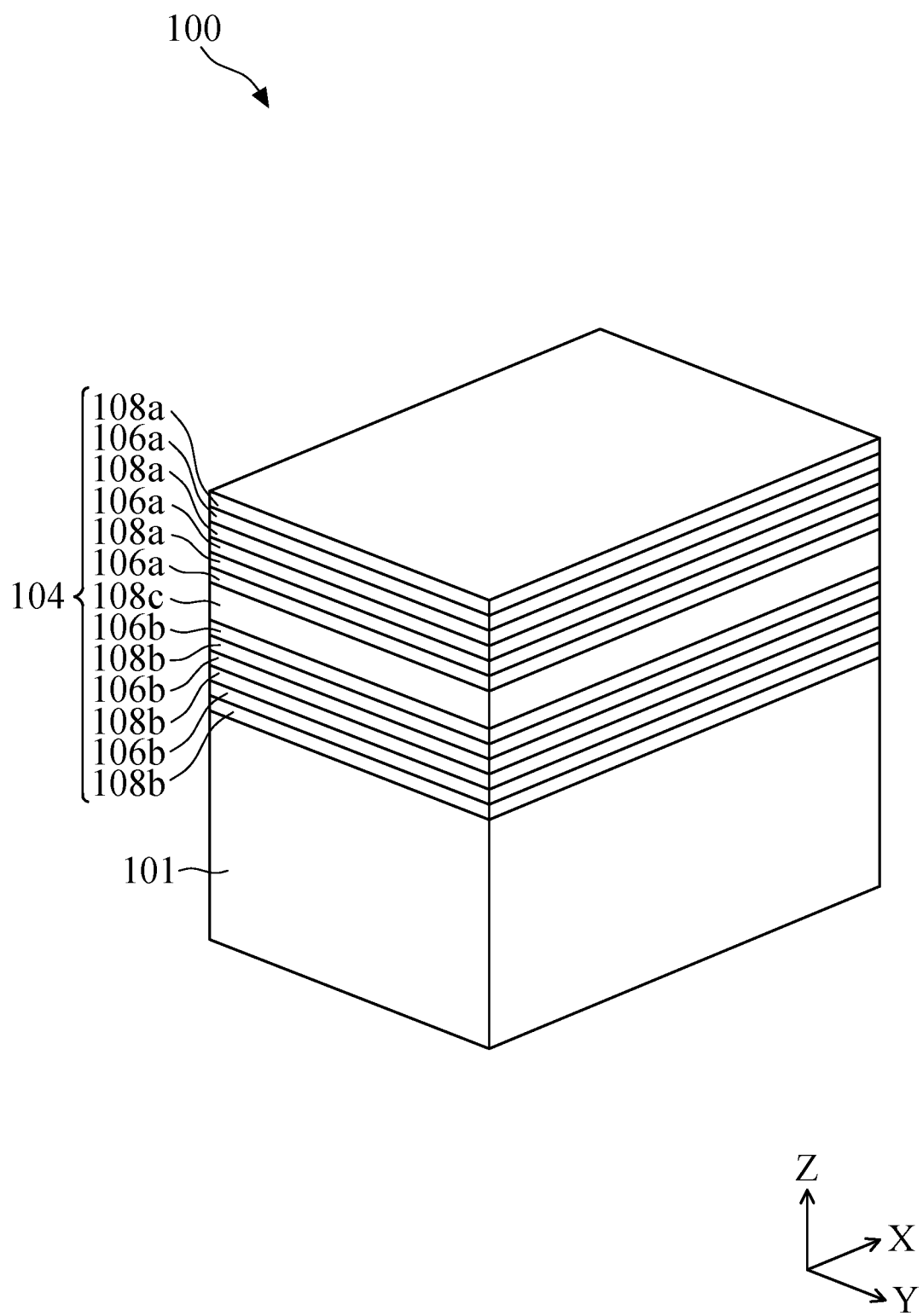
FIGS. 1-12 are perspective views of various stages of manufacturing a semiconductor device structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide a semiconductor device structure having complementary field effect transistors (CFETs) with multi-threshold voltage schemes. Each CFET is formed by vertically stacking a first nanosheet FET (e.g., an n-channel FET) on a second nanosheet FET (e.g., a p-channel FET), and each nanosheet FET includes one or more semiconductor layers from a stack of semiconductor layers. The one or more semiconductor layers form nanosheet channels of the p-channel and n-channel nanosheet FET. Each of the one or more semiconductor layers is surrounded by a gate electrode layer. According to embodiments of the present disclosure, an interfacial layer and/or a high-K dielectric layer between the nanosheet channels and the gate electrode layer are selectively doped or intermixed with one or more p-dipole and n-dipole metals to provide different threshold voltage schemes for the p-channel and the n-channel nanosheet FETs, respectively. As a result, the CFETs in different regions of the semiconductor device structure can be operated at different threshold voltages, resulting in improved device reliability and performance. Various embodiments are discussed in more detail below.

While the embodiments of this disclosure are discussed with respect to nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-44C show exemplary processes for manufacturing a semiconductor device structure 100 according to embodiments of the present disclosure. It is understood that additional operations can be provided before, during, and after processes shown by FIGS. 1-44C, and some of the operations described below can be replaced or eliminated, for additional embodiments of the method. The order of the operations/processes is not limiting and may be interchangeable.

FIGS. 1-12 are perspective views of various stages of manufacturing a semiconductor device structure 100 in accordance with some embodiments. As shown in FIG. 1, a semiconductor device structure 100 includes a stack of semiconductor layers 104 formed over a substrate 101. The substrate 101 may be a semiconductor substrate. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In one embodiment, the substrate 101 is made of silicon. In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include one or more buffer layers (not shown) on the surface of the substrate 101. The buffer layers can serve to gradually change the lattice constant from that of the substrate to that of the source/drain (S/D) regions to be grown on the substrate 101. The buffer layers may be formed from epitaxially grown single crystalline semiconductor materials such as, but not limited to Si, Ge, germanium tin (GeSn), SiGe, GaAs, InSb, GaP, GaSb, InAlAs, InGaAs, GaSbP, GaAsSb, GaN, GaP, and InP. In one embodiment, the substrate 101 includes SiGe buffer layers epitaxially grown on the silicon substrate 101. The germanium concentration of the SiGe buffer layers may increase from 30 atomic percent germanium for the bottom-most buffer layer to 70 atomic percent germanium for the top-most buffer layer.

The substrate 101 may include various regions that have been doped with impurities (e.g., dopants having p-type or n-type conductivity). Depending on circuit design, the dopants may be, for example boron for an n-type field effect transistors (NFET) and phosphorus for a p-type field effect transistors (PFET).

The stack of semiconductor layers 104 includes semiconductor layers made of different materials to facilitate formation of nanosheet channels in a multi-gate device, such as nanosheet channel FETs. In some embodiments, the stack of semiconductor layers 104 includes first semiconductor layers 106 (e.g., 106a and 106b) and second semiconductor layers 108 (e.g., 108a and 108b). In some embodiments, the stack of semiconductor layers 104 includes alternating first and second semiconductor layers 106, 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The first semiconductor layers 106 or portions thereof may form nanosheet channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by a gate electrode. The semiconductor device structure 100 may include a nanosheet transistor. The nanosheet transistors may be referred to as nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

In some embodiments, the semiconductor device structure 100 includes a complementary FET (CFET) in which two or more nanosheet FETs are vertically stacked on top of one another. In such a case, the first semiconductor layers 106 can include channels for the two or more nanosheet FETs. In the embodiment shown in FIG. 1, for example, the first semiconductor layers 106a may define the channels of a first FET, such as a n-type FET (N-FET), and the first semiconductor layers 106b may define the channels of a second FET, such as a p-type FET (P-FET). The thickness of the first semiconductor layers 106 is chosen based on device performance considerations. In some embodiments, each first semiconductor layer 106 has a thickness ranging from about 3 nanometers (nm) to about 10 nm. The second semiconductor layers 108 (e.g., 108a-108c) may eventually be removed and serve to define spaces for a gate stack to be formed therein. Likewise, each second semiconductor layer 108 (e.g., 108a and 108b) may have a thickness that is equal, less, or greater than the thickness of the first semiconductor layer 106, depending on device performance considerations. In one aspect, each second semiconductor layer 108 (e.g., 108a and 108b) has a thickness that is equal to the thickness of the first semiconductor layer 106 (e.g., 106a and 106b).

In some embodiments, the second semiconductor layer 108c disposed between the first semiconductor layer 106a in the first FET (e.g., n-channel FET) and the first semiconductor layer 106b in the second FET (e.g., p-channel FET) has a greater thickness than the thickness of the rest second semiconductor layers 108a and 108b to help define boundary of the first FET and the second FET at a later stage. In such cases, the thickness of the second semiconductor layer 108c may be about 1.5 to about 3 times thicker than the first semiconductor layer 106 (e.g., 106a and 106b) or the second semiconductor layer 108 (e.g., 108a and 108b).

While six first semiconductor layers 106 and seven second semiconductor layers 108 are alternately arranged as illustrated in FIG. 1, it can be appreciated that any number of first and second semiconductor layers 106, 108 can be formed in the stack of semiconductor layers 104, depending on the predetermined number of nanosheet channels needed for each FET of the semiconductor device structure 100.

Figure 2:
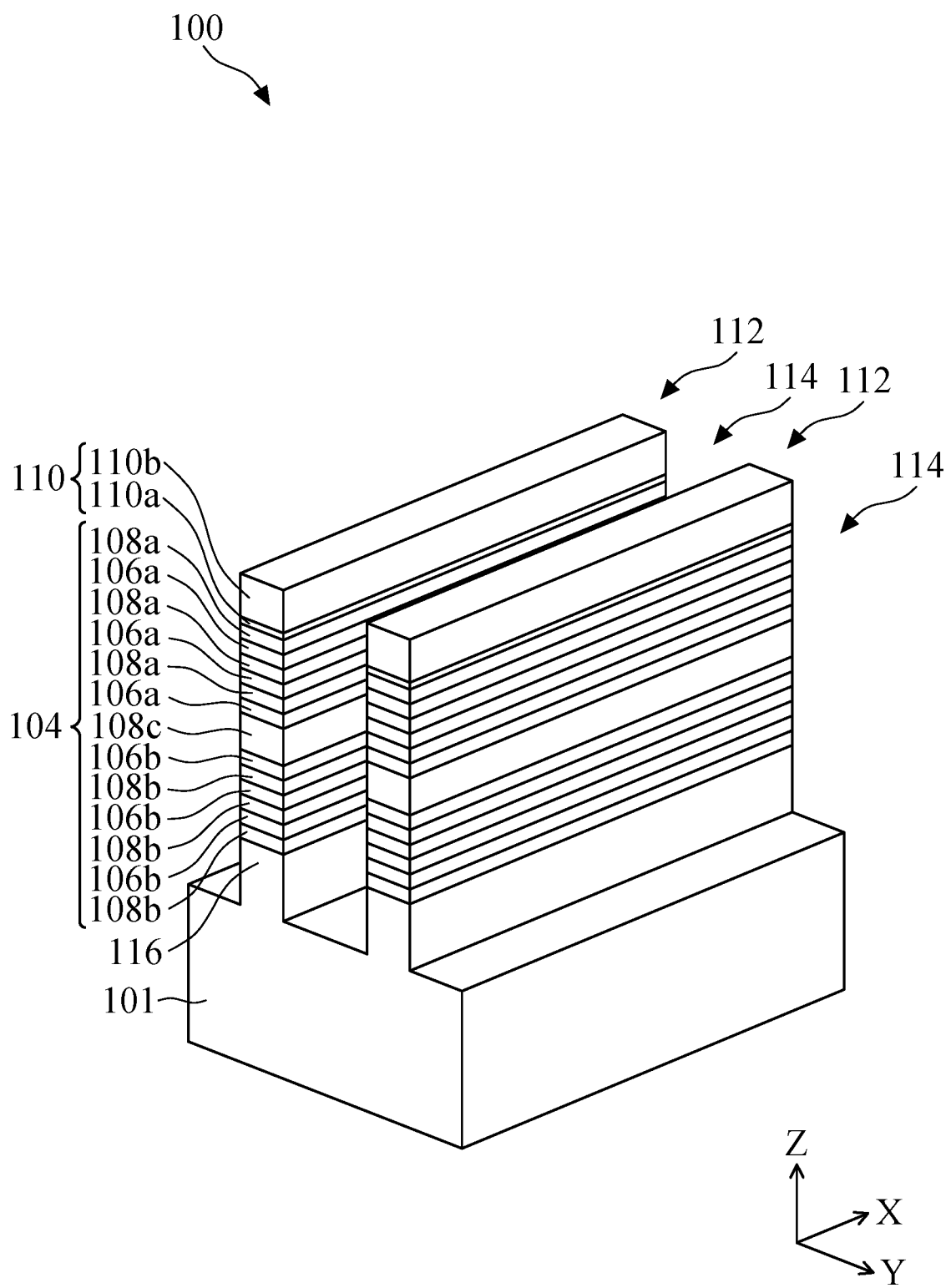

FIG. 2 is a perspective view of one of the various stages of manufacturing the semiconductor device structure 100, in accordance with some embodiments. As shown in FIG. 2, fin structures 112 are formed from the stack of semiconductor layers 104. Each fin structure 112 has an upper portion including the semiconductor layers 106, 108, a well portion 116 formed from the substrate 101, and a portion of a mask structure 110. The mask structure 110 is formed over the stack of semiconductor layers 104 prior to forming the fin structures 112. The mask structure 110 may include an oxygen-containing layer 110a and a nitrogen-containing layer 110b. The oxygen-containing layer 110a may be a pad oxide layer, such as a $SiO_2$ layer. The nitrogen-containing layer 110b may be a pad nitride layer, such as $Si_3N_4$. The mask structure 110 may be formed by any suitable deposition process, such as chemical vapor deposition (CVD) process.

The fin structures 112 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures 112 by etching the stack of semiconductor layers 104 and the substrate 101. The etch process can include dry etch, wet etch, reactive ion etch (RIE), and/or other suitable processes. While two fin structures 112 are shown, the number of the fin structures is not limited to two.

In some embodiments, the fin structures 112 may be fabricated using suitable processes including photolithography and etch processes. The photolithography process may include forming a photoresist layer (not shown) over the mask structure 110, exposing the resist to a pattern, performing post-exposure bake processes, and developing the resist to form a patterned resist. In some embodiments, patterning the resist to form the patterned resist may be performed using an electron beam (e-beam) lithography process. The patterned resist may then be used to protect regions of the substrate 101, and layers formed thereupon, while an etch process forms trenches 114 in unprotected regions through the mask structure 110, the stack of semiconductor layers 104, and into the substrate 101, thereby leaving the extending fin structures 112. The trenches 114 may be etched using a dry etch (e.g., RIE), a wet etch, and/or combination thereof.

Figure 3:
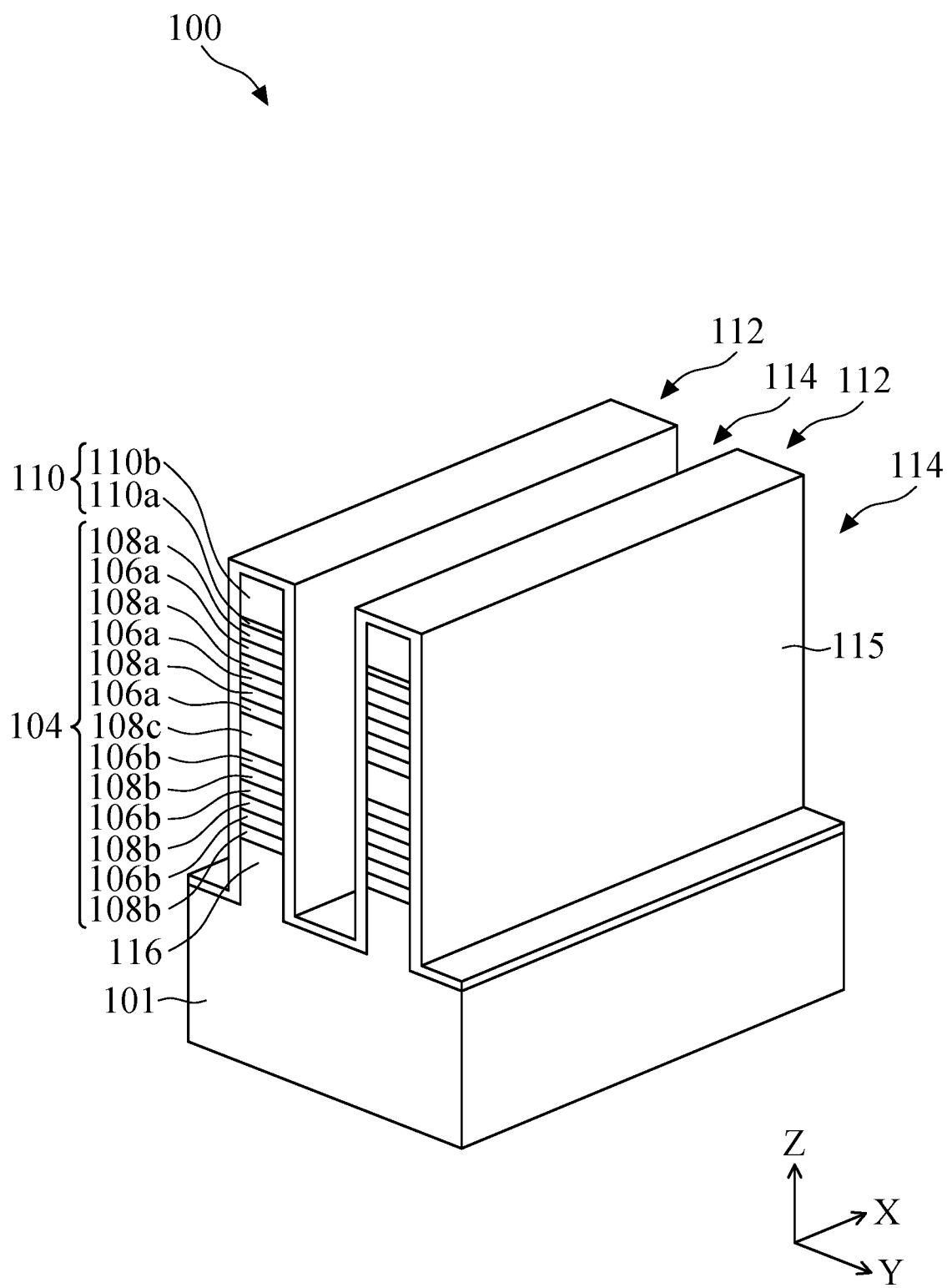

In FIG. 3, a liner 115 is formed over the substrate 101 and the fin structures 112. The liner 115 may be formed of a semiconductor material, such as Si. In some embodiments, the liner 115 is made of the same material as the substrate 101. The liner 115 may be a conformal layer formed by any suitable process, such as an atomic layer deposition (ALD) process. The term "conformal" may be used herein for ease of description upon a layer having substantial same thickness over various regions.

Figure 4:
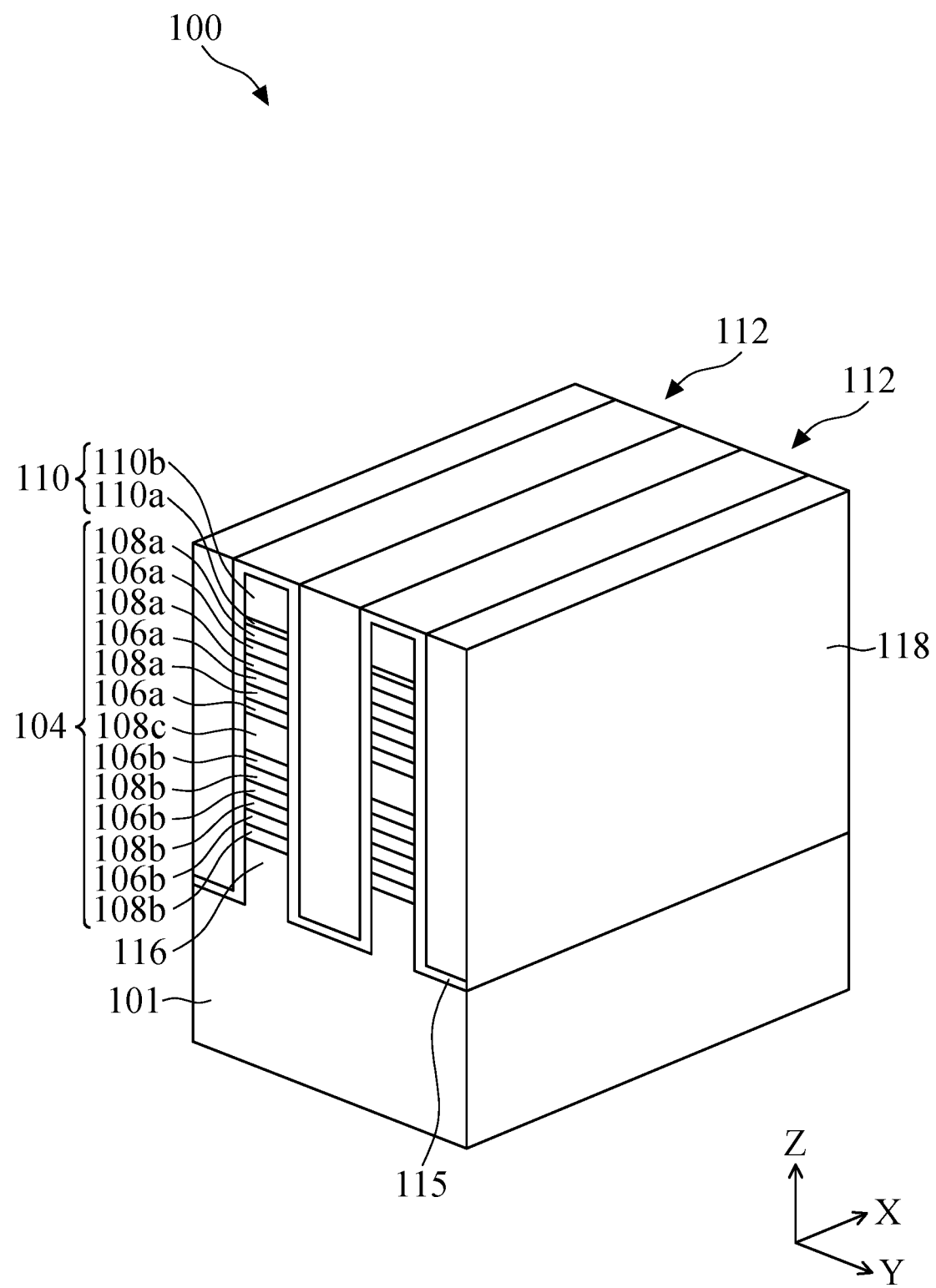

In FIG. 4, after the fin structures 112 are formed, an insulating material 118 is formed on the substrate 101. The insulating material 118 fills the trenches 114 between neighboring fin structures 112 until the fin structures 112 are embedded in the insulating material 118. Then, a planarization operation, such as a chemical mechanical polishing (CMP) method and/or an etch-back method, is performed to expose the top of the fin structures 112. The insulating material 118 may be made of silicon oxide, silicon nitride, silicon oxynitride (SiON), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Figure 5:
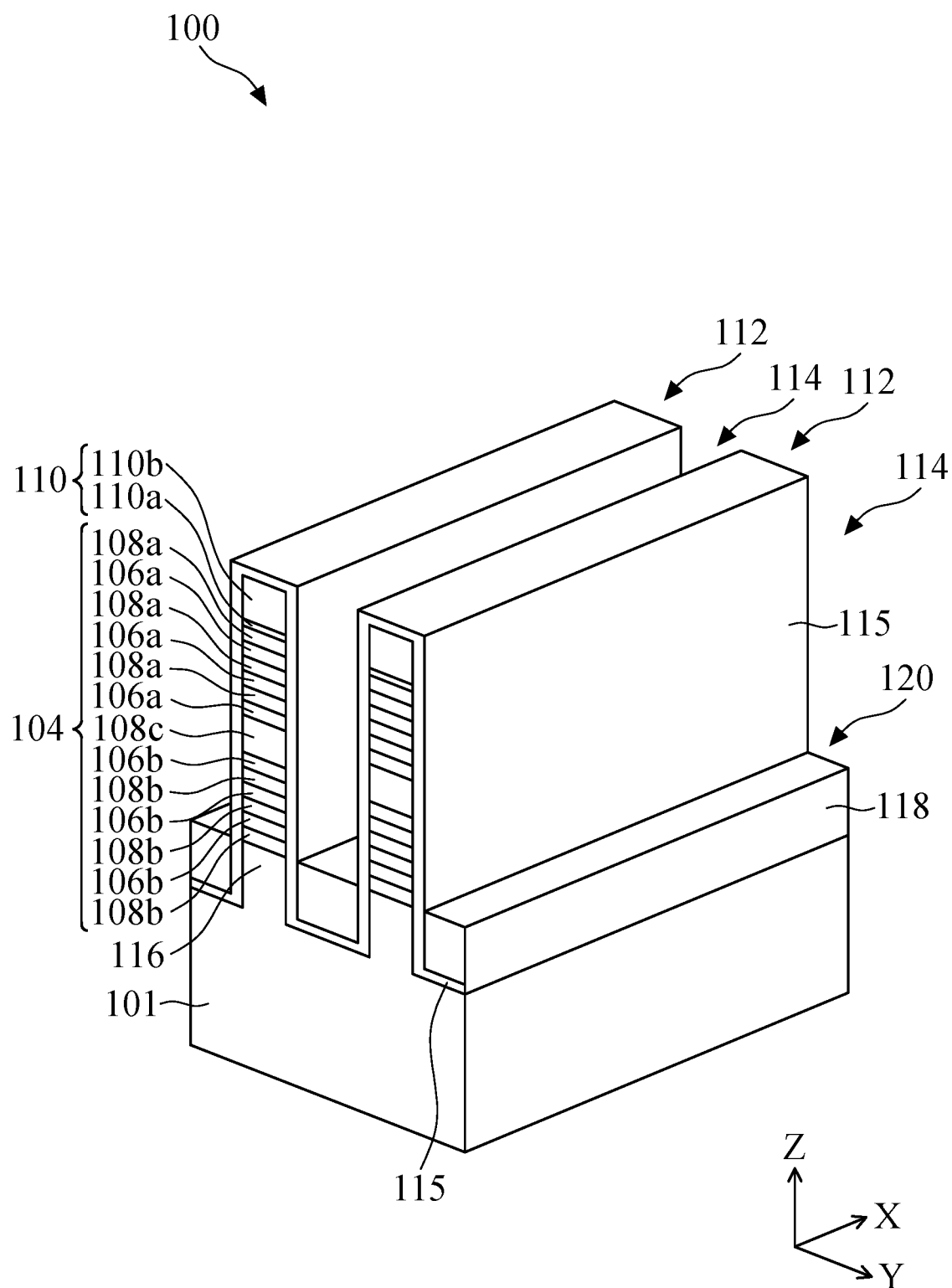

In FIG. 5, the insulating material 118 is recessed to form an isolation region 120. The recess of the insulating material 118 exposes portions of the fin structures 112. The recess of the insulating material 118 reveals the trenches 114 between the neighboring fin structures 112. The isolation region 120 may be formed using a suitable process, such as a dry etching process, a wet etching process, or a combination thereof. A top surface of the insulating material 118 may be level with or below a surface of the second semiconductor layers 108 (e.g., 108b) in contact with the well portion 116.

Figure 6:
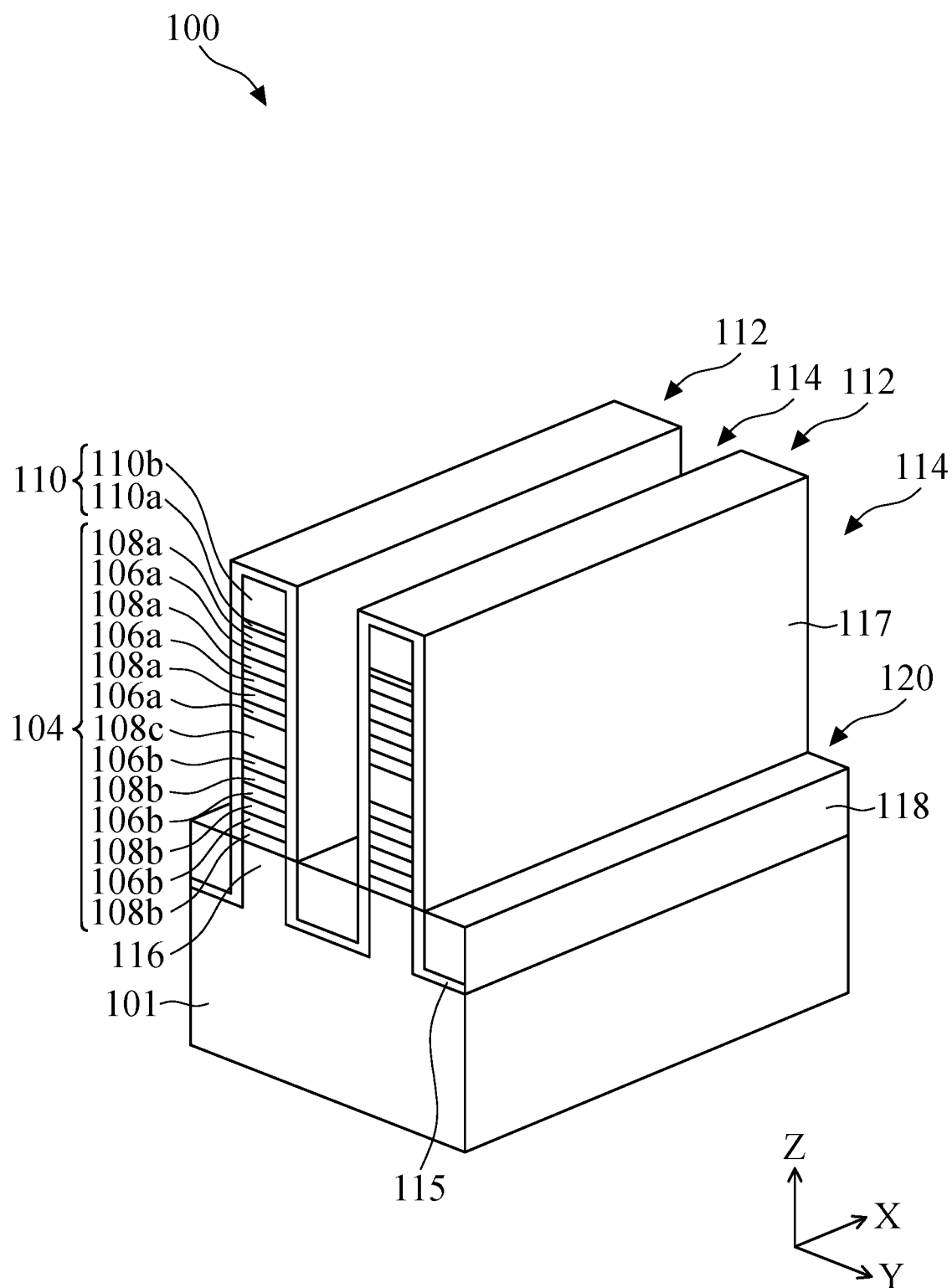

In FIG. 6, a cladding layer 117 is formed on the exposed surface of the liner 115 (FIG. 5). In some embodiments, the liner 115 may be diffused into the cladding layer 117 during the formation of the cladding layer 117, resulting in the cladding layer 117 in contact with the stack of semiconductor layers 104. The cladding layer 117 may be or include a semiconductor material, which allows the cladding layer 117 to grow on semiconductor materials but not on dielectric materials. For example, the cladding layer 117 may be SiGe and is grown on the Si of the liner 115 but not on the dielectric material of the insulating material 118. In some embodiments, the cladding layer 117 may be formed by first forming a semiconductor layer on the liner 115 and the insulating material 118. An etch process is then performed to remove portions of the semiconductor layer formed on the insulating material 118. In some embodiments, the cladding layer 117 and the second semiconductor layers 108 include the same material having the same etch selectivity. For example, the cladding layer 117 and the second semiconductor layers 108a, 108b, 108c may be or include SiGe. The cladding layer 117 and the second semiconductor layers 108a, 108b, 108c may be removed subsequently to create space for the gate electrode layer.

Figure 7:
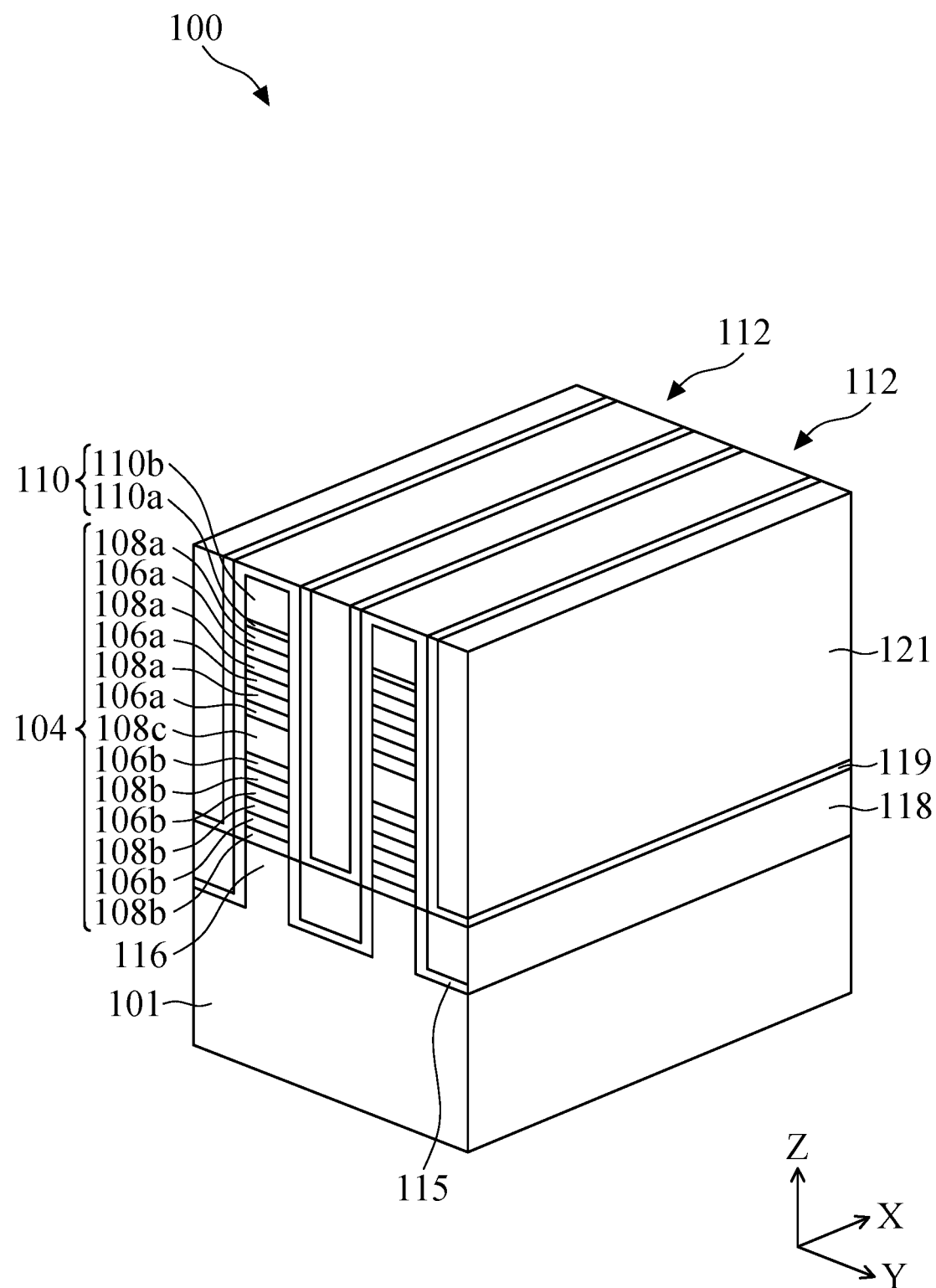

In FIG. 7, a liner 119 is formed on the cladding layer 117 and the top surface of the insulating material 118. The liner 119 may include a low-k dielectric material (e.g., a material having a k value lower than 7), such as $SiO_2$, SiN, SiCN, SiOC, or SiOCN. The liner 119 may be formed by a conformal process, such as an ALD process. The liner 119 may have a thickness ranging from about 1 nm to about 6 nm. The liner 119 may function as a shell to protect a flowable oxide material to be formed in the trenches 114 (FIG. 6) during subsequent removal of the cladding layer 117. Thus, if the thickness of the liner 119 is less than about 1 nm, the flowable oxide material may not be sufficiently protected. On the other hand, if the thickness of the liner 119 is greater than about 6 nm, the trenches 114 (FIG. 6) may be filled.

A dielectric material 121 is formed in the trenches 114 (FIG. 6) and on the liner 119, as shown in FIG. 7. The dielectric material 121 may be an oxygen-containing material, such as an oxide, formed by FCVD. The oxygen-containing material may have a K value less than about 7, for example less than about 3. A planarization process, such as a CMP process, may be performed to remove portions of the liner 119 and the dielectric material 121 formed over the fin structures 112. The portion of the cladding layer 117 disposed on the nitrogen-containing layer is exposed after the planarization process.

Figure 8:
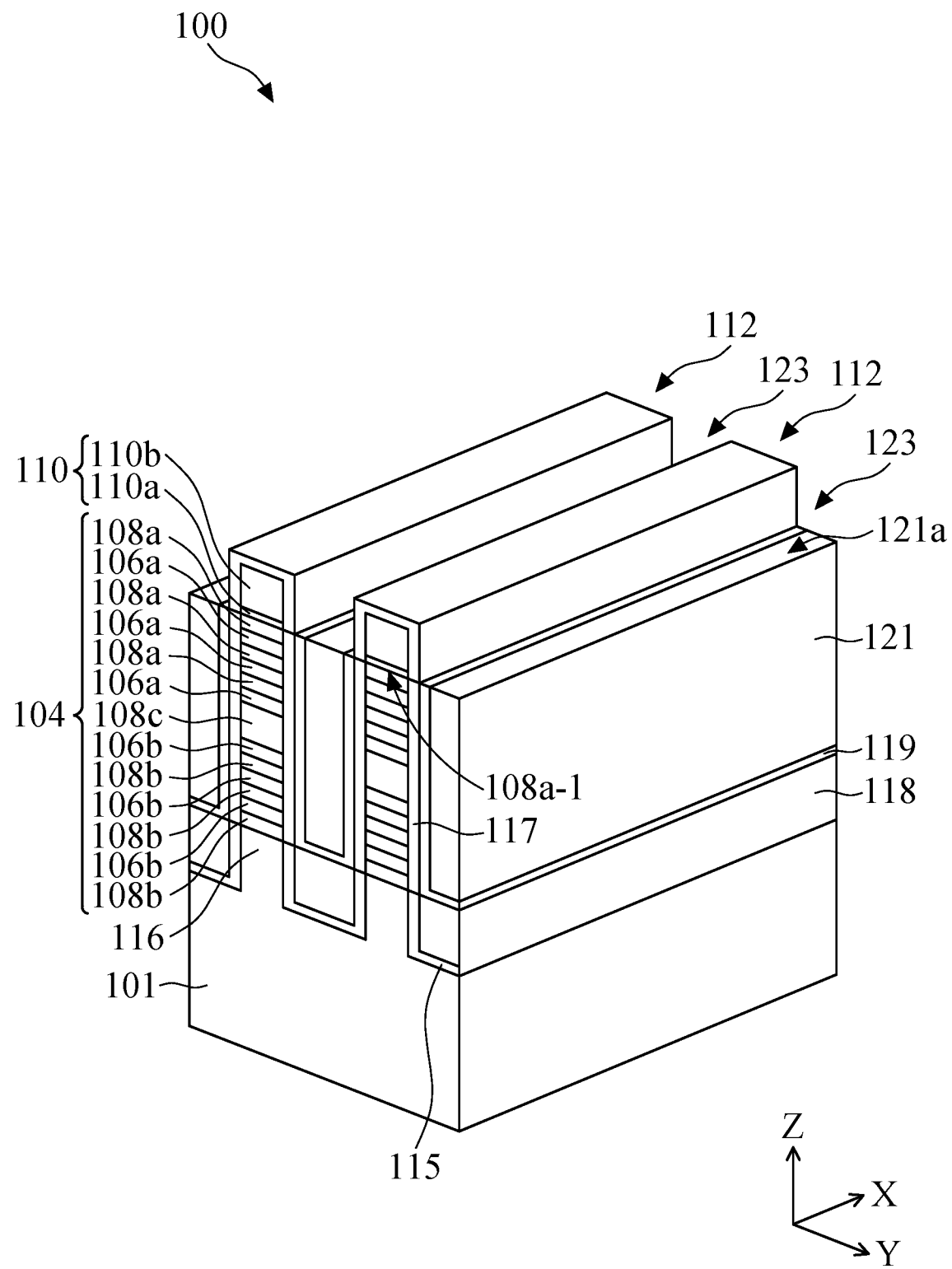

In FIG. 8, the liner 119 and the dielectric material 121 are recessed to the level of the topmost second semiconductor layer 108a. For example, in some embodiments, after the recess process, the dielectric material 121 may include a top surface 121a that is substantially level with a top surface 108a-1 of the topmost second semiconductor layer 108a. The top surface 108a-1 of the topmost second semiconductor layer 108a may be in contact with the mask structure 110, such as in contact with the oxygen-containing layer 110a. Likewise, the liner 119 may be recessed to the same level as the dielectric material 121. The recess of the liner 119 and the dielectric material 121 may be performed by any suitable process, such as dry etch, wet etch, or a combination thereof. In some embodiments, a first etch process may be performed to recess the dielectric material 121, followed by a second etch process to recess the liner 119. The etch processes may be selective etch processes that do not remove the semiconductor material of the cladding layer 117. As a result of the recess process, trenches 123 are formed between the fin structures 112.

Figure 9:
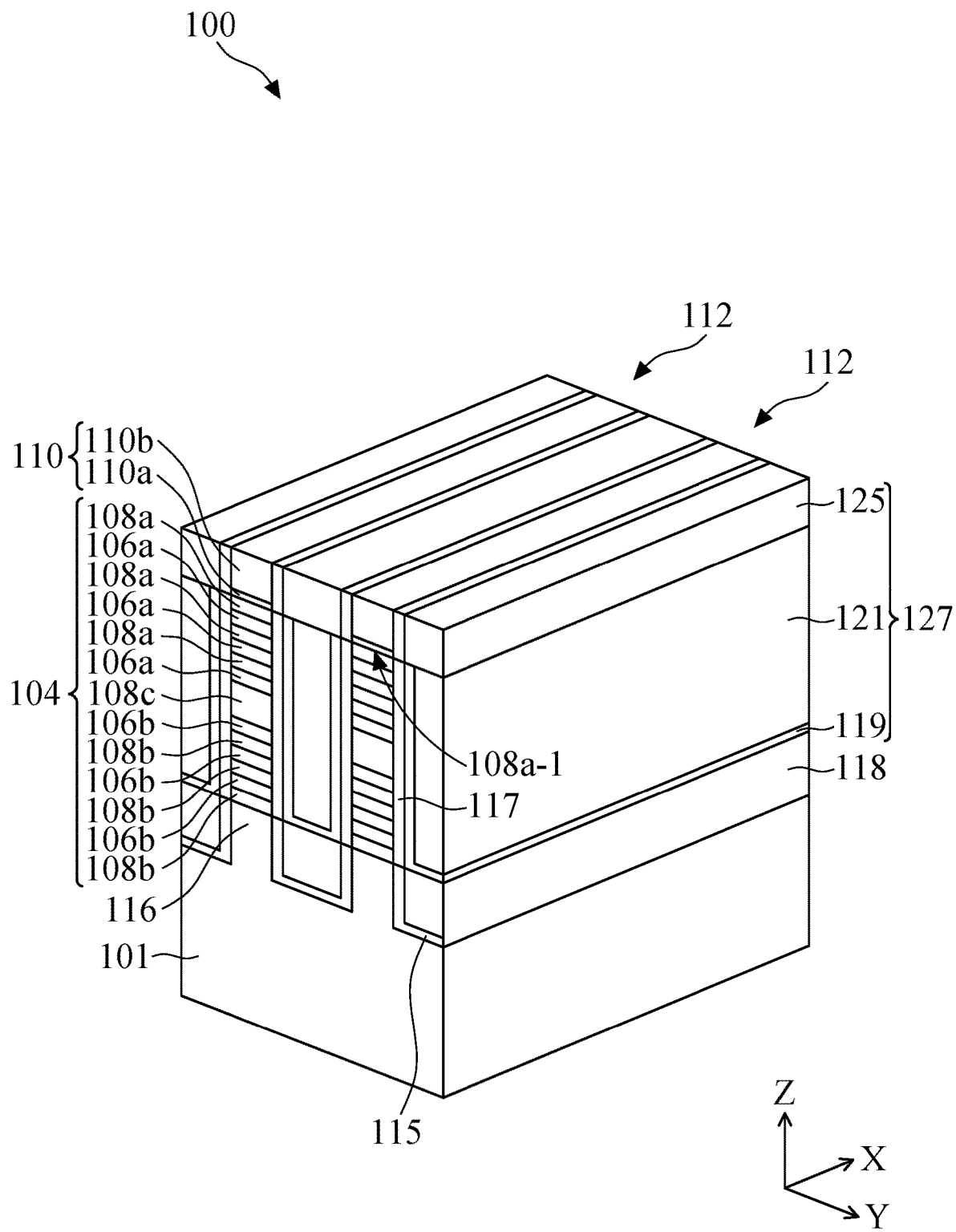

In FIG. 9, a dielectric material 125 is formed in the trenches 123 (FIG. 8) and on the dielectric material 121 and the liner 119. The dielectric material 125 may include SiO, SiN, SiC, SiCN, SiON, SiOCN, AlO, AlN, AlON, ZrO, ZrN, ZrAlO, HfO, or other suitable dielectric material. In some embodiments, the dielectric material 125 includes a high-k dielectric material (e.g., a material having a k value greater than 7). The dielectric material 125 may be formed by any suitable process, such as a CVD, PECVD, FCVD, or ALD process. A planarization process, such as a CMP process, is performed until the nitrogen-containing layer 110b of the mask structure 110 is exposed. The planarization process removes portions of the dielectric material 125 and the cladding layer 117 disposed over the mask structure 110. The liner 119, the dielectric material 121, and the dielectric material 125 together may be referred to as a dielectric feature 127. The dielectric feature 127 serves as a dielectric fin that separates adjacent source/drain (S/D) epitaxial features and adjacent gate electrode layers.

Figure 10:
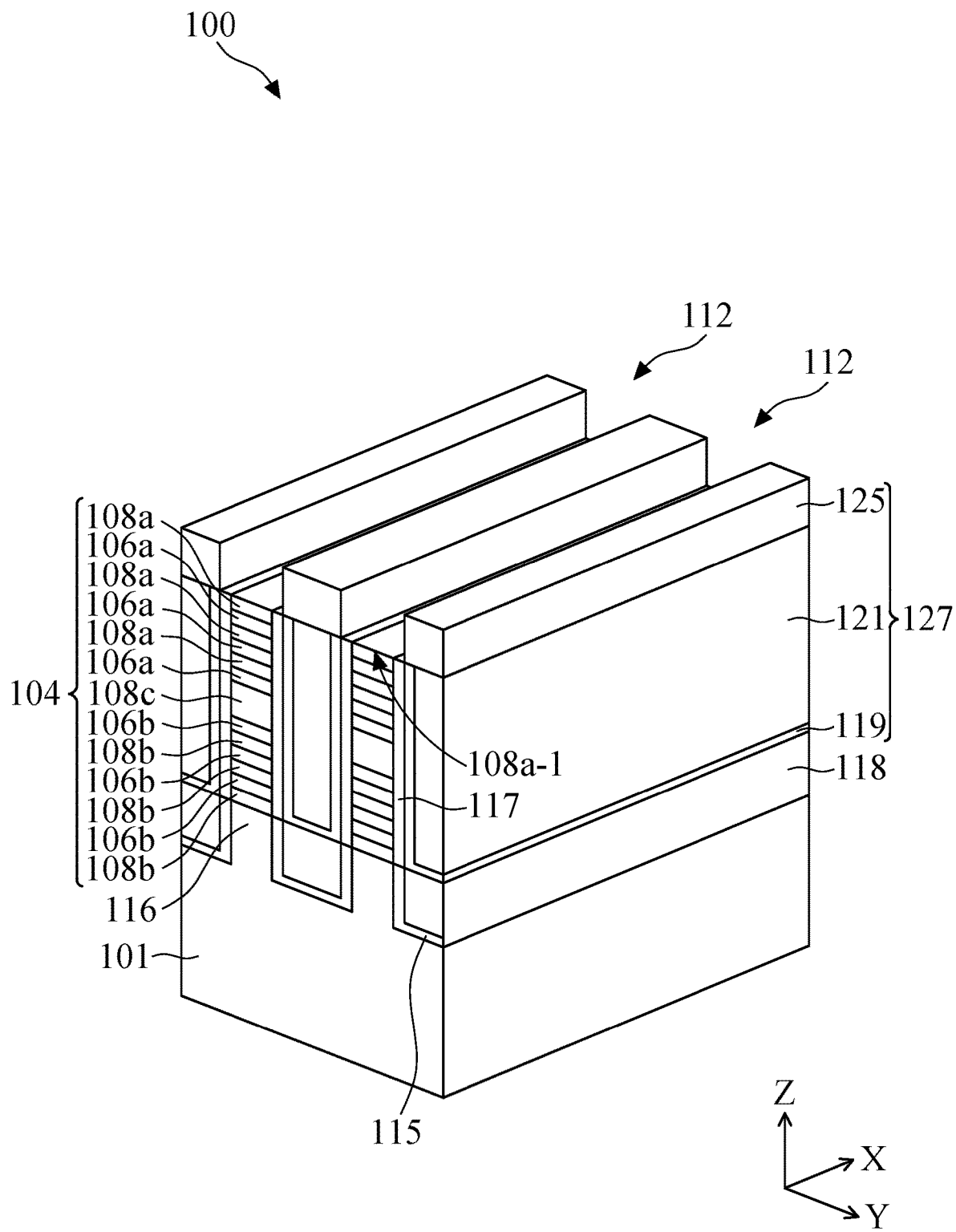

In FIG. 10, the cladding layers 117 are recessed, and the mask structures 110 are removed. The recess of the cladding layers 117 may be performed by any suitable process, such as dry etch, wet etch, or a combination thereof. The recess process may be controlled so that the remaining cladding layers 117 are substantially at the same level as the top surface 108a-1 of the topmost second semiconductor layer 108a in the stack of semiconductor layers 102. The etch process may be a selective etch process that does not remove the dielectric material 125. The removal of the mask structures 110 may be performed by any suitable process, such as dry etch, wet etch, or a combination thereof. The removal of the mask structure 110 exposes the top surfaces 180a-1 of the topmost second semiconductor layers 108a in the stacks of semiconductor layers 104.

Figure 11:
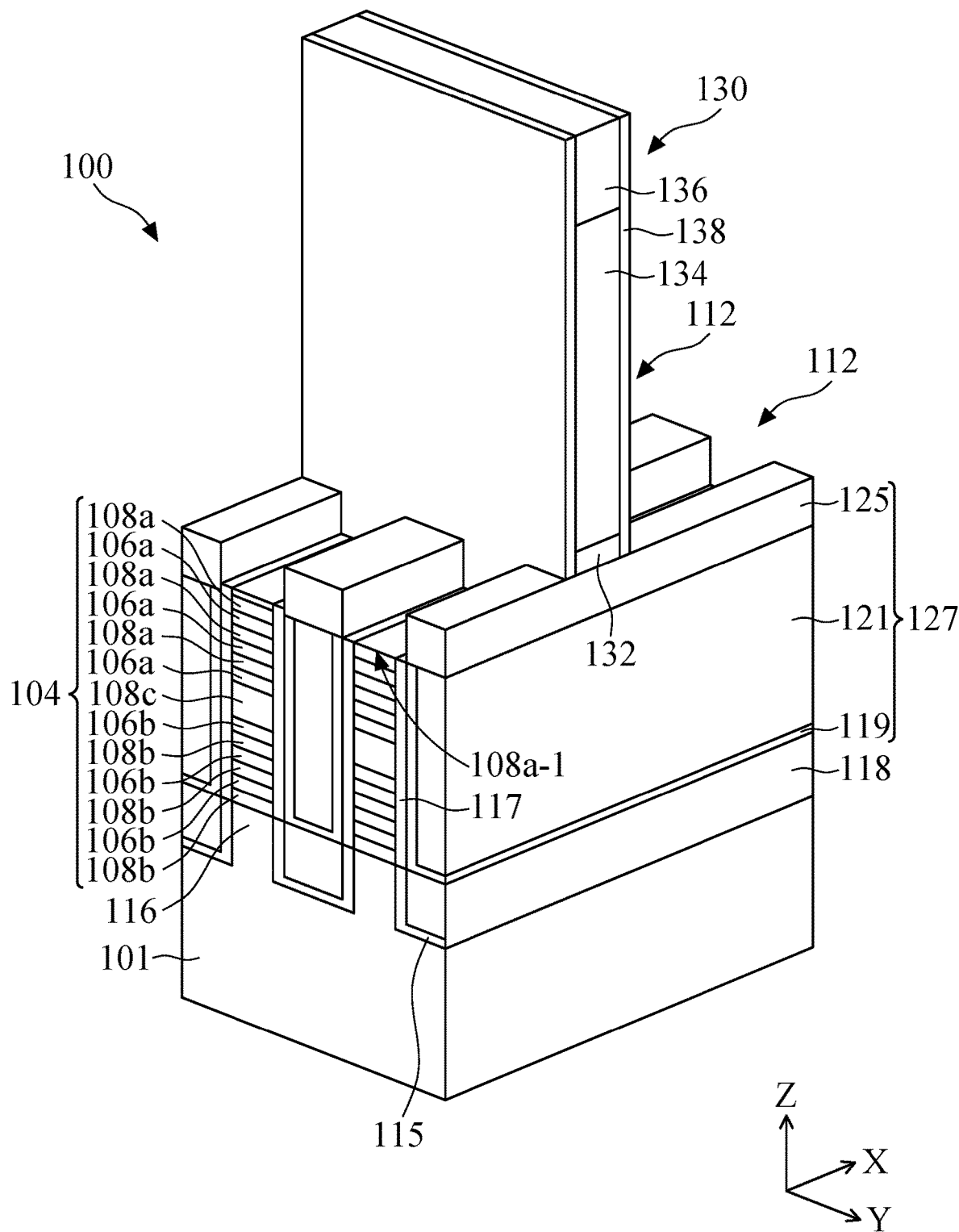

In FIG. 11, one or more sacrificial gate structures 130 (only one is shown) are formed over the semiconductor device structure 100. The sacrificial gate structures 130 are formed over a portion of the fin structures 112. Each sacrificial gate structure 130 may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof.

By patterning the sacrificial gate structure 130, the stacks of semiconductor layers 104 of the fin structures 112 are partially exposed on opposite sides of the sacrificial gate structure 130. The portions of the fin structures 112 that are covered by the sacrificial gate electrode layer 134 of the sacrificial gate structure 130 serve as channel regions for the semiconductor device structure 100. The fin structures 112 that are partially exposed on opposite sides of the sacrificial gate structure 130 define source/drain (S/D) regions for the semiconductor device structure 100. While one sacrificial gate structure 130 is shown, two or more sacrificial gate structures 130 may be arranged along the X direction in some embodiments.

Next, gate spacers 138 are formed on sidewalls of the sacrificial gate structures 130. The gate spacers 138 may be formed by first depositing a conformal layer that is subsequently etched back to form sidewall gate spacers 138. For example, a spacer material layer can be disposed conformally on the exposed surfaces of the semiconductor device structure 100. The conformal spacer material layer may be formed by an ALD process. Subsequently, anisotropic etch is performed on the spacer material layer using, for example, RIE. During the anisotropic etch process, most of the spacer material layer is removed from horizontal surfaces, such as the tops of the fin structures 112, the cladding layer 117, the dielectric material 125, leaving the gate spacers 138 on the vertical surfaces, such as the sidewalls of sacrificial gate structures 130. The gate spacer 138 may be made of a dielectric material such as silicon oxide, silicon nitride, silicon carbide, silicon oxynitride, SiCN, silicon oxycarbide, SiOCN, and/or combinations thereof.

Figure 12:
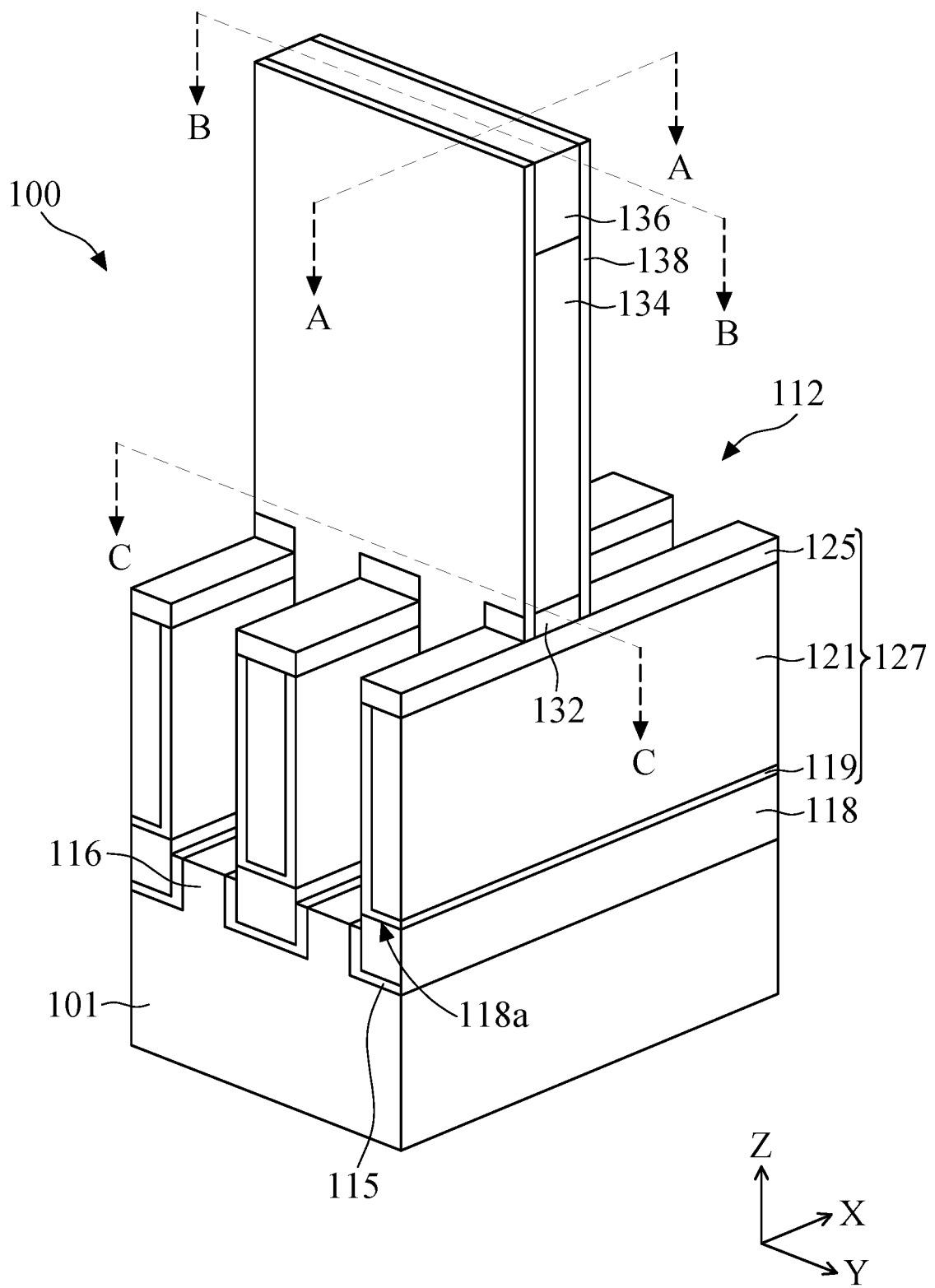

In FIG. 12, exposed portions of the fin structures 112, exposed portions of the cladding layers 117, and exposed portions of the dielectric material 125 not covered by the sacrificial gate structures 130 and the gate spacers 138 are selectively recessed by using one or more suitable etch processes, such as dry etch, wet etch, or a combination thereof. In some embodiments, exposed portions of the stacks of semiconductor layers 104 of the fin structures 112 are removed, exposing portions of the well portions 116. As shown in FIG. 12, the exposed portions of the fin structures 112 are recessed to a level at or below the top surface 118a of the insulating material 118. The recess processes may include an etch process that recesses the exposed portions of the fin structures 112 and the exposed portions of the cladding layers 117.

FIGS. 13A, 13B, and 13C are cross-sectional side views of the semiconductor device structure 100 taken along line A-A, line B-B, and line C-C of FIG. 12, respectively, in accordance with some embodiments.

FIGS. 14A, 14B, and 14C are cross-sectional side views of one of various stages of manufacturing the semiconductor device structure 100 taken along line A-A, line B-B, and line C-C of FIG. 12, respectively, in accordance with some embodiments. As shown in FIG. 14A, edge portions of each second semiconductor layer 108 (e.g., 108a, 108b, 108c) of the stack of semiconductor layers 104 are removed horizontally along the X direction. The removal of the edge portions of the second semiconductor layers 108 forms cavities. In some embodiments, the portions of the second semiconductor layers 108 are removed by a selective wet etching process. In cases where the second semiconductor layers 108 are made of SiGe and the first semiconductor layers 106 are made of silicon, the second semiconductor layer 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

After removing edge portions of each second semiconductor layers 108, a dielectric layer (or so-called inner spacer) is deposited in the cavities to form dielectric spacers 144. The dielectric spacers 144 may be made of a low-K dielectric material, such as SiON, SiCN, SiOC, SiOCN, or SiN. The dielectric spacers 144 may be formed by first forming a conformal dielectric layer using a conformal deposition process, such as ALD, followed by an anisotropic etching to remove portions of the conformal dielectric layer other than the dielectric spacers 144. The dielectric spacers 144 are protected by the first semiconductor layers 106 during the anisotropic etching process. The remaining second semiconductor layers 108 (e.g., 108a, 108b, 108c) are capped between the dielectric spacers 144 along the X direction.

FIGS. 15A, 15B, and 15C are cross-sectional side views of one of various stages of manufacturing the semiconductor device structure 100 taken along line A-A, line B-B, and line C-C of FIG. 12, respectively, in accordance with some embodiments. As shown in FIGS. 15A and 15C, epitaxial S/D features 146 are formed on the well portion 116 of the fin structures 112. The epitaxial S/D features 146 may include or be made of one or more layers of Si, SiP, SiC and SiCP for n-channel FETs or Si, SiGe, Ge for p-channel FETs. For p-channel FETs, p-type dopants, such as boron (B), may also be included in the epitaxial S/D features 146. In some embodiments, the epitaxial S/D feature 146 uses one or more layers of Si, SiGe, and Ge for a p-channel FET.

The epitaxial S/D features 146 may be formed by an epitaxial growth method using CVD, ALD or MBE. The epitaxial S/D features 146 may grow both vertically and horizontally to form facets, which may correspond to crystalline planes of the material used for the substrate 101. The epitaxial S/D features 146 are in contact with the first semiconductor layers 106a, 106b and dielectric spacers 144, as shown in FIG. 15A. The epitaxial S/D epitaxial features 146 may be the S/D regions. In this disclosure, a source region and a drain region are interchangeably used, and the structures thereof are substantially the same.

In FIGS. 16A and 16C, the epitaxial S/D features 146 are recessed by removing a portion of each epitaxial S/D feature 146. The recess of the epitaxial S/D features 146 may be performed by any suitable process, such as dry etch or wet etch that selectively removes a portion of each epitaxial S/D feature 146 but not the gate spacer 138, the dielectric material 125, and the liner 119. After the removal process, the epitaxial S/D features 146 are in contact with the first semiconductor layers 106b and the dielectric spacers 144, as shown in FIG. 16A. In some embodiments, the semiconductor device structure 100 includes a nanosheet p-channel FET having a source epitaxial feature/terminal 146 and a drain epitaxial feature/terminal 146 both in contact with one or more first semiconductor layers 106b, or one or more channels.

In FIGS. 17A and 17C, a dielectric material 147 is formed over the epitaxial S/D features 146. The dielectric material 147 may include the same material as the insulating material 118 and may be formed by the same method as the insulating material 118. In some embodiments, the dielectric material 147 includes an oxide that is formed by FCVD. The dielectric material 147 may be recessed to a level below the level of the first semiconductor layers 106a, as shown in FIG. 17A. The recess of the dielectric material 147 may be performed by any suitable process, such as dry etch or wet etch that selectively removes a portion of the dielectric material 147 but not the gate spacer 138, the first semiconductor layer 106a, and the dielectric spacers 144.

Figures 18A, 18B, 18C:
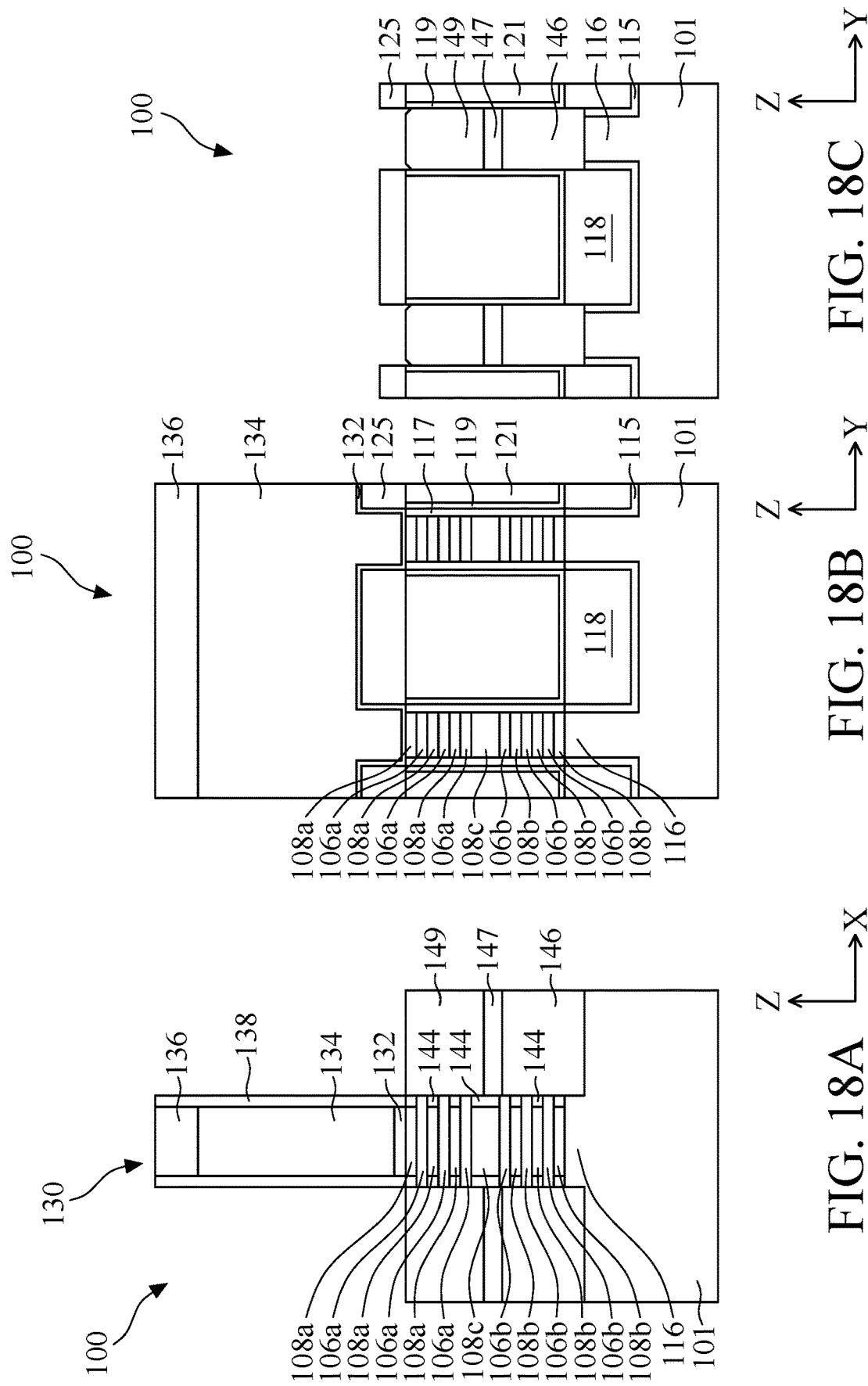

In FIGS. 18A and 18C, epitaxial S/D features 149 are formed on the dielectric material 147. The epitaxial S/D feature 149 may include one or more layers of Si, SiP, SiC and SiCP for an n-channel FET or Si, SiGe, Ge for a p-channel FET. In some embodiments, the epitaxial S/D feature 149 uses one or more layers of Si, SiP, SiC and SiCP for a n-channel FET. The epitaxial S/D features 149 may be formed from the first semiconductor layers 106a (FIG. 17A). The epitaxial S/D features 149 may grow both vertically and horizontally to form facets, which may correspond to crystalline planes of the material used for the first semiconductor layers 106a. The epitaxial S/D features 149 may be formed by an epitaxial growth method using CVD, ALD or MBE. Likewise, the epitaxial S/D features 149 may be the S/D regions.

As shown in FIGS. 18A and 18C, the source regions of the n-channel FETs and p-channel FETs may be vertically stacked and aligned, the drain regions of the n-channel FETs and the p-channel FETs may be vertically stacked and aligned, and the source of the n-channel FET and the source of the p-channel FET may be separated by the dielectric material 147. Vertical stacking of the n-channel FETs and p-channel FETs can increase the density of the FETs while reducing the cell active area footprint for the semiconductor devices, such as SRAMs.

In FIGS. 19A and 19C, a contact etch stop layer (CESL) 162 is conformally formed on the exposed surfaces of the semiconductor device structure 100. The CESL 162 covers the epitaxial S/D features 146, the gate spacers 138, the dielectric material 125, and the exposed surface of the stack of semiconductor layers 104. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, an interlayer dielectric (ILD) layer 164 is formed on the CESL 162 over the semiconductor device structure 100. The materials for the ILD layer 164 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials comprising Si, O, C, and/or H. The ILD layer 164 may be deposited by a PECVD process or other suitable deposition technique. In some embodiments, after formation of the ILD layer 164, the semiconductor device structure 100 may be subject to a thermal process to anneal the ILD layer 164.

Figures 20A, 20B, 20C:
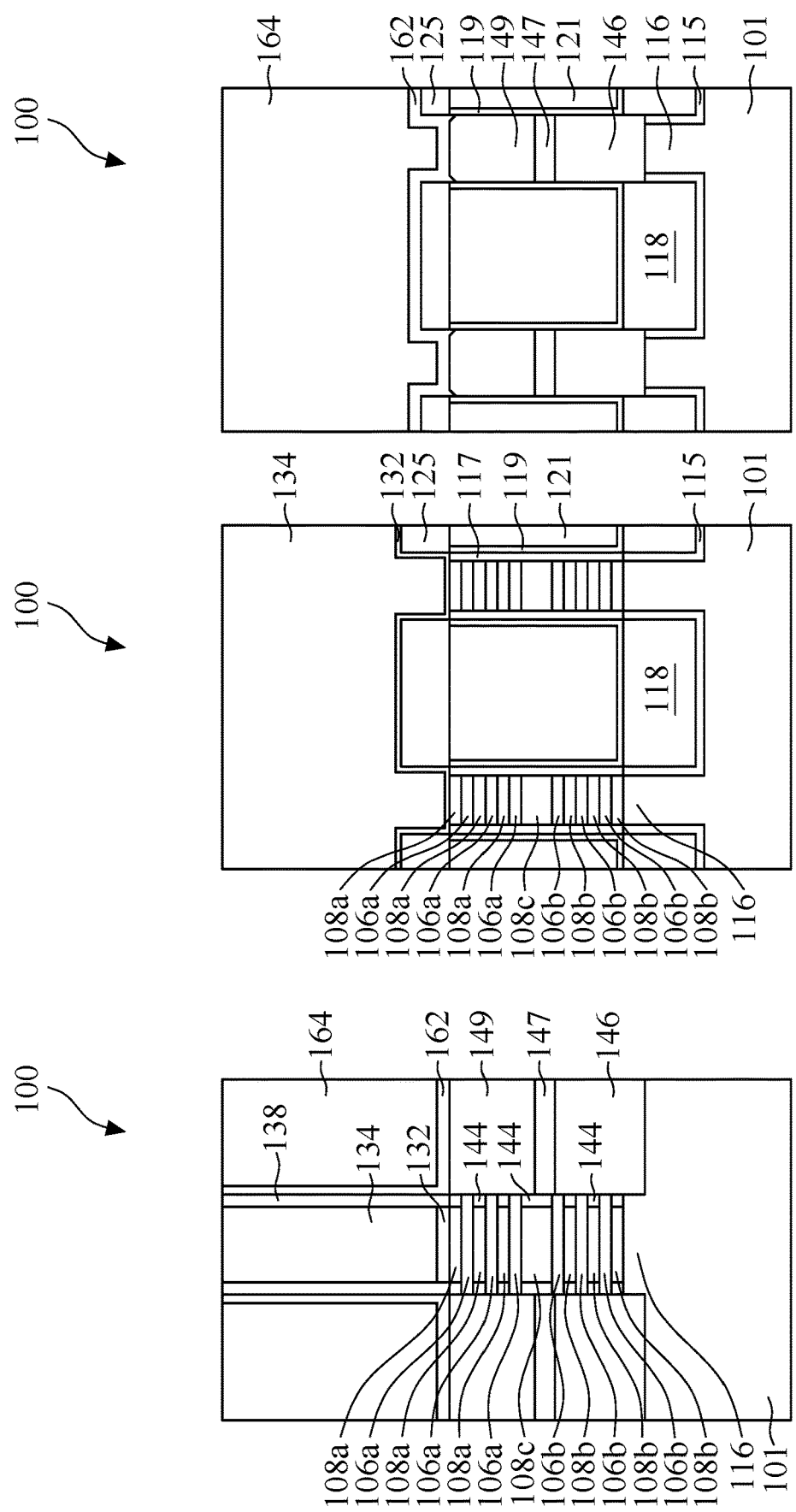

In FIGS. 20A, 20B, and 20C, after the ILD layer 164 is formed, a planarization operation, such as CMP, is performed on the semiconductor device structure 100 to remove portions of the ILD layer 164, the CESL 162 and the mask layer 136 until the sacrificial gate electrode layer 134 is exposed.

Figures 21A, 21B, 21C:
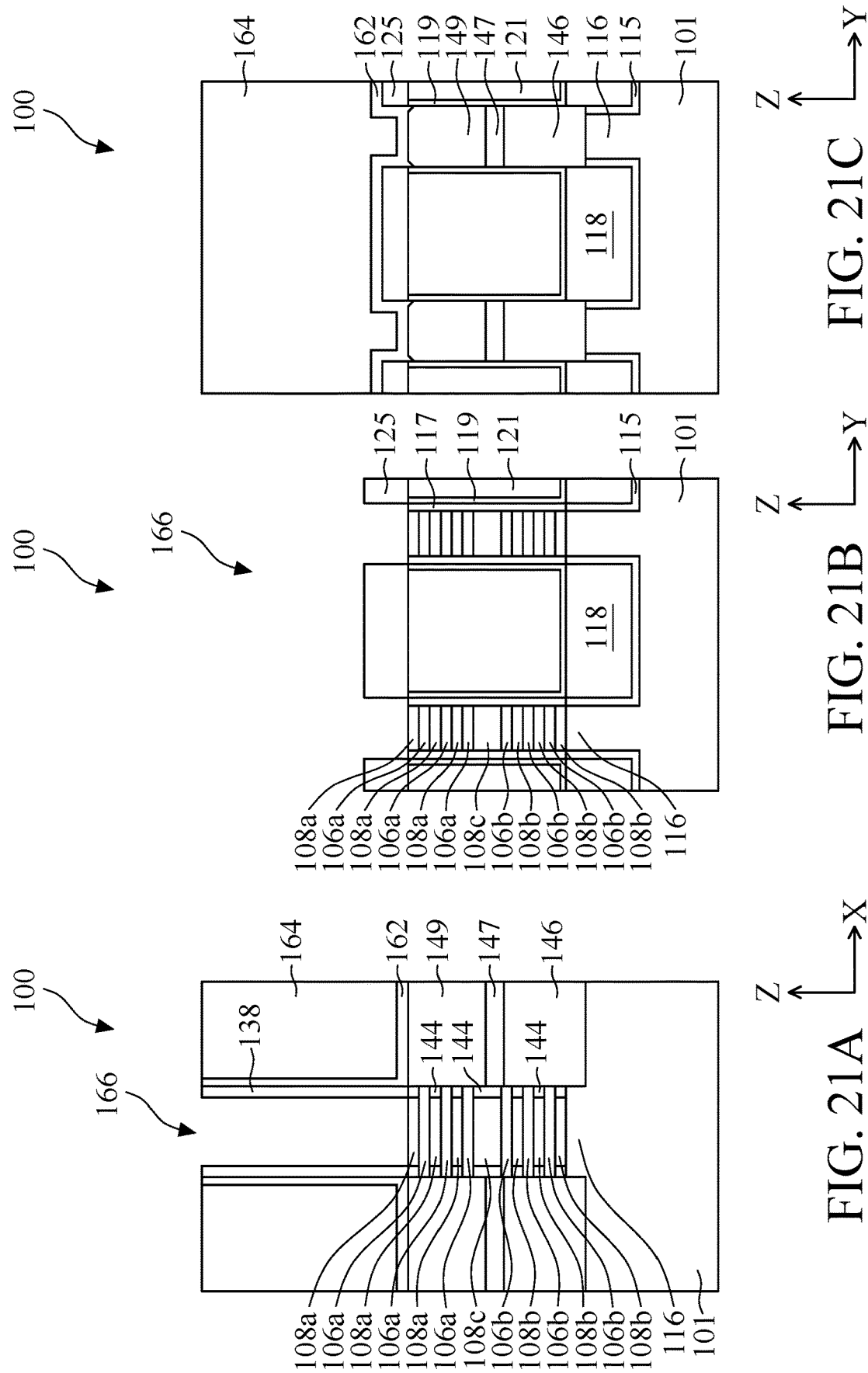

In FIGS. 21A and 21B, the sacrificial gate structure 130 is removed. The removal of the sacrificial gate structure 130 forms a trench 166 in the regions where the sacrificial gate electrode layer 134 and the sacrificial gate dielectric layer 132 were removed. The trench 166 exposes portions of the cladding layer 117 and the top of the second semiconductor layer 108a. The ILD layer 164 protects the epitaxial S/D features 146 during the removal of the sacrificial gate structure 130. The sacrificial gate structure 130 can be removed using plasma dry etching and/or wet etching. The sacrificial gate electrode layer 134 may be first removed by any suitable process, such as dry etch, wet etch, or a combination thereof, followed by the removal of the sacrificial gate dielectric layer 132, which may also be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 134 but not the gate spacers 138, the dielectric material 125, and the CESL 162. In some embodiments, the gate spacers 138 may be recessed by the etchant used to remove the sacrificial gate electrode layer 134 and/or the sacrificial gate dielectric layer 132.

In FIGS. 22A and 22B, the cladding layers 117 and the second semiconductor layers 108 (e.g., 108a, 108b, 108c) are removed. The removal of the cladding layers 117 and the second semiconductor layers 108 exposes the dielectric spacers 144 and the first semiconductor layers 106 (e.g., 106a, 106b). The removal process may be any suitable etch processes, such as dry etch, wet etch, or a combination thereof. The etch process may be a selective etch process that removes the cladding layers 117 (FIG. 21B) and the second semiconductor layers 108 but not the gate spacers 138, the CESL 162, the dielectric material 125, and the first semiconductor layers 106. As a result, openings 151 are formed around the first semiconductor layers 106, as shown in FIG. 22B. That is, the portion of the first semiconductor layers 106 not covered by the dielectric spacers 144 is exposed to the openings 151.

FIGS. 23-28, 29A-29B, 30, 32-36, 37A-37B, 38, 40-41, and 42A are enlarged views of a region 220 of FIG. 22B showing various stages of manufacturing the semiconductor device structure 100 in accordance with some embodiments. For the sake of clarity, the dielectric material 125 is omitted in FIGS. 23-28, 29A-29B, 30, 32-36, 37A-37B, 38, 40-41, and 42A. In the embodiment shown in FIG. 23, each first semiconductor layer 106b may be a nanosheet channel of a first nanosheet transistor 155, such as a p-channel FET, and each first semiconductor layer 106a may be a nanosheet channel of a second nanosheet transistor 153, such as a n-channel FET. The second nanosheet transistors (e.g., 106a) are disposed over and aligned with the first nanosheet transistors (e.g., 106b) along the Z-direction. Depending on the application, nanosheet transistors having higher thermal budget (e.g., p-channel FETs) may be arranged below nanosheet transistors having lower thermal budget (e.g., n-channel FETs).

The top surface 133 of the topmost first semiconductor layer 106a is below the top surface 135 of the liner 119 by a height "H" due to the removal of the topmost second semiconductor layer 108a (FIG. 21B). Each first semiconductor layer 106a, 106b has a first height "H1" of about 2 nm to about 15 nm, for example about 3 nm to about 10 nm. In some embodiments, one or more first semiconductor layers 106a may have a first height "H1" different from that of one or more first semiconductor layers 106a, and one or more first semiconductor layers 106b may have the first height "H1" different from that of one or more first semiconductor layers 106b. In some embodiments, one or more first semiconductor layers 106a, 106b may have a first height while one or more first semiconductor layers 106a, 106b may have a second height different from the first height. The first height "H1" as used in this disclosure may also refer to nanosheet channel height or a thickness of the first semiconductor layers 106a, 106b.

The opening 151 between the first semiconductor layer 106b of the first nanosheet transistor 155 and the first semiconductor layer 106a of the second nanosheet transistor 153 has a second height "H2" that is greater than the first height "H1". The ratio of the second height "H2" to the first height "H1" may be in a range of about 1.5 to 3. The second height "H2" provides additional space to compensate for possible over-etch or under-etch that may occur during recess of the hardmask at a later stage (e.g., FIG. 28) and thus can help define boundary between the first nanosheet transistor 155 and the second nanosheet transistor 153. Therefore, if the ratio of the second height "H2" to the first height "H1" is less than about 1.5, the hardmask might be recessed to a level that is within the first nanosheet transistor 155 or the second nanosheet transistor 153 due to under-etching or over-etching. On the other hand, if the ratio of the second height "H2" to the first height "H1" is greater than about 3, the manufacturing cost is increased without significant advantage.

Figure 24:
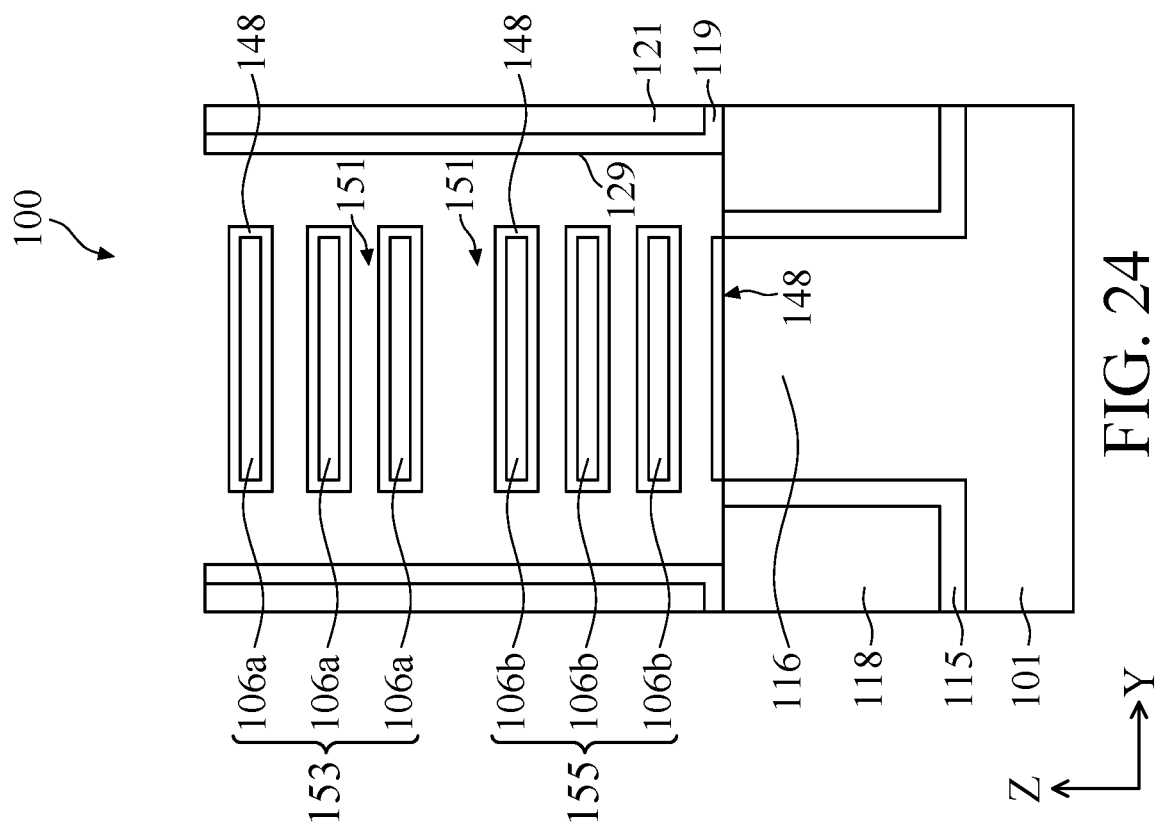
Figure 23:
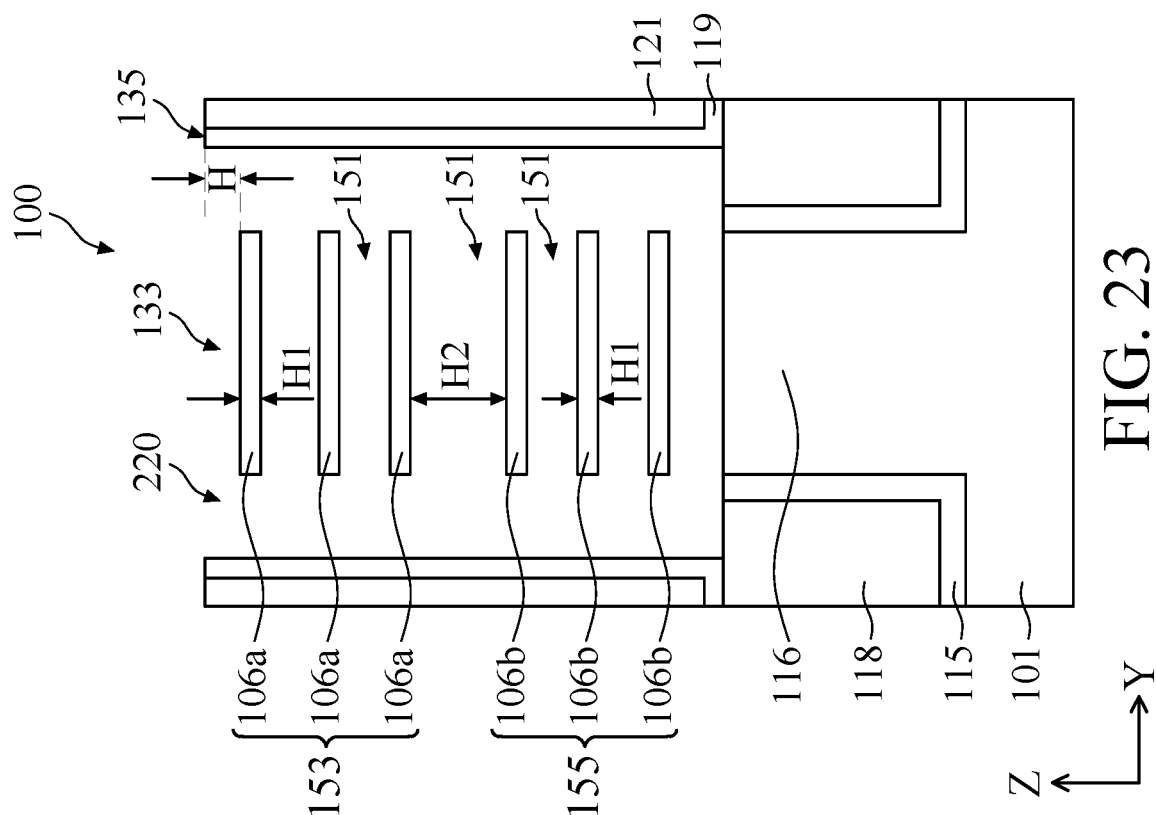

In FIG. 24, the semiconductor device structure 100 is subjected to a pre-clean process to remove residues or unwanted films from exposed surfaces of the first semiconductor layers 106b of the first nanosheet transistor 155 and the first semiconductor layer 106a of the second nanosheet transistor 153. The pre-clean process may be any suitable wet cleaning process such as an APM process, which includes at least water ($H_2O$), ammonium hydroxide ($NH_4OH$), and hydrogen peroxide ($H_2O_2$), a HPM process, which includes at least $H_2O$, $H_2O_2$, and hydrogen chloride (HCl), a SPM process (also known as piranha clean), which includes at least $H_2O_2$ and sulfuric acid ($H_2SO_4$), or any combination thereof.

Next, an interfacial layer (IL) 148 is formed to surround the exposed surfaces of the first semiconductor layers 106a, 106b, as shown in FIG. 24. In some embodiments, the IL 148 may also form on the well portion 116 of the substrate 101. The IL 148 may include or be made of an oxygen-containing material or a silicon-containing material, such as silicon oxide, silicon oxynitride, oxynitride, hafnium silicate, etc. The IL 148 may be formed by CVD, ALD or any suitable conformal deposition technique. In one embodiment, the IL 148 is formed using ALD. The thickness of the IL 148 is chosen based on device performance considerations. In some embodiments, the IL 148 has a thickness ranging from about 0.5 nm to about 2 nm.

Figure 25:
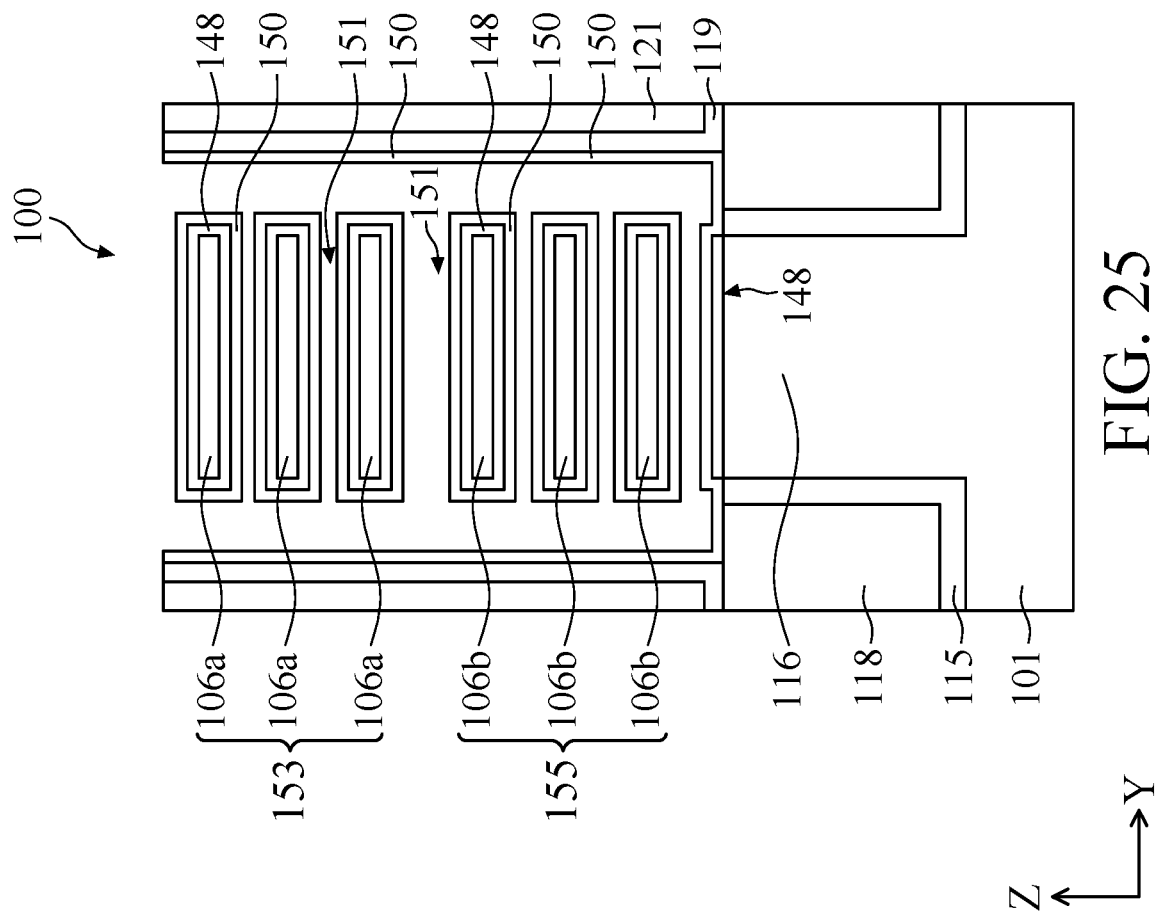

In FIG. 25, a first dipole layer 150 is formed on the IL 148 and the exposed surfaces of the semiconductor device structure 100. In some embodiments, the first dipole layer 150 forms on the liner 119, the insulating material 118, the liner 115, and the IL 148 that is in contact with the well portion 116 of the substrate 101. Depending on the conductivity type of the first nanosheet transistor 155, the first dipole layer 150 may be configured to include positive polarity or negative polarity. The first dipole layer 150 serves to enhance or modify threshold voltage for the first nanosheet transistor 155. In cases where the first nanosheet transistor 155 is a p-channel FET, the first dipole layer 150 can be a positive polarity dipole (p-dipole) layer formed from a material inherently including a positive polarity. Such materials may include, but are not limited to, aluminum oxide ($Al_2O_3$), titanium dioxide ($TiO_2$), germanium oxide ($GeO_2$), or the like. The first dipole layer 150 can be formed by ALD, CVD, or any suitable conformal deposition technique in order to ensure uniform thickness of the first dipole layer 150. The thickness of the first dipole layer 150 is chosen based on device performance considerations. In some embodiments, the first dipole layer 150 has a thickness ranging from about 0.05 nm to about 2 nm.

In some alternative embodiments, which can be combined with any embodiment(s) of this disclosure, the first dipole layer 150 may be formed to surround the exposed surfaces of the first semiconductor layers 106a, 106b, followed by formation of the IL 148 on the first dipole layer 150.

Figure 26:
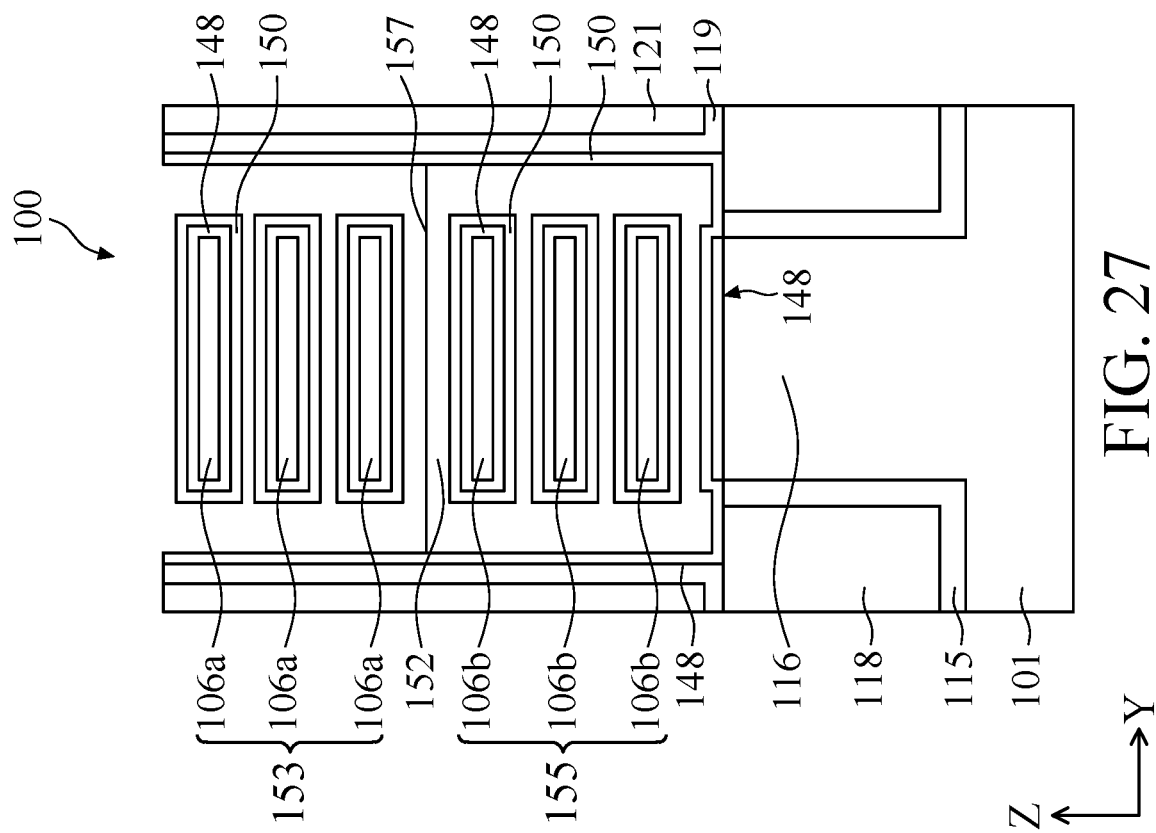
Figure 27:
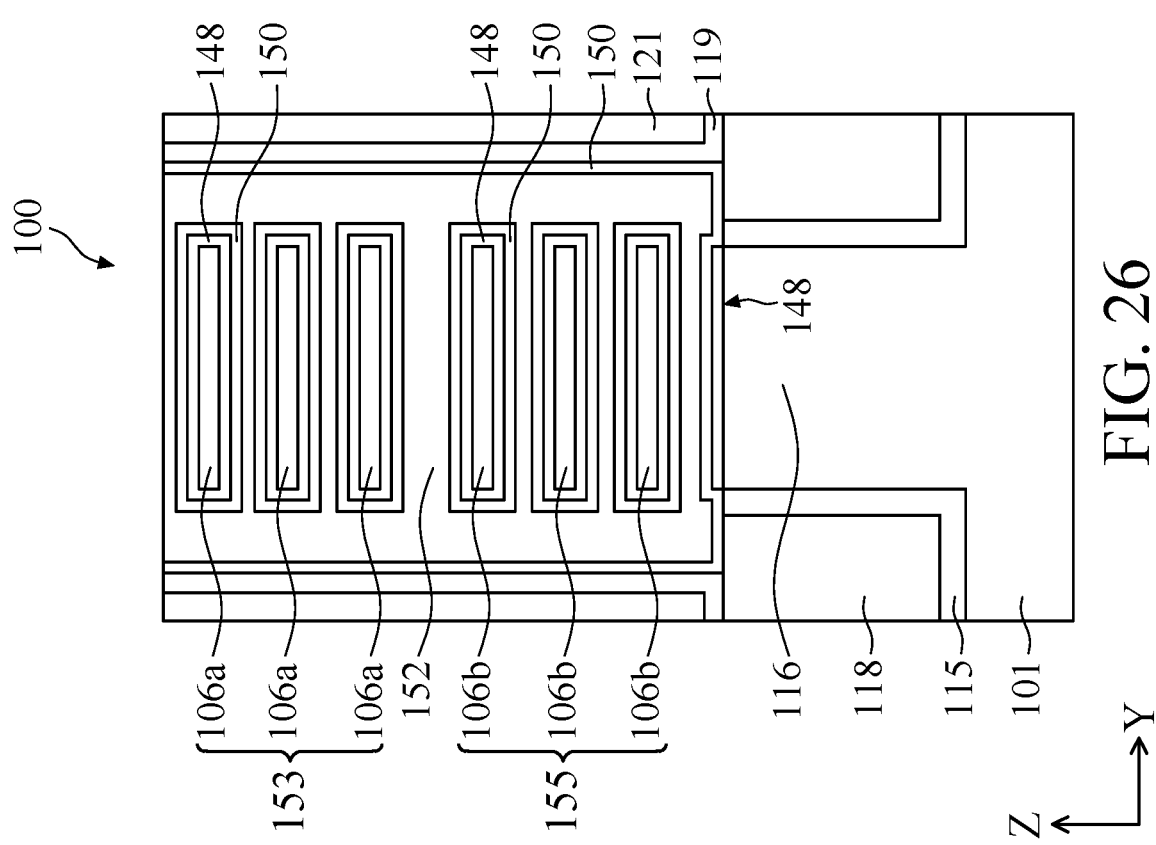

In FIG. 26, a mask layer 152 is formed on the first dipole layer 150 and in each opening 151 (FIG. 25). The mask layer 152 fills the opening 151 to a level so that at least the first dipole layer 150 within the second nanosheet transistor 153 is submerged in the mask layer 152. The mask layer 152 protects the first dipole layer 150 within the first nanosheet transistor 155, such as a p-channel FET, during the subsequent mask layer etch-back process (FIG. 27). The mask layer 152 may be any suitable masking material, such as a photoresist layer, a BARC (bottom anti-reflective coating) layer, a SOG (spin-on-glass) layer, or a SOC (spin-on-carbon) layer, and may be deposited by spin coating or any suitable deposition technique.

In FIG. 27, the mask layer 152 is recessed to expose the first dipole layer 150 within the second nanosheet transistor 153. The recess of the mask layer 152 may be performed using a suitable etch-back process, such as dry etch, wet etch, or reactive ion etch (RIE). The etch-back process uses an etchant that selectively removes the mask layer 152 but not the first dipole layer 150. The recessed mask layer 152 has a top surface 157 that may be at a level between the topmost first semiconductor layer 106b of the first nanosheet transistor 155 and the bottom-most first semiconductor layer 106a of the second nanosheet transistor 153. The top surface 157 defines the boundary between the first nanosheet transistor 155 and the second nanosheet transistor 153.

Figure 28:
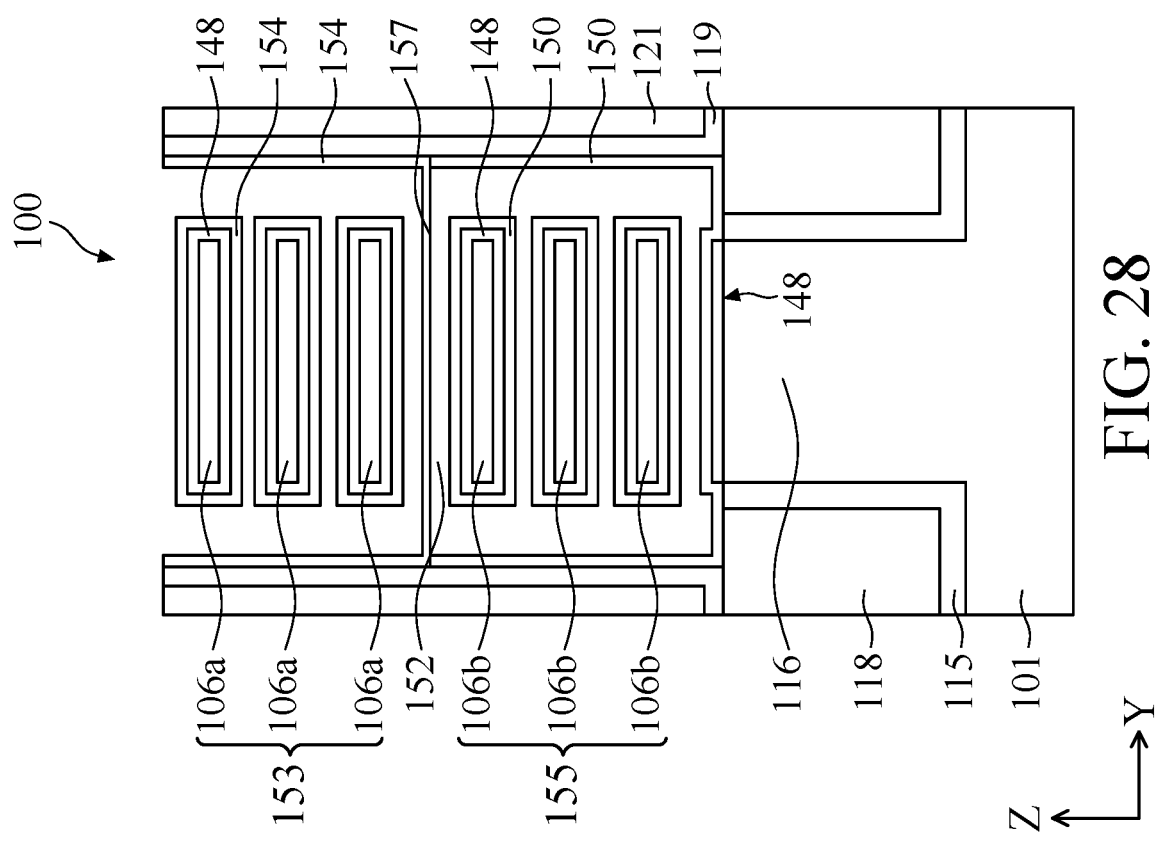
Figure 29B:
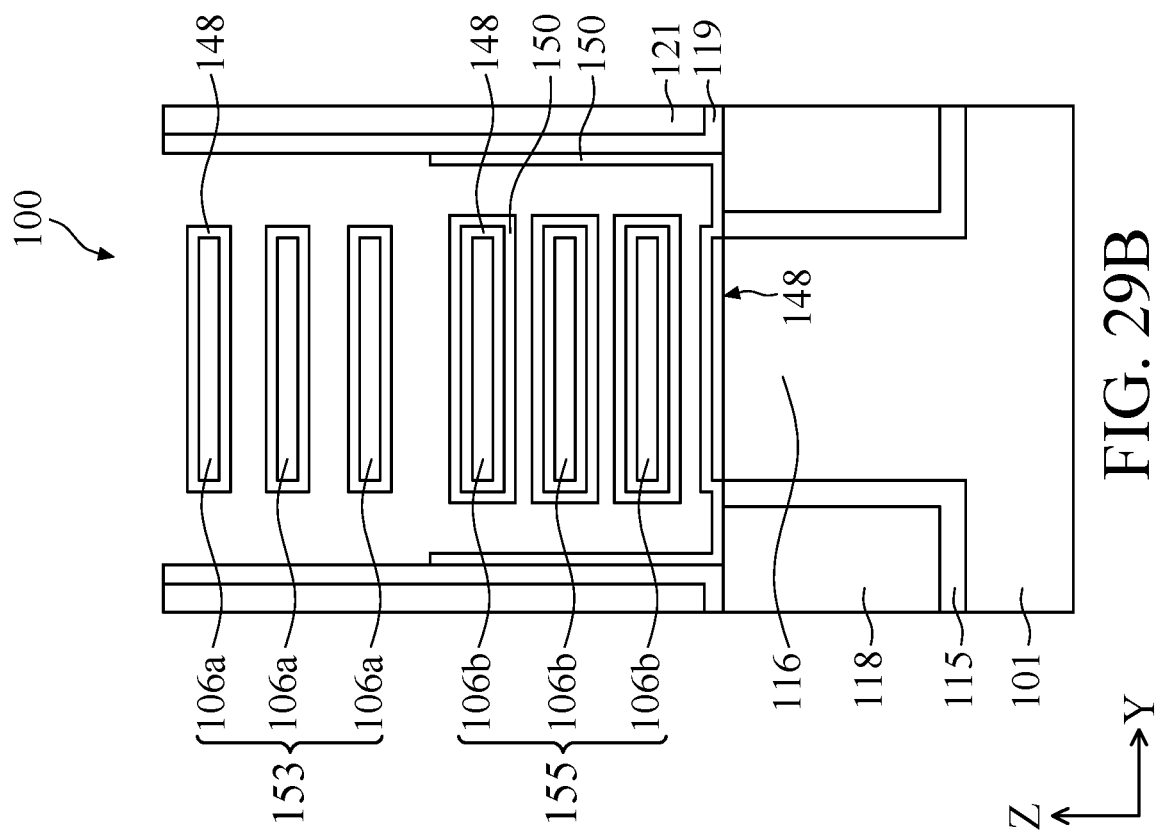

In FIG. 28, the first dipole layer 150 that is not covered by the mask layer 152 is removed. The removal process removes the first dipole layer 150 to expose the IL 148 (formed on the first semiconductor layers 106a) within the second nanosheet transistor 153. The removal process also exposes the top surface 157 of the mask layer 152 and a portion of the first dipole layer 150 surrounding the mask layer 152. The removal process may be any suitable processes, such as dry etch, wet etch, or a combination thereof. In some embodiments, the first dipole layer 150 is removed by a wet etch using $NH_4OH$, dilute hydrofluoric acid (HF) (e.g., 2% HF), buffered HF (e.g., 30-50% ammonium fluoride ($NH_4F$) and 5-10% HF)), or any combination thereof.

Next, after removal of the first dipole layer 150 within the second nanosheet transistor 153, a second dipole layer 154 is formed on the exposed IL 148, the top surface 157 of the mask layer 152, and the exposed liner 119. The second dipole layer 154 surrounds the first semiconductor layers 106a within the second nanosheet transistor 153. Likewise, the second dipole layer 154 may be configured to include positive polarity or negative polarity, depending on the conductivity type of the second nanosheet transistor 153. The second dipole layer 154 serves to enhance or modify threshold voltage for the second nanosheet transistor 153. In cases where the second nanosheet transistor 153 is a n-channel FET, the second dipole layer 154 can be a negative polarity dipole (n-dipole) layer formed from a material inherently including a negative polarity. Such materials may include, but are not limited to, lanthanum oxide ($La_2O_3$), magnesium oxide (MgO), yttrium oxide ($Y_2O_3$), gadolinium oxide ($Gd_2O_3$), or the like. The second dipole layer 154 can be formed by ALD, CVD, or any suitable conformal deposition technique in order to ensure uniform thickness of the second dipole layer 154. The thickness of the first dipole layer 150 is chosen based on device performance considerations. In some embodiments, the first dipole layer 150 has a thickness ranging from about 0.05 nm to about 2 nm.

Figure 29A:
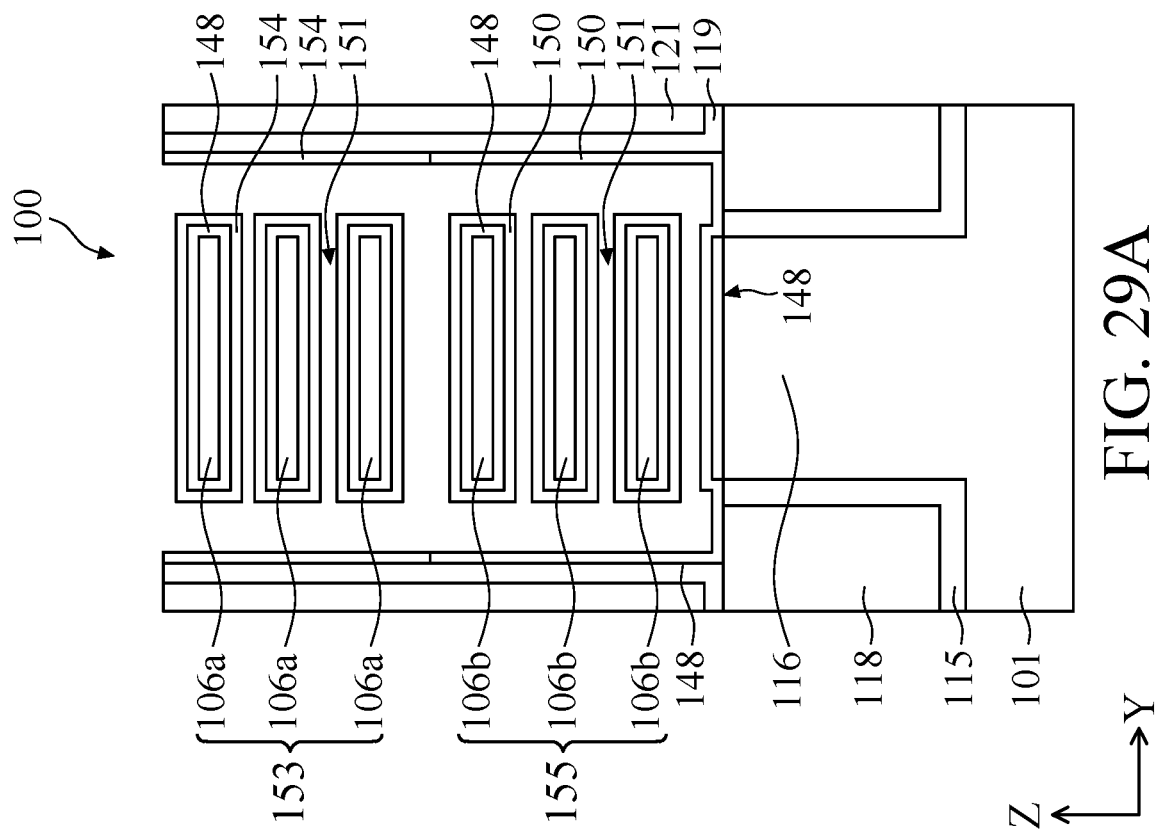

In FIG. 29A, the mask layer 152 is removed. The removal process may use ash process or dry/wet etch process identical or similar to the process used for removal of the mask layer 152 as discussed in FIG. 27. The removal process selectively removes the mask layer 152 but not the first dipole layer 150 and the second dipole layer 154. The second dipole layer 154 on the top surface 157 of the mask layer 152 (FIG. 28) is removed along with the mask layer 152. The openings 151 within the first nanosheet transistor 155 are revealed upon removal of the mask layer 152, exposing the first semiconductor layers 106b being surrounded by the first dipole layer 150.

FIG. 29A illustrates one embodiment where the first semiconductor layers 106b within the first nanosheet transistor 155 are surrounded by the first dipole layer 150, and the first semiconductor layers 106a within the second nanosheet transistor 153 are surrounded by the second dipole layer 154. In some embodiments, which can be combined with one or more embodiments (e.g., FIGS. 37A, 37B, 39A, 39B) discussed in this disclosure, one or more second nanosheet transistors 153 in the semiconductor device structure 100 are further proceeded to have the second dipole layer 154 removed from the first semiconductor layers 106a and from the liner 119, such as an alternative embodiment shown in FIG. 29B. The removal of the second dipole layer 154 can be done after removing the mask layer 152 by a suitable selective etch process that removes the second dipole layer 154 but not the first dipole layer 150. By configuring one or more second nanosheet transistors 153 to include the second dipole layer 154 over the first semiconductor layers 106a and one or more second nanosheet transistors 153 to not include the second dipole layer 154 over the first semiconductor layers 106a, the semiconductor device structure 100 can provide CFETs having multi-threshold voltage schemes according to the application needs.

In FIG. 30, the semiconductor device structure 100 is subjected to a thermal treatment 131. The second dipole layer 154 and the first dipole layer 150 are diffused into and mixed with the IL 148 as a result of the thermal treatment 131. In some embodiments, the interface between the IL 148 and the first dipole layer 150 and the interface between the IL 148 and the second dipole layer 154 may not be observed after the thermal treatment. In some embodiments, the diffusion of the second dipole layer 154 and the IL 148 forms a first intermixed layer 156 surrounding and in contact with the first semiconductor layers 106a.

Likewise, the diffusion/intermixing of the first dipole layer 150 and the IL 148 forms a second intermixed layer 158 surrounding and in contact with the first semiconductor layers 106b. The first dipole layer 150 also diffuses into the IL 148 in contact with the well portion 116 of the substrate 101 and forms a bottom intermixed layer 159. The first intermixed layer 156, the second intermixed layers 158, and the bottom intermixed layer 159 can be considered as modified IL layers. The term "first/second intermixed layer" or "modified IL layer" as used in this disclosure denotes a reaction product of the IL 148 and the first/second dipole layer 150/154, which can be a compound, a composition or a mixture, depending on the thermal treatment used. In some embodiments, the first/second intermixed layer 156/158 or the modified IL layer can be an IL doped with materials from the second dipole layer 154 or the first dipole layer 150.

In some alternative embodiments, which can be combined with any embodiment(s) discussed in this disclosure, the thermal treatment may cause portions of the second dipole layer 154 to diffuse into the IL 148 and form an intermixed layer 156a sandwiched between the IL 148 and the second dipole layer 154, as an alternative embodiment shown in FIG. 31A.

In some alternative embodiments, which can be combined with any embodiment(s) discussed in this disclosure, the thermal treatment may cause portions of the first dipole layer 150 to diffuse into the IL 148 and form an intermixed layer 158a sandwiched between the IL 148 and the first dipole layer 150, as an alternative embodiment shown in FIG. 31B.

The thermal treatment 131 can be any type of anneal, such as rapid thermal anneal, a spike anneal, a soak anneal, a laser anneal, a furnace anneal, etc. The thermal treatment may be performed for about 0.5 seconds to about 60 seconds, such as about 10 seconds to about 30 seconds, and at a temperature range of about 450° C. to about 1200° C. The thermal treatment may be performed in an atmosphere of gas, such as a nitrogen-containing gas, an oxygen-containing gas, a hydrogen-containing gas, an argon-containing gas, a helium-containing gas, or any combinations thereof. Exemplary gas may include, but are not limited to, $N_2$, $NH_3$, $O_2$, $N_2O$, Ar, He, H, etc.

After the thermal treatment, the semiconductor device structure 100 is subjected to a wet treatment. The wet treatment removes the first and second dipole layers 150, 154 formed on the liner 119, the liner 115, and the insulating material 118, as shown in FIG. 30. The wet treatment may be a wet etch such as a SPM process, an APM process, or a HPM process discussed above.

Figure 32:
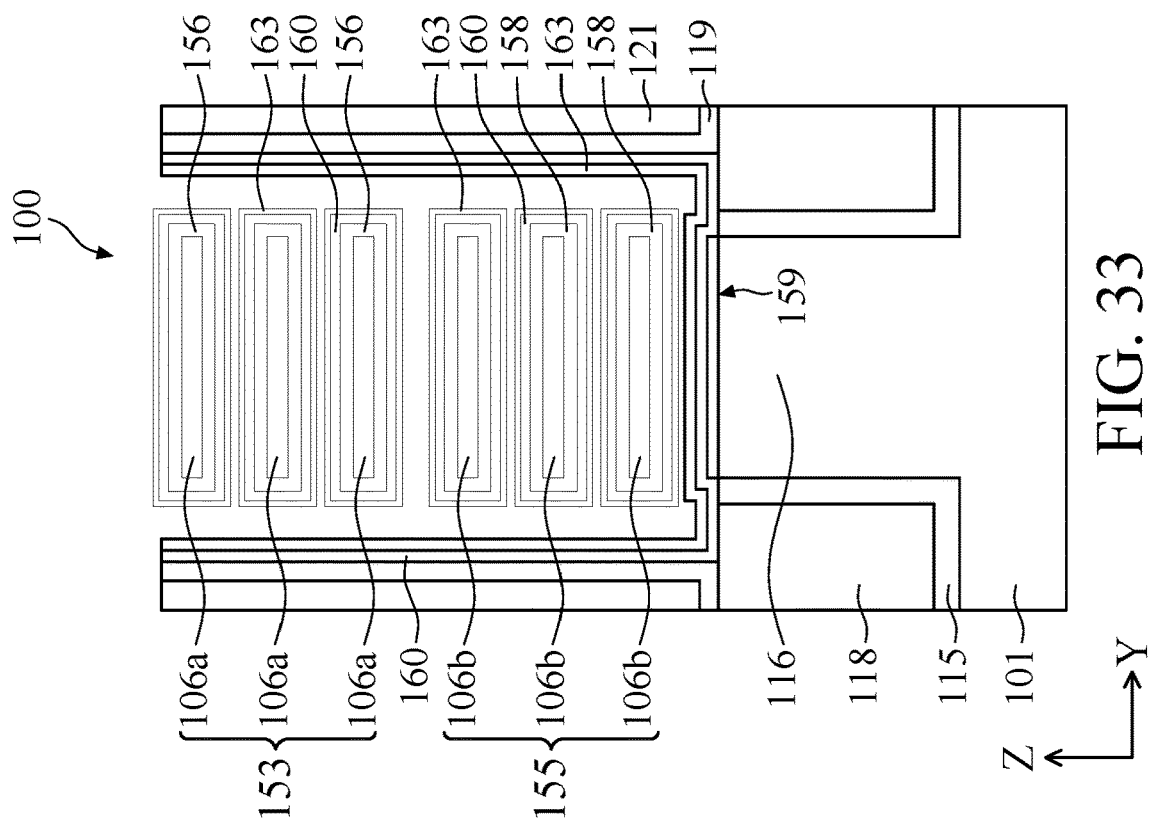
FIGS. 32-38 are enlarged views of a region of FIG. 22B showing various stages of manufacturing the semiconductor device structure in accordance with some embodiments.

In FIG. 32, a high-K (HK) dielectric layer 160 is formed on the exposed surfaces of the semiconductor device structure 100. In some embodiments, the HK dielectric layer 160 is formed to wrap around the first intermixed layer 156 (or the second dipole layer 154) and the second intermixed layer 158 (or the first dipole layer 150). The HK dielectric layer 160 also forms on the liner 119, the insulating material 118, the liner 115, and the bottom intermixed layer 159. The HK dielectric layer 160 may include or made of hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HMO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), or other suitable high-k materials. The HK dielectric layer 160 may be a conformal layer formed by a conformal process, such as an ALD process or a CVD process. The HK dielectric layer 160 may have a thickness ranging from about 0.5 nm to about 3 nm.

Figure 33:
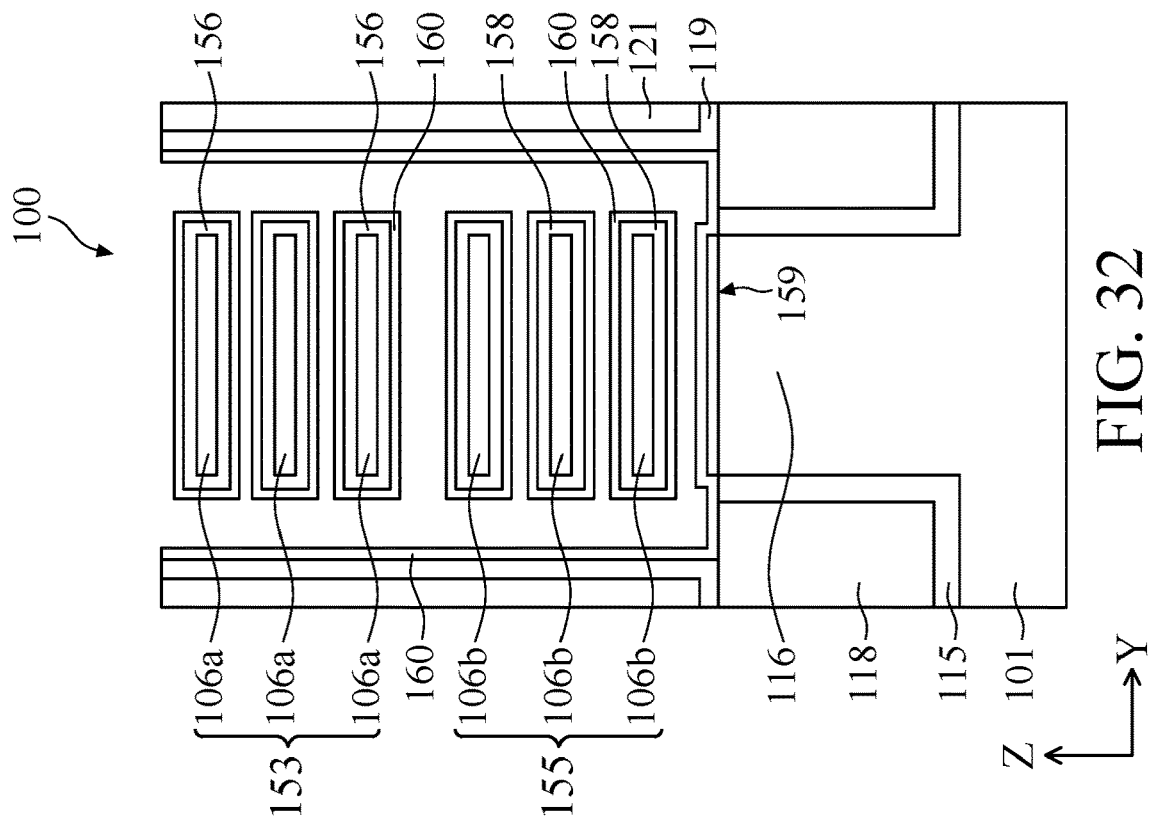

In FIG. 33, a third dipole layer 163 is formed on the exposed surfaces of the semiconductor device structure 100. In some embodiments, the third dipole layer 163 is formed on the HK dielectric layer 160. Depending on the conductivity type of the first nanosheet transistor 155, the third dipole layer 163 may be configured to include positive polarity or negative polarity. The third dipole layer 163 serves to enhance or modify threshold voltage for the first nanosheet transistor 155. In cases where the first nanosheet transistor 155 is a p-channel FET, the third dipole layer 163 can be a positive polarity dipole (p-dipole) layer formed using ALD, CVD, or any suitable conformal deposition technique. In some embodiments, the third dipole layer 163 can be formed of the same or different material than the first dipole layer 150. The third dipole layer 163 may have the same or different thickness than the first dipole layer 150, depending on the application.

Figure 34:
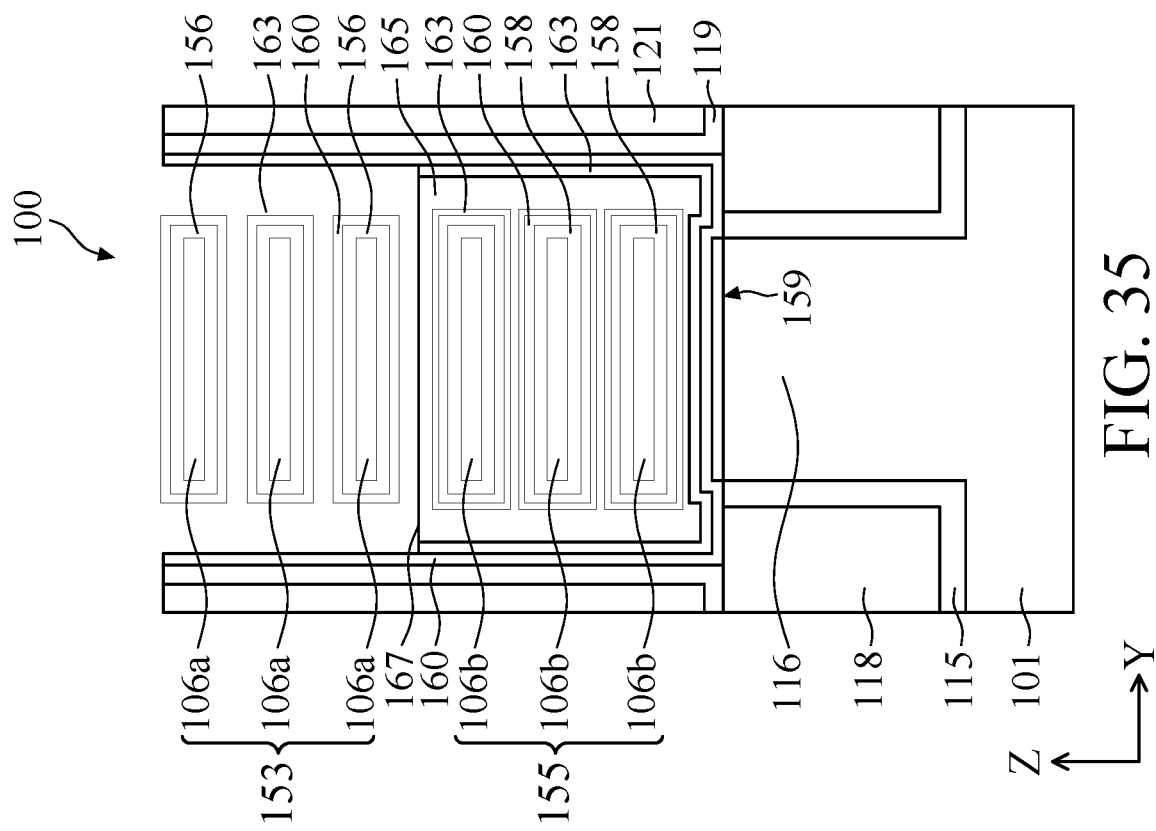

In FIG. 34, a mask layer 165 is formed on the third dipole layer 163 and in each opening 151 to cover the entire first semiconductor layers 106b and the third dipole layer 163 formed therearound within the first nanosheet transistor 155. The mask layer 165 may be formed by first forming a mask layer filling the openings 151, followed by an etch back process to recess the mask layer 165 to a level between the topmost first semiconductor layer 106b of the first nanosheet transistor 155 and the bottom-most first semiconductor layer 106a of the second nanosheet transistor 153. The mask layer 165 may use the same material as the mask layer 152 and formed by spin coating or any suitable deposition technique. The recess of the mask layer 165 exposes the third dipole layer 163 within the second nanosheet transistor 153, as shown in FIG. 34.

Figure 35:
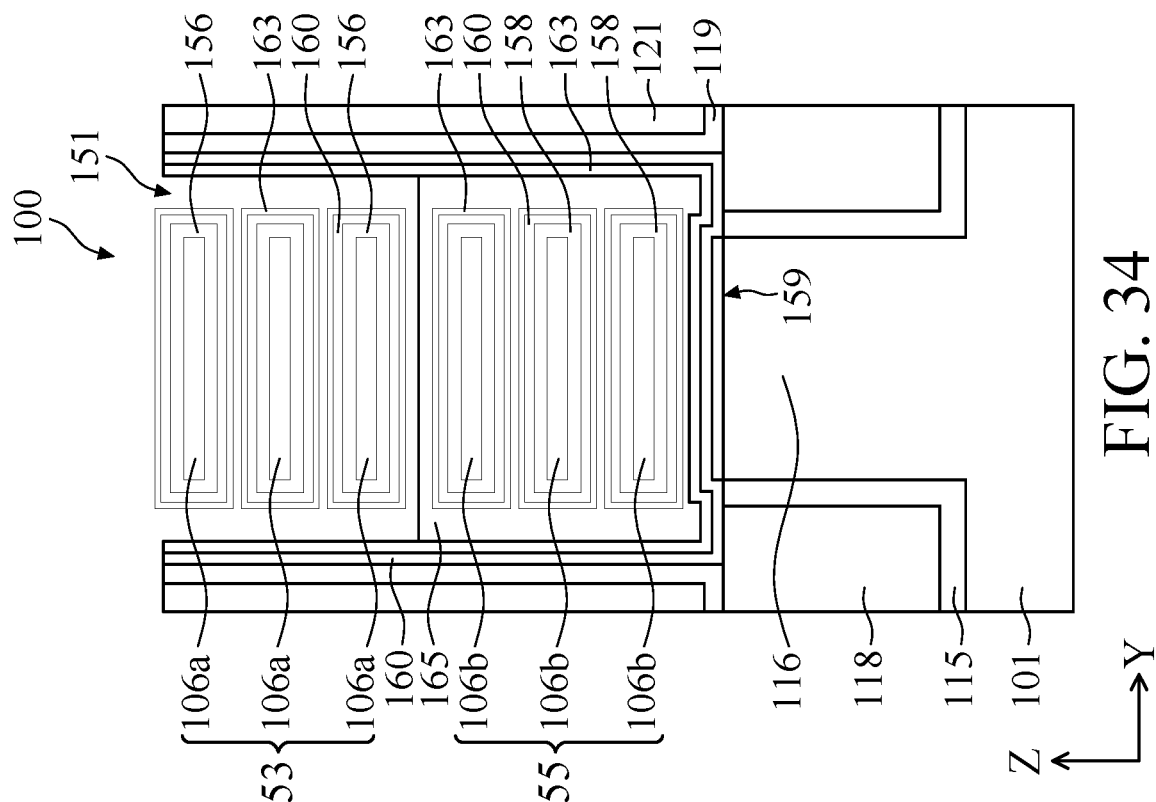

In FIG. 35, the third dipole layer 163 that is not covered by the mask layer 165 is removed. The removal process removes the third dipole layer 163 to expose the HK dielectric layer 160 (formed on the first intermixed layer 156) within the second nanosheet transistor 153. The removal process also exposes the top surface 167 of the mask layer 165 and a portion of the third dipole layer 163 surrounding the mask layer 165. The removal process may be any suitable processes, such as the removal process discussed above in FIG. 28 or the pre-clean process discussed above in FIG. 24.

Figure 36:
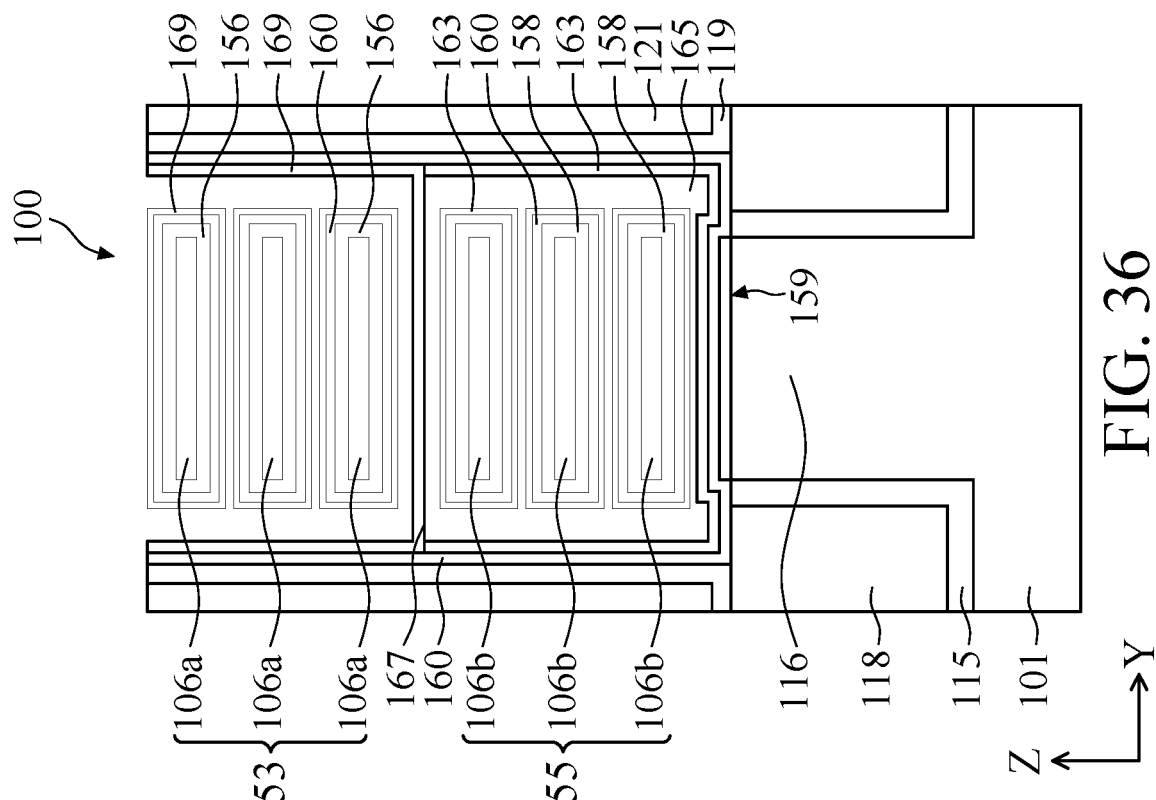

In FIG. 36, after removal of the third dipole layer 163 within the second nanosheet transistor 153, a fourth dipole layer 169 is formed on the exposed HK dielectric layer 160. In some embodiments, the fourth dipole layer 169 wraps around and in contact with the HK dielectric layer 160 around the first semiconductor layers 106a. The fourth dipole layer 169 extends along the liner 119 and the top surface 167 of the mask layer 165 and in contact with the HK dielectric layer 160, the third dipole layer 163, and the mask layer 165. The fourth dipole layer may be configured to include positive polarity or negative polarity, depending on the conductivity type of the second nanosheet transistor 153. The fourth dipole layer 169 serves to enhance or modify threshold voltage for the second nanosheet transistor 153. In cases where the second nanosheet transistor 153 is a n-channel FET, the fourth dipole layer 169 can be a negative polarity dipole (n-dipole) layer formed using ALD, CVD, or any suitable conformal deposition technique. In some embodiments, the fourth dipole layer 169 can be formed of the same or different material from the second dipole layer 154. The fourth dipole layer 169 may have the same or different thickness than the second dipole layer 154, depending on the application.

Figure 37A:
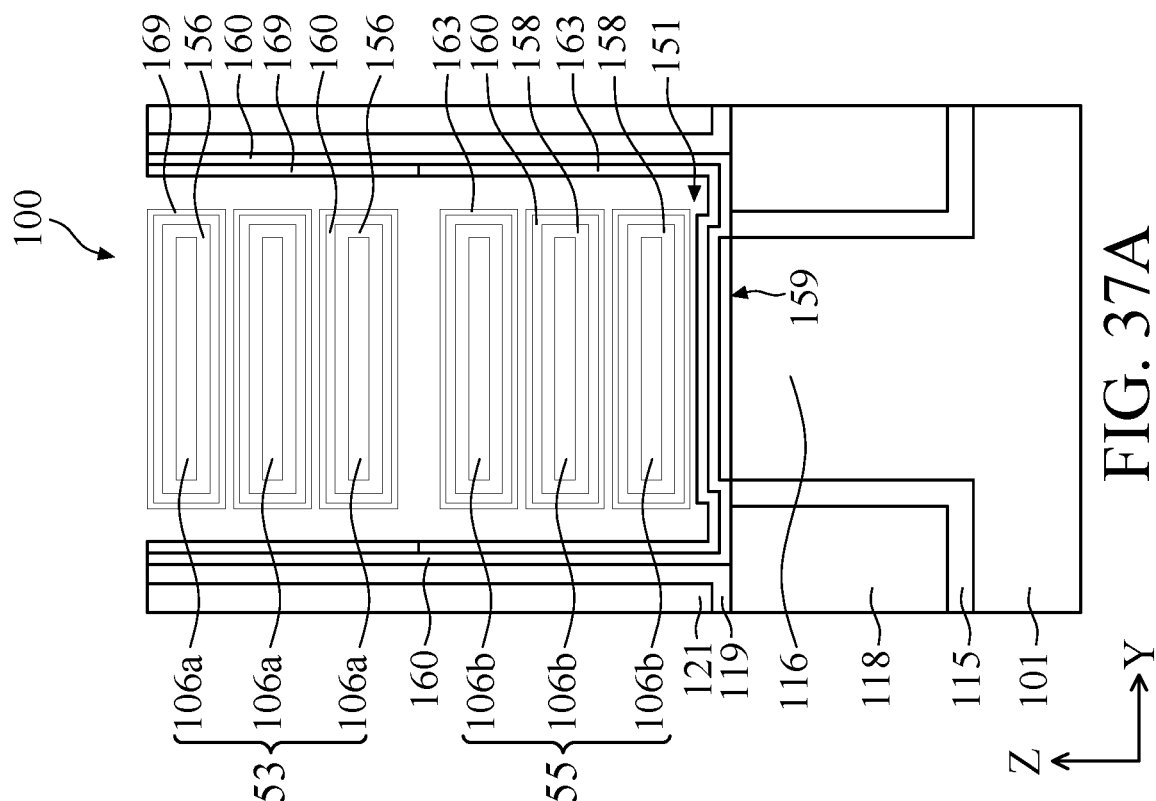

In FIG. 37A, the mask layer 165 is removed. The removal process may use ash process or dry/wet etch process identical or similar to the process used for removal of the mask layer 152 as discussed in FIG. 29A. The removal process selectively removes the mask layer 165 but not the fourth dipole layer 169 and the third dipole layer 163. The fourth dipole layer 169 on the top surface 167 of the mask layer 165 (FIG. 36) is removed along with the mask layer 165. The openings 151 within the first nanosheet transistor 155 are revealed upon removal of the mask layer 165, exposing the first semiconductor layers 106b being surrounded by the third dipole layer 163 and the first semiconductor layers 106a being surrounded by the fourth dipole layer 169.

Figure 37B:
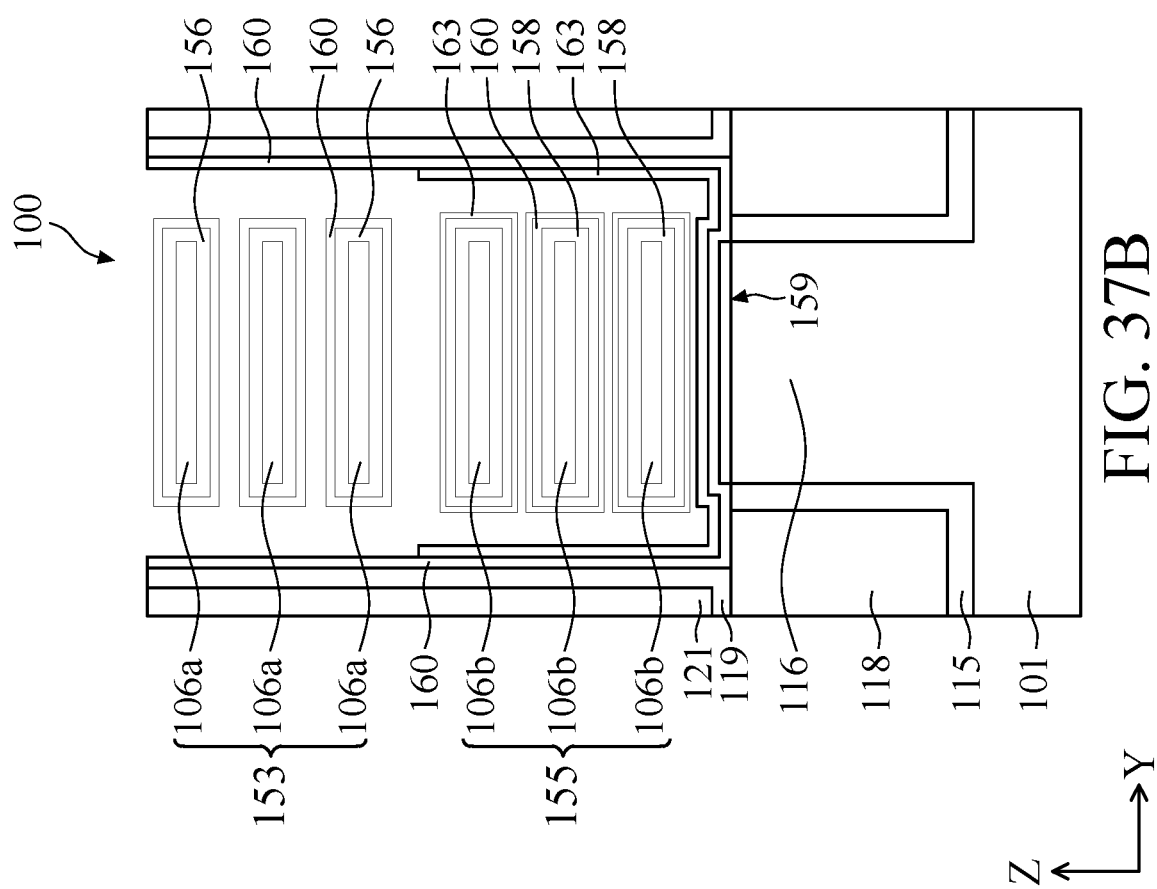

In some embodiments, which can be combined with one or more embodiments (e.g., FIGS. 29A, 29B, 31A, and 31B) discussed in this disclosure, one or more second nanosheet transistors 153 in the semiconductor device structure 100 are further proceeded to have the fourth dipole layer 169 removed from the first semiconductor layers 106a and from the HK dielectric layer 160, such as an alternative embodiment shown in FIG. 37B. The removal of the fourth dipole layer 169 can be done after removing the mask layer 165 by a suitable selective etch process that removes the fourth dipole layer 169 but not the third dipole layer 163. By configuring one or more second nanosheet transistors 153 to include the fourth dipole layer 169 over the first semiconductor layers 106a and one or more second nanosheet transistors 153 to not include the fourth dipole layer 169 over the first semiconductor layers 106a, the semiconductor device structure 100 can provide CFETs having multi-threshold voltage schemes according to the application needs.

Figure 38:
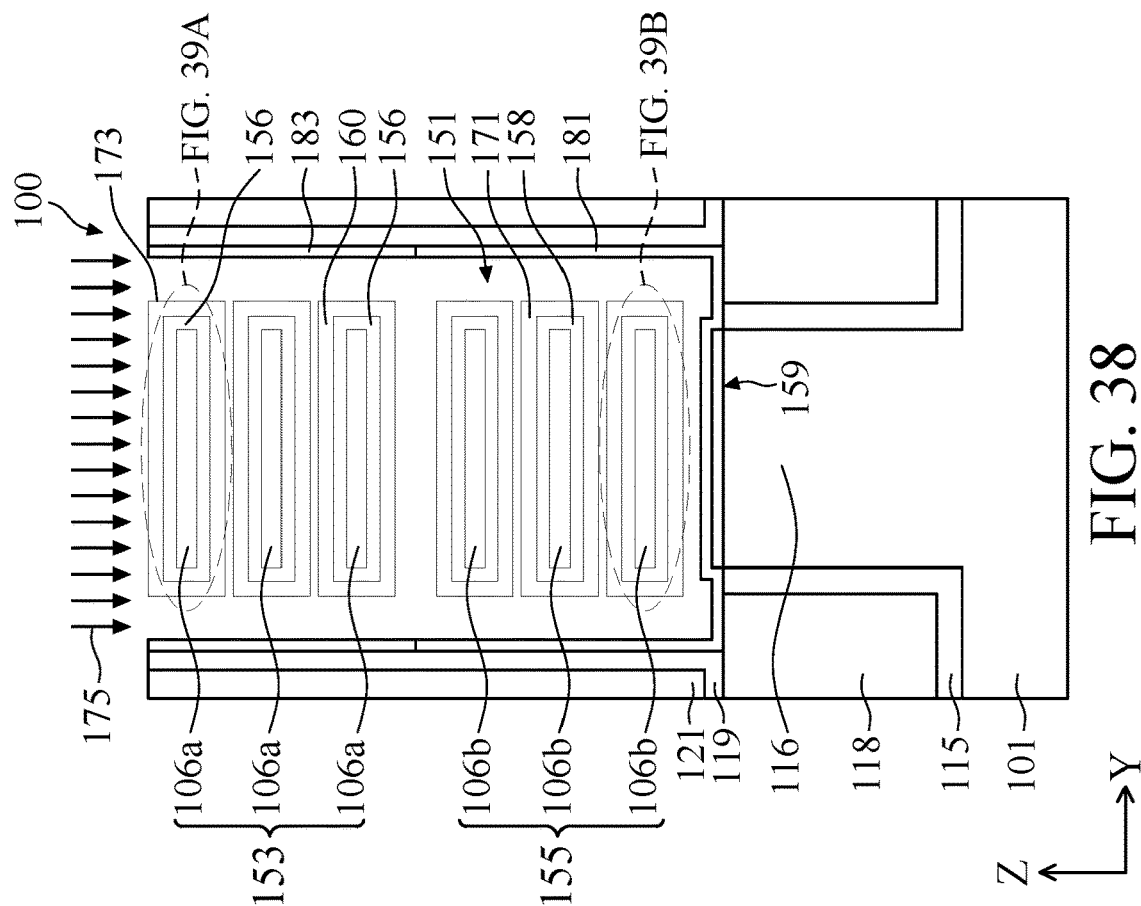

In FIG. 38, the semiconductor device structure 100 is subjected to a thermal treatment 175. The thermal treatment 175 may be the same as the thermal treatment 131 discussed above with respect to FIG. 30. The third dipole layer 163 and the fourth dipole layer 169 are diffused or driven into the HK dielectric layer 160 as a result of the thermal treatment 175. In some embodiments, the third dipole layer 163 and the fourth dipole layer 169 mix with the HK dielectric layer 160 and form a third intermixed layer 171 and a fourth intermixed layer 173, respectively. In some embodiments, the interface between the HK dielectric layer 160 and the third dipole layer 163 and the interface between the HK dielectric layer 160 and the fourth dipole layer 169 may not be observed after the thermal treatment. The third intermixed layer 171 wraps around and in contact with the second intermixed layer 158. The third dipole layer 163 extending over the liner 119, the insulating material 118, the liner 115, and the bottom intermixed layer 159 also diffuses into the HK dielectric layer 160 and forms a fifth intermixed layer 181 in contact with the liner 119, the insulating material 118, the liner 115, and the bottom intermixed layer 159. Likewise, the fourth intermixed layer 173 wraps around and in contact with the first intermixed layer 156. The fourth dipole layer 169 extending over the liner 119 also diffuses into the HK dielectric layer 160 and forms the sixth intermixed layer 183 in contact with the liner 119.

The third intermixed layer 171, the fourth intermixed layers 173, the fifth intermixed layer 181, and the sixth intermixed layer 183 can be considered as modified HK dielectric layers. The term "third/fourth/fifth/sixth intermixed layer" or "modified HK dielectric layer" as used in this disclosure denotes a reaction product of the HK dielectric layer 160 and the third/fourth dipole layer 163/169, which can be a compound, a composition or a mixture, depending on the thermal treatment used. In some embodiments, the third/fourth/fifth/sixth intermixed layer 171/173/181/183 or the modified HK dielectric layer can be a HK dielectric layer doped with materials from the third dipole layer 163 or the fourth dipole layer 169.

In some embodiments, after the thermal treatment 175, the third dipole layer 163 and the fourth dipole layer 169 that are not driven into the HK dielectric layer 160 may be optionally removed by a dry etch (e.g., RIE), a wet etch (e.g., SPM process, APM process, or HPM process), ozone-deionized Water ($O_3$-DI), and/or combination thereof.

FIG. 38 illustrates an embodiment where the first semiconductor layers 106b within the first nanosheet transistor 155 are sequentially surrounded by the second intermixed layer 158 (e.g., the reaction product of the IL 148 and the first dipole layer 150) and the third intermixed layer 171 (e.g., the reaction product of the HK dielectric layer 160 and the third dipole layer 163), and the first semiconductor layers 106a within the second nanosheet transistor 153 are sequentially surrounded by the first intermixed layer 156 (e.g., the reaction product of the IL 148 and the second dipole layer 154) and the fourth intermixed layer 173 (e.g., the reaction product of the HK dielectric layer 160 and the fourth dipole layer 169).

Figure 39A:
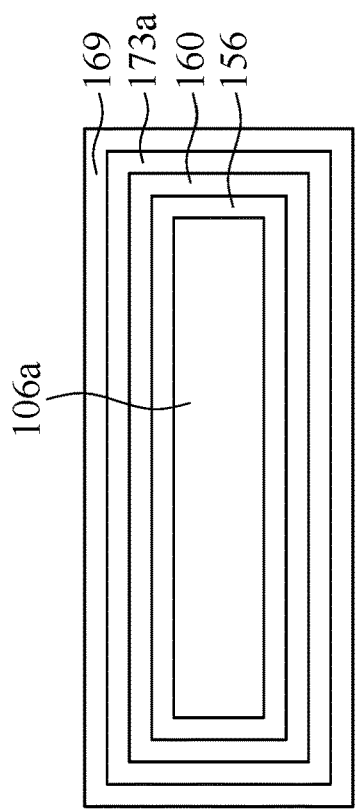
FIGS. 39A-39B illustrate a portion of the first semiconductor layers of FIG. 38 in accordance with alternative embodiments.

In some alternative embodiments, which can be combined with any embodiment(s) discussed in this disclosure, the thermal treatment may cause portions of the fourth dipole layer 169 to diffuse into the HK dielectric layer 160 and form an intermixed layer 173a sandwiched between the HK dielectric layer 160 and the fourth dipole layer 169, as an alternative embodiment shown in FIG. 39A.

Figure 39B:
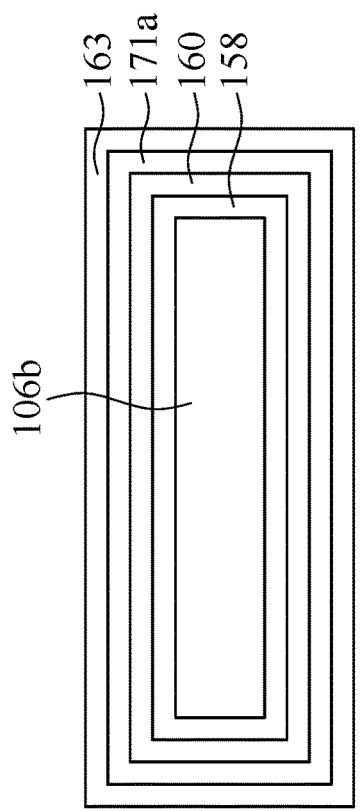

In some alternative embodiments, which can be combined with any embodiment(s) discussed in this disclosure, the thermal treatment may cause portions of the third dipole layer 163 to diffuse into the HK dielectric layer 160 and form an intermixed layer 171a sandwiched between the HK dielectric layer 160 and the third dipole layer 163, as an alternative embodiment shown in FIG. 39B.

Figure 40:
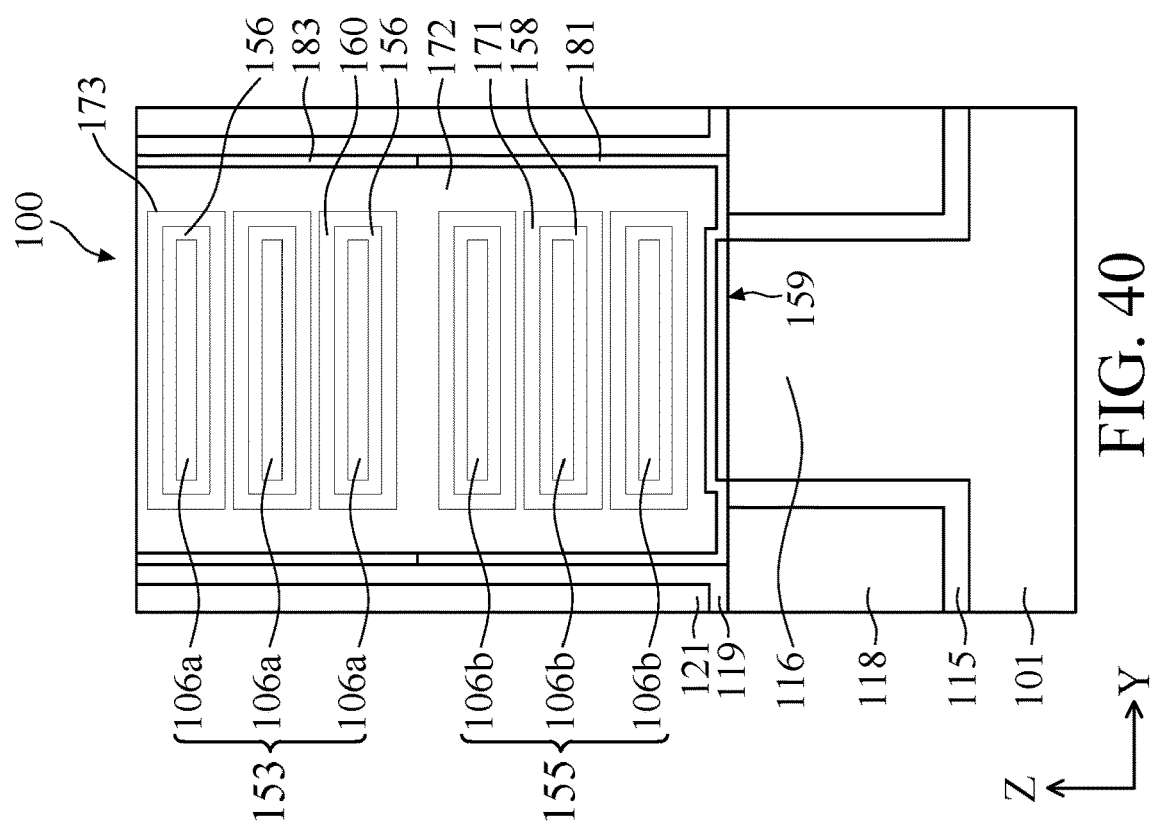

In FIG. 40, a first gate electrode layer 172 is formed in each opening 151 (FIG. 38) and on the third intermixed layer 171 and the fourth intermixed layer 173. The first gate electrode layer 172 is formed on the third intermixed layer 171 and the fourth intermixed layer 173 to surround a portion of each first semiconductor layer 106b, 106a, respectively. The first gate electrode layer 172 includes one or more layers of conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. The first gate electrode layers 172 may be formed by PVD, CVD, ALD, electro-plating, or other suitable method. In some embodiments, the first gate electrode layer 172 includes a p-type gate electrode layer such as TiN, TaN, TiTaN, TiAlN, WCN, W, Ni, Co, or other suitable material.

Figure 41:
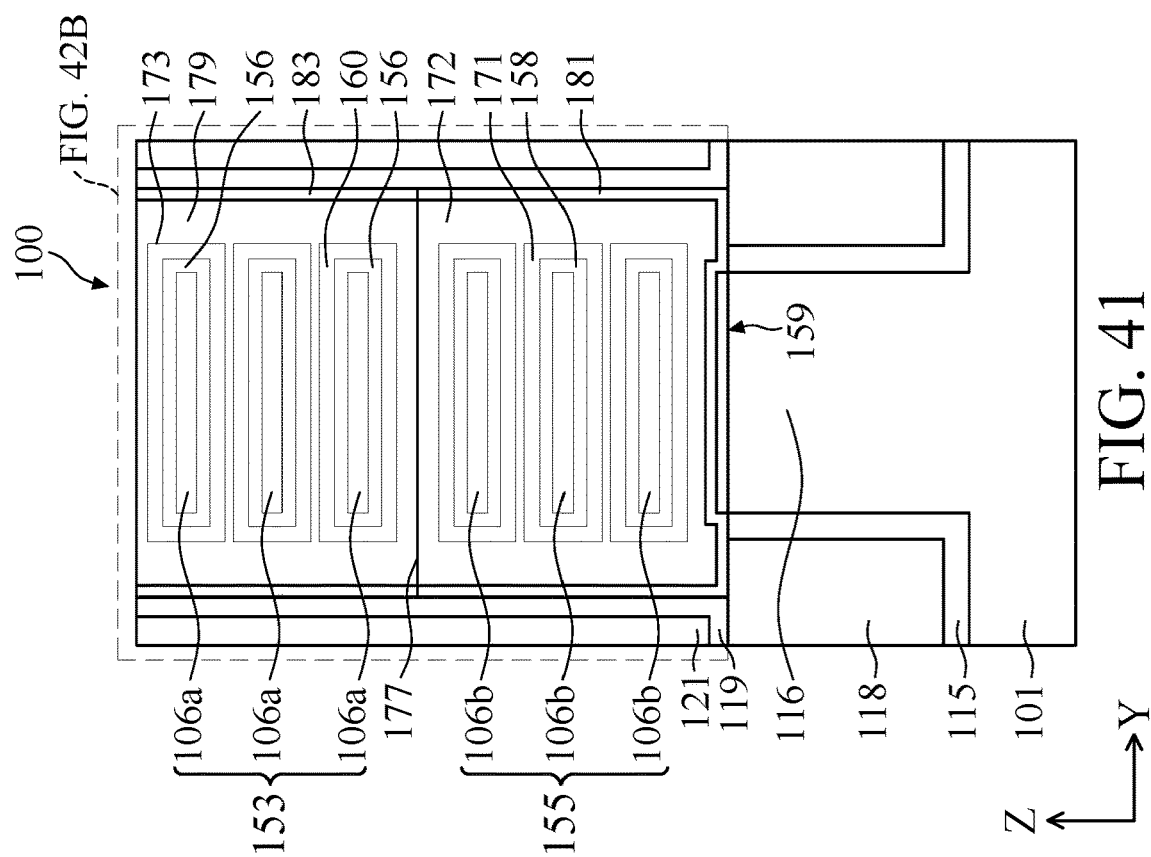
FIGS. 40-41 are enlarged views of a region of FIG. 22B showing various stages of manufacturing the semiconductor device structure in accordance with some embodiments.

In FIG. 41, an etch-back process is performed on the first gate electrode layer 172 to recess the first gate electrode layer 172. The etch-back process uses an etchant that selectively removes the first gate electrode layer 172 but not the fourth intermixed layer 173. The first gate electrode layer 172 is recessed so that a top surface 177 of the first gate electrode layer 172 is at a level between the topmost first semiconductor layer 106*b* of the first nanosheet transistor 155 and the bottom-most first semiconductor layer 106*a* of the second nanosheet transistor 153. The top surface 177 of the first gate electrode layer 172 generally defines the boundary between the first nanosheet transistor 155 and the second nanosheet transistor 153.

Next, a second gate electrode layer 179 is formed in the opening 151 revealed as the result of the recess of the first gate electrode layer 172 and on the fourth intermixed layer 173. The second gate electrode layer 179 is formed on the fourth intermixed layer 173 to surround a portion of each first semiconductor layer 106*a*. The second gate electrode layer 179 includes one or more layers of conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. The second gate electrode layers 179 may be formed by PVD, CVD, ALD, electro-plating, or other suitable method. In some embodiments, the second gate electrode layer 179 includes an n-type gate electrode layer such as TiAlC, TaAlC, TiSiAlC, TiC, TaSiAlC, or other suitable material. Therefore, the second gate electrode layer 179 serves as a gate electrode layer for an n-channel FET, and the first gate electrode layer 172 serves as a gate electrode layer for a p-channel FET. Depending on the application, the first gate electrode layer 172 and the second gate electrode layer 179 may include the same material.

Figure 42B:
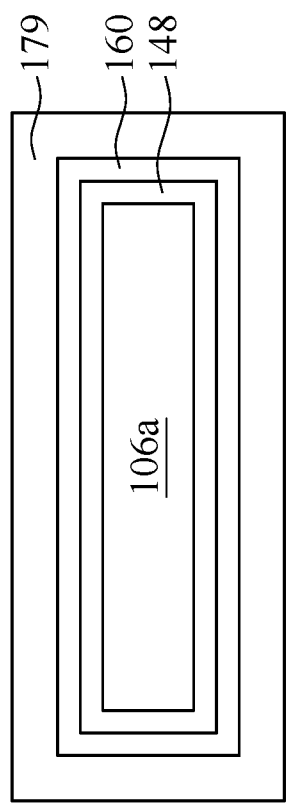
FIGS. 42B-42C are enlarged views of regions of FIG. 42A in accordance with alternative embodiments.
Figure 42C:
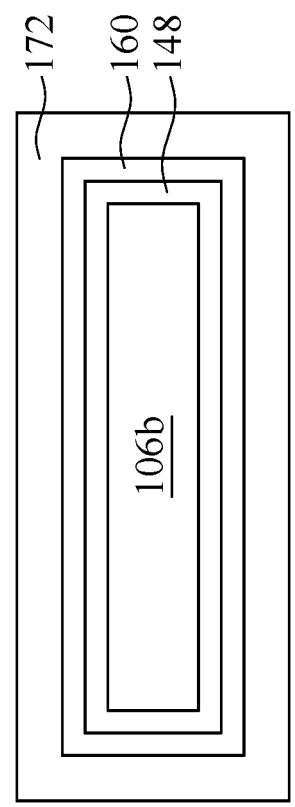
Figure 42A:
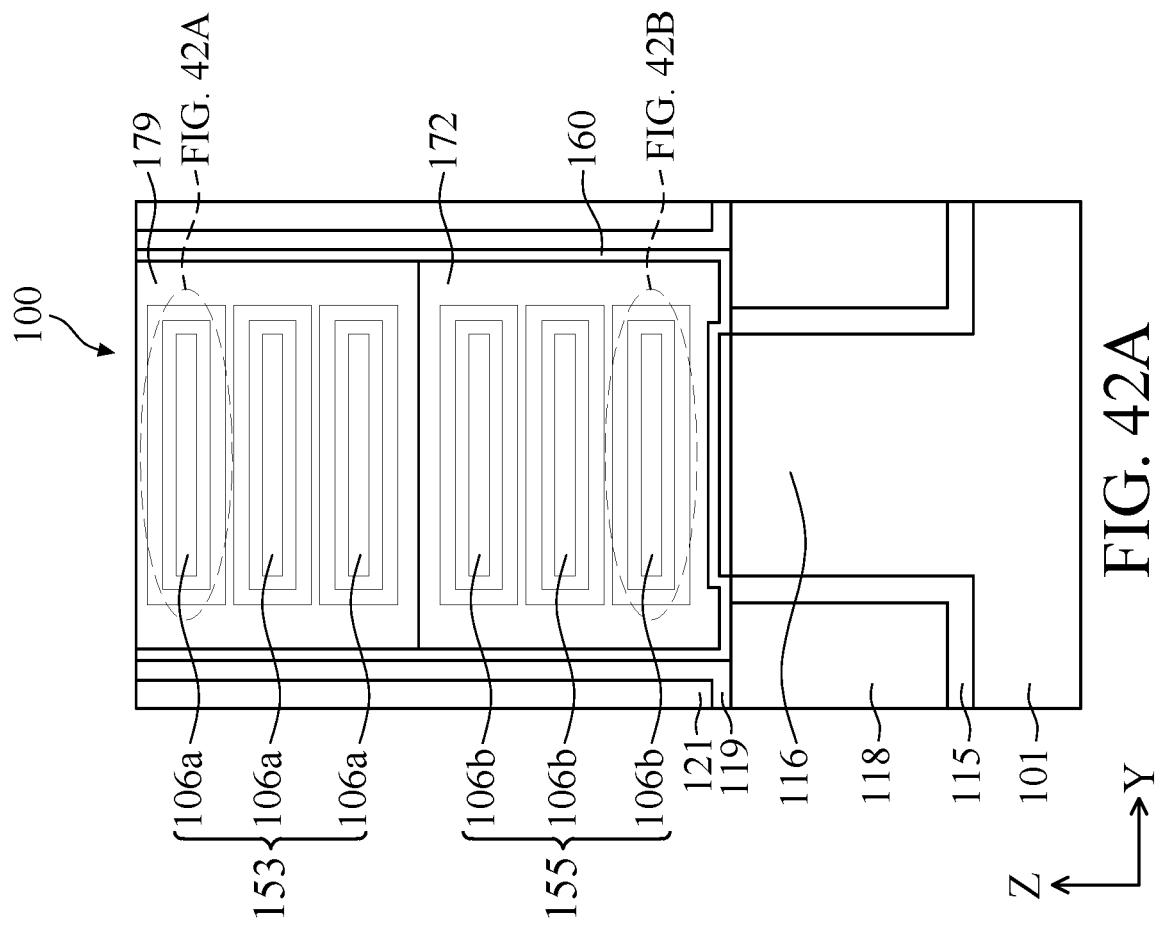
FIG. 42A illustrates an alternative embodiment incorporating various embodiments shown in FIGS. 29A-29B, 31A-31B, 37A-37B, and 39A-39B.

FIG. 42A illustrates an alternative embodiment incorporating various embodiments shown in FIGS. 29A-29B, 31A-31B, 37A-37B, and 39A-39B, in which the IL 148 of the first nanosheet transistor 155 is modified to selectively include the first dipole layer 150 (e.g., a first p-dipole layer), such as an alternative embodiment shown in FIG. 42C; the IL 148 of the second nanosheet transistor 153 is modified to selectively include the second dipole layer 154 (e.g., a first n-dipole layer), such as an alternative embodiment shown in FIG. 42B; the HK dielectric layer 160 is modified to selectively include the third dipole layer 163 (e.g., a second p-dipole layer), such as the alternative embodiment shown in FIG. 42C; and the HK dielectric layer 160 is modified to selectively include the fourth dipole layer 169 (e.g., a second n-dipole layer), such as the alternative embodiment shown in FIG. 42B. By using these embodiments, CFETs having multi-threshold voltage schemes can be provided at different regions of the semiconductor device structure 100. Particularly, these embodiments enable a zero thickness dipole patterning for multiple threshold voltage tuning by diffusing and/or intermixing the n-dipole or p-dipole layers with the IL 148 and the HK dielectric layer 160 to form modified IL 148 and HK dielectric layer 160 with minimum thickness increase of the modified IL 148 (e.g., first intermixed layer 156/intermixed layer 156*a* and second intermixed layer 158/intermixed layer 158*a*) and the modified HK dielectric layer 160 (e.g., third intermixed layer 171/intermixed layer 171*a* and the fourth intermixed layer 173/intermixed layer 173*a*).

Figures 43A, 43B, 43C:
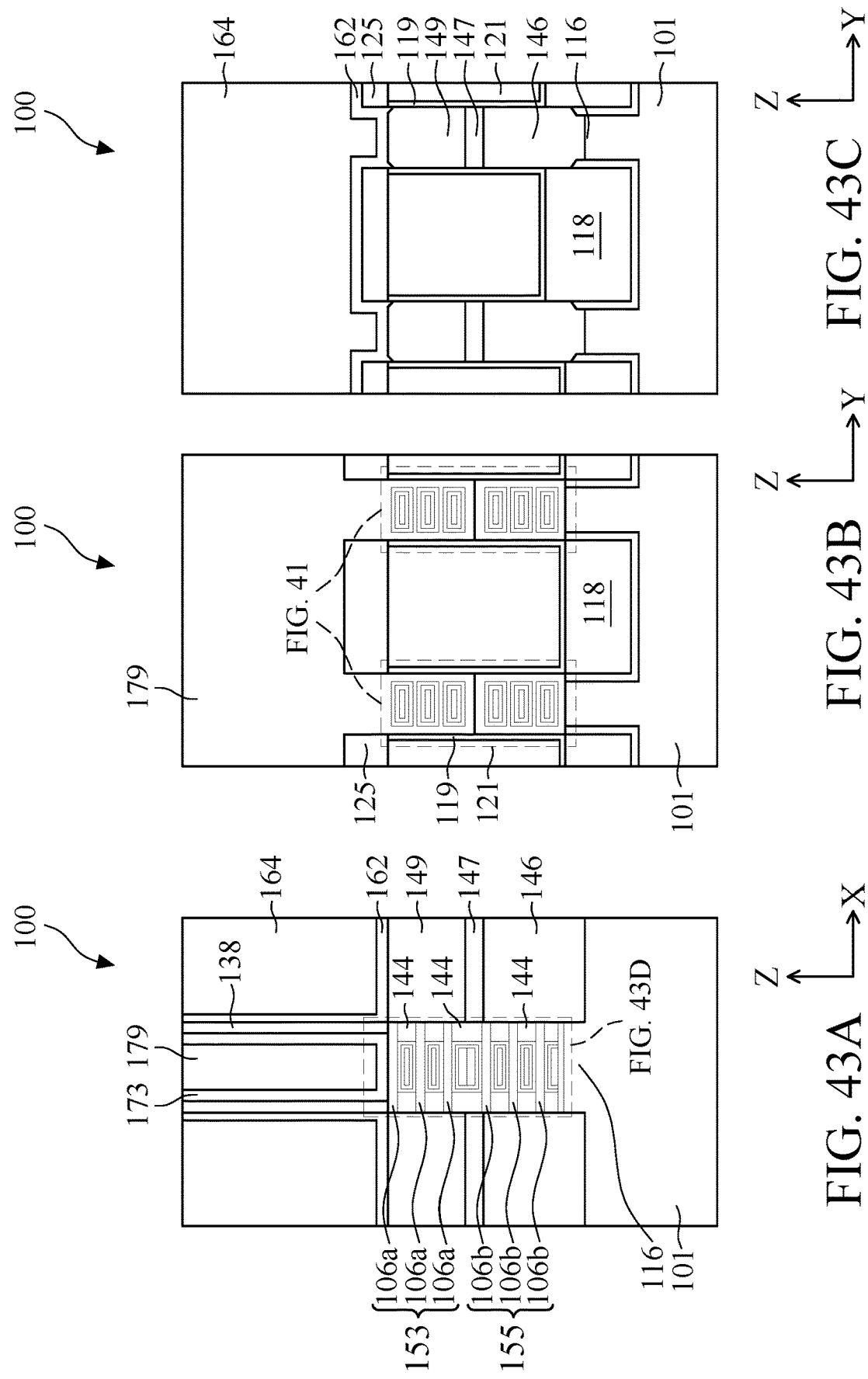
FIGS. 43A-43C are cross-sectional side views of one of various stages of manufacturing the semiconductor device structure taken along line A-A, line B-B, and line C-C of FIG. 12, respectively, in accordance with some embodiments.
Figure 43D:
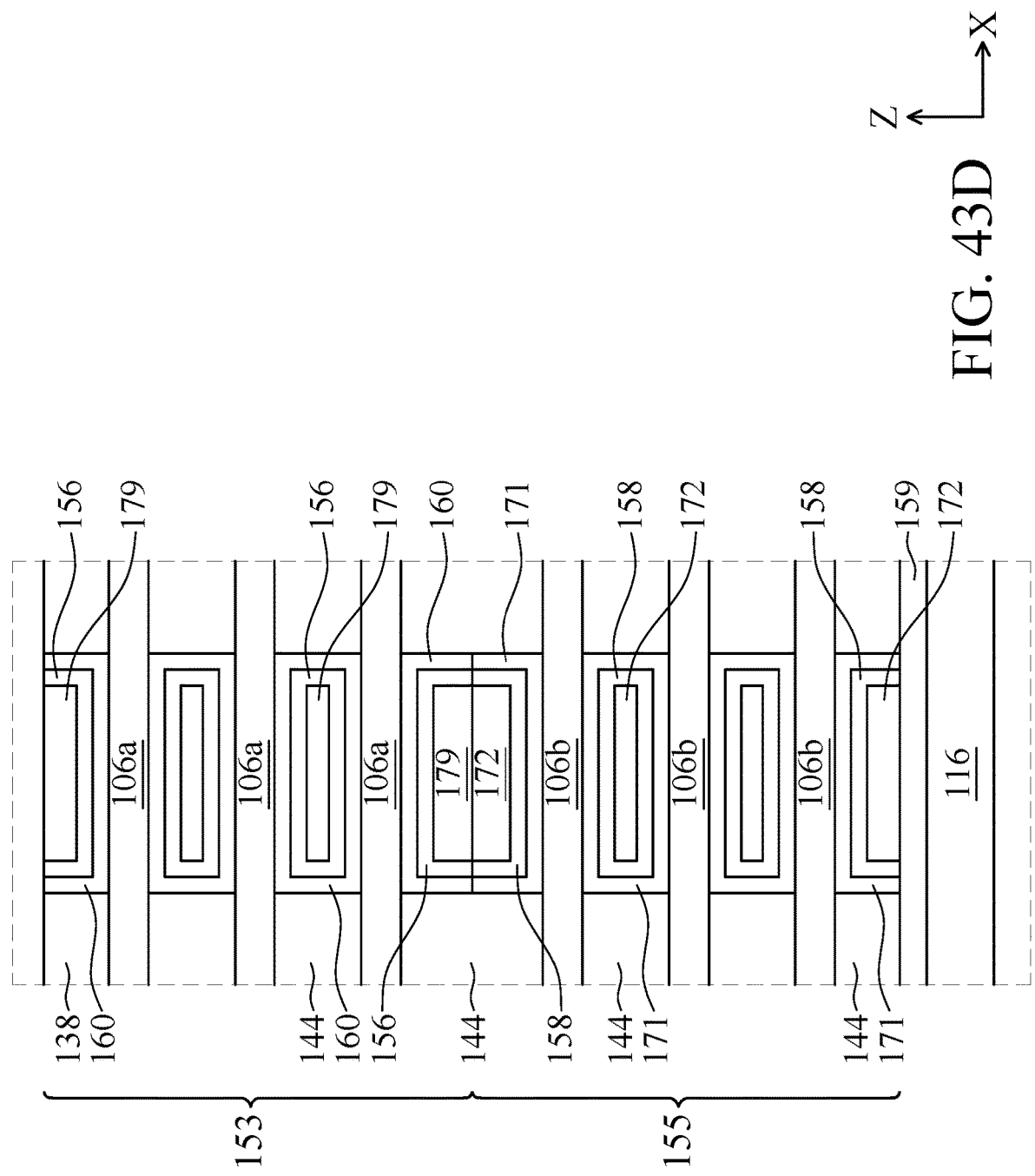
FIG. 43D is an enlarged view of a portion of the semiconductor device structure showing first and second nanosheet transistors, in accordance with some embodiments.

FIGS. 43A, 43B, and 43C illustrate cross-sectional side views of the semiconductor device structure 100 after the first and second gate electrode layers 172 and 179 are formed. FIG. 43D is an enlarged view of a portion of the semiconductor device structure 100 showing the first and second nanosheet transistors 155, 153.

In FIGS. 44A and 44C, source/drain (S/D) contacts 176 are formed in the ILD layer 164. Prior to forming the S/D contacts 176, contact openings are formed in the ILD layer 164 to expose the epitaxial S/D feature 149. Suitable photolithographic and etching techniques are used to form the contact openings through various layers, including the ILD layer 164 and the CESL 162 to expose the epitaxial S/D features 149.

After the formation of the contact openings, a silicide layer 178 is formed on the epitaxial S/D features 149. The silicide layer 178 conductively couples the epitaxial S/D features 149 to the subsequently formed S/D contacts 176. The silicide layer 178 may be formed by depositing a metal source layer over the epitaxial S/D features 149 and performing a rapid thermal annealing process. During the rapid anneal process, the portion of the metal source layer over the epitaxial S/D features 149 reacts with silicon in the epitaxial S/D features 149 to form the silicide layer 178. Unreacted portion of the metal source layer is then removed. The material of the silicide layer 178 is chosen based on the conductivity type of the second nanosheet transistor 153. For n-channel FETs, the silicide layer 178 may be made of a material including one or more of TiSi, CrSi, TaSi, MoSi, ZrSi, HfSi, ScSi, Ysi, HoSi, TbSI, GdSi, LuSi, DySi, ErSi, YbSi, or combinations thereof. For p-channel FETs, the silicide layer 178 may be made of a material including one or more of NiSi, CoSi, MnSi, Wsi, FeSi, RhSi, PdSi, RuSi, PtSi, IrSi, OsSi, or combinations thereof. In some embodiments, the silicide layer 178 is made of a metal or metal alloy silicide, and the metal includes a noble metal, a refractory metal, a rare earth metal, alloys thereof, or combinations thereof.

Next, a conductive material is formed in the contact openings and form the S/D contacts 176. The conductive material may be made of a material including one or more of Ru, Mo, Co, Ni. W, Ti, Ta, Cu, Al, TiN and TaN. While not shown, a barrier layer (e.g., TiN, TaN, or the like) may be formed on sidewalls of the contact openings prior to forming the S/D contacts 176. Then, a planarization process, such as CMP, is performed to remove excess deposition of the contact material and expose the top surface of the second gate electrode layer 179.

It is understood that the semiconductor device structure 100 may undergo further complementary metal oxide semiconductor (CMOS) and/or back-end-of-line (BEOL) processes to form various features such as transistors, contacts/vias, interconnect metal layers, dielectric layers, passivation layers, etc. The semiconductor device structure 100 may also include backside contacts (not shown) on the backside of the substrate 101 by flipping over the semiconductor device structure 100, removing the substrate 101, and selectively connecting source or drain feature/terminal of the epitaxial S/D features 146 or 149 to a backside power rail (e.g., positive voltage VDD or negative voltage VSS) through the backside contacts. Depending on the application, the source or drain feature/terminal of the epitaxial S/D features 146 or 149 and the first and second gate electrode layers 172, 179 may be connected to a frontside power source.

Embodiments of the present disclosure provide a semiconductor device structure including CFETs each having a first nanosheet transistor and a second nanosheet disposed over the first nanosheet transistor. The first nanosheet transistor may be a p-channel FET and the second nanosheet transistor may be an n-channel FET. Each of the nanosheet channels of the p-channel FET may be surrounded by a modified IL and a modified HK dielectric layer. Each of the modified IL and the modified HK may or may not include a p-dipole layer. Likewise, each of the nanosheet channels of the n-channel FET may be surrounded by the modified IL and the modified HK dielectric layer. Each of the modified IL and the modified HK may or may not include an n-dipole layer. As a result, the CFETs in different regions of the semiconductor device structure can be operated at different threshold voltages, resulting in improved device reliability and performance. Embodiments of the present disclosure also allow precise gate patterning of the CFETs even if the n-channel FET and the p-channel FET are vertically stacked at different levels of the CFET.

An embodiment is a semiconductor device structure. The structure includes one or more first semiconductor layers, each first semiconductor layer of the one or more first semiconductor layers is surrounded by a first intermixed layer and a fourth intermixed layer. The first intermixed layer is disposed between the first semiconductor layer and the fourth intermixed layer. The first intermixed layer includes a first material and a second material, and the fourth intermixed layer includes a third material and a fourth material. The structure also includes one or more second semiconductor layers disposed below and aligned with the one or more first semiconductor layers. Each second semiconductor layer of the one or more second semiconductor layers is surrounded by a second intermixed layer and a third intermixed layer. The second intermixed layer is disposed between the second semiconductor layer and the third intermixed layer. The second intermixed layer includes the first material and a fifth material, and the third intermixed layer includes the third material and a sixth material. The second material and the fourth material are a dipole material having a first polarity, and the fifth material and the sixth material are a dipole material having a second polarity opposite of the first polarity.

Another embodiment is a semiconductor device structure. The structure includes one or more first semiconductor layers, wherein each semiconductor layer of the one or more first semiconductor layers is surrounded by a first intermixed layer. The first intermixed layer includes a first dipole material having a first polarity. The structure also includes one or more second semiconductor layers disposed below and aligned with the one or more first semiconductor layers. Each semiconductor layer of the one or more second semiconductor layers is surrounded by a second intermixed layer. The second intermixed layer includes a second dipole material having a second polarity opposite of the first polarity. The structure also includes a high-K dielectric layer in contact with the first intermixed layer and the second intermixed layer, respectively. The structure further includes a first source/drain feature in contact with the one or more first semiconductor layers, and a second source/drain feature in contact with the one or more second semiconductor layers.

A further embodiment is a method for forming a semiconductor device structure. The method includes forming a stack of layers comprising a plurality of first semiconductor layers and a plurality of second semiconductor layers alternatingly stacked. The method includes forming a first source/drain feature and a second source/drain feature, wherein the first source/drain feature is disposed below and aligned with the second source/drain feature, and the first source/drain feature and the second source/drain feature are in contact with the plurality of first semiconductor layers. The method includes removing portions of the plurality of second semiconductor layers to expose portions of each of the plurality of first semiconductor layers. The method includes forming an interfacial layer to surround exposed portions of each of the plurality of first semiconductor layers. The method includes forming a first dipole layer on the interfacial layer formed on a first group of the plurality of first semiconductor layers, wherein the first dipole layer comprises a first dipole material having a first polarity. The method includes forming a second dipole layer on the interfacial layer formed on a second group of the plurality of first semiconductor layers, wherein the second dipole layer comprises a second dipole material having a second polarity opposite of the first polarity. The method includes subjecting the first and second dipole layers to a first thermal treatment. The method includes forming a high-K dielectric layer to surround the interfacial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
one or more first semiconductor layers, each first semiconductor layer of the one or more first semiconductor layers is surrounded by a first intermixed layer and a fourth intermixed layer, wherein the first intermixed layer is disposed between the first semiconductor layer and the fourth intermixed layer, and the first intermixed layer comprises a first material and a second material, and the fourth intermixed layer comprises a third material and a fourth material; and
one or more second semiconductor layers disposed below and aligned with the one or more first semiconductor layers, each second semiconductor layer of the one or more second semiconductor layers is surrounded by a second intermixed layer and a third intermixed layer, wherein the second intermixed layer is disposed between the second semiconductor layer and the third intermixed layer, and the second intermixed layer comprises the first material and a fifth material, and the third intermixed layer comprises the third material and a sixth material,
wherein the second material and the fourth material are a dipole material having a first polarity, and the fifth material and the sixth material are a dipole material having a second polarity opposite of the first polarity.

2. The semiconductor device structure of claim 1, further comprising:
a first gate electrode layer in contact with the third intermixed layer and the fourth intermixed layer.

3. The semiconductor device structure of claim 2, further comprising:
a fifth intermixed layer in contact with the first gate electrode layer, wherein the fifth intermixed layer comprises a same material as the third intermixed layer; and
a sixth intermixed layer in contact with the first gate electrode layer, wherein the sixth intermixed layer comprises a same material as the fourth intermixed layer.

4. The semiconductor device structure of claim 3, further comprising:
a first liner in contact with the fifth intermixed layer and the sixth intermixed layer, wherein the first liner comprises a low-k dielectric material.

5. The semiconductor device structure of claim 4, further comprising:
an insulating material in contact with the fifth intermixed layer; and
a second liner in contact with the fifth intermixed layer, wherein the second liner is different from the first liner, and the second liner comprises a semiconductor material.

6. The semiconductor device structure of claim 4, further comprising:
a bottom intermixed layer in contact with the fifth intermixed layer, wherein the bottom intermixed layer comprises a same material as the second intermixed layer.

7. The semiconductor device structure of claim 1, further comprising:
a first gate electrode layer in contact with the third intermixed layer; and
a second gate electrode layer in contact with the fourth intermixed layer, wherein the second gate electrode layer is different from the first gate electrode layer.

8. The semiconductor device structure of claim 7, further comprising:
a fifth intermixed layer in contact with the first gate electrode layer; and
a sixth intermixed layer in contact with the second gate electrode layer.

9. The semiconductor device structure of claim 1, wherein the first material comprises an oxygen-containing material or a silicon-containing material, and the third material comprises a high-k (HK) dielectric material.

10. A semiconductor device structure, comprising:
one or more first semiconductor layers, wherein each semiconductor layer of the one or more first semiconductor layers is surrounded by a first intermixed layer, and the first intermixed layer comprises a first dipole material having a first polarity;
one or more second semiconductor layers disposed below and aligned with the one or more first semiconductor layers, wherein each semiconductor layer of the one or more second semiconductor layers is surrounded by a second intermixed layer, and the second intermixed layer comprises a second dipole material having a second polarity opposite of the first polarity;
a high-K dielectric layer in contact with the first intermixed layer and the second intermixed layer, respectively;
a first source/drain feature in contact with the one or more first semiconductor layers; and
a second source/drain feature in contact with the one or more second semiconductor layers.

11. The semiconductor device structure of claim 10, further comprising:
a first dipole layer surrounding each semiconductor layer of the one or more first semiconductor layers, wherein the first dipole layer comprising the first dipole material, and the first intermixed layer is disposed between the first dipole layer and the high-K dielectric layer.

12. The semiconductor device structure of claim 11, further comprising:
a second dipole layer surrounding each semiconductor layer of the one or more second semiconductor layers, wherein the second dipole layer comprising the second dipole material, and the second intermixed layer is disposed between the second dipole layer and the high-K dielectric layer.

13. The semiconductor device structure of claim 12, further comprising:
a third intermixed layer surrounding and in contact with each semiconductor layer of the one or more first semiconductor layers, wherein the third intermixed layer comprises a third dipole material having the first polarity.

14. The semiconductor device structure of claim 13, further comprising:
a fourth intermixed layer surrounding and in contact with each semiconductor layer of the one or more second semiconductor layers, wherein the fourth intermixed layer comprises a fourth dipole material having the second polarity opposite of the first polarity.

15. The semiconductor device structure of claim 10, further comprising:
an interfacial layer surrounding and in contact with each semiconductor layer of the one or more first semiconductor layers and each semiconductor layer of the one or more second semiconductor layers; and
a fifth intermixed layer surrounding each semiconductor layer of the one or more first semiconductor layers, wherein the interfacial layer is disposed between the fifth intermixed layer and each semiconductor layer of the one or more first semiconductor layers, and wherein the fifth intermixed layer comprises a third dipole material having the first polarity.

16. The semiconductor device structure of claim 15, further comprising:
a sixth intermixed layer surrounding each semiconductor layer of the one or more second semiconductor layers, wherein the interfacial layer is disposed between the sixth intermixed layer and each semiconductor layer of the one or more second semiconductor layers, and wherein the sixth intermixed layer comprises a fourth dipole material having the second polarity opposite of the first polarity.

17. The semiconductor device of claim 10, further comprising:
a first gate electrode layer in contact with the first intermixed layer; and
a second gate electrode layer in contact with the second intermixed layer, wherein the second gate electrode layer is different from the first gate electrode layer.

18. The semiconductor device of claim 10, wherein the one or more of first semiconductor layers have a first height, and a distance between a bottommost first semiconductor layer and a topmost second semiconductor layer has a second height greater than the first height.

19. A method for forming a semiconductor device structure, comprising:
- forming a stack of layers comprising a plurality of first semiconductor layers and a plurality of second semiconductor layers alternatingly stacked;
- forming a first source/drain feature and a second source/drain feature, wherein the first source/drain feature is disposed below and aligned with the second source/drain feature, and the first source/drain feature and the second source/drain feature are in contact with the plurality of first semiconductor layers;
- removing portions of the plurality of second semiconductor layers to expose portions of each of the plurality of first semiconductor layers;
- forming an interfacial layer to surround exposed portions of each of the plurality of first semiconductor layers;
- forming a first dipole layer on the interfacial layer formed on a first group of the plurality of first semiconductor layers, wherein the first dipole layer comprises a first dipole material having a first polarity;
- forming a second dipole layer on the interfacial layer formed on a second group of the plurality of first semiconductor layers, wherein the second dipole layer comprises a second dipole material having a second polarity opposite of the first polarity;
- subjecting the first and second dipole layers to a first thermal treatment; and
- forming a high-K dielectric layer to surround the interfacial layer.

20. The method of claim 19, further comprising:
- forming a third dipole layer on the high-K dielectric layer surrounding the first group of the plurality of first semiconductor layers, wherein the third dipole layer comprises a third dipole material having the first polarity;
- forming a fourth dipole layer on the high-K dielectric layer surrounding the second group of the plurality of first semiconductor layers, wherein the fourth dipole layer comprises a fourth dipole material having the second polarity opposite of the first polarity;
- subjecting the third and fourth dipole layers to a second thermal treatment; and
- forming a gate electrode layer to surround the high-K dielectric layer surrounding each of the plurality of first semiconductor layers.

* * * * *